(12) United States Patent
Katsuta

(10) Patent No.: US 10,671,199 B2
(45) Date of Patent: Jun. 2, 2020

(54) INPUT DETECTION DEVICE

(71) Applicant: Japan Display Inc., Tokyo (JP)

(72) Inventor: Tadayoshi Katsuta, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/238,099

(22) Filed: Jan. 2, 2019

(65) Prior Publication Data

US 2019/0138143 A1 May 9, 2019

Related U.S. Application Data

(63) Continuation of application No. 15/686,707, filed on Aug. 25, 2017, now Pat. No. 10,198,106.

(30) Foreign Application Priority Data

Aug. 26, 2016 (JP) .................. 2016-165498

(51) Int. Cl.
| | | |
|---|---|---|
| *G09G 3/36* | (2006.01) | |
| *G06F 3/041* | (2006.01) | |
| *G06F 3/0354* | (2013.01) | |
| *G06F 3/044* | (2006.01) | |
| *G06F 3/046* | (2006.01) | |
| *H03K 17/96* | (2006.01) | |

(52) U.S. Cl.
CPC ........ *G06F 3/0412* (2013.01); *G06F 3/03545* (2013.01); *G06F 3/044* (2013.01); *G06F 3/046* (2013.01); *G06F 3/0416* (2013.01); *G06F 2203/04101* (2013.01); *G06F 2203/04106* (2013.01); *H03K 17/962* (2013.01)

(58) Field of Classification Search
CPC .... G09G 3/36; G09G 5/00; F21V 7/04; G06F 3/038
See application file for complete search history.

(56) References Cited

U.S. PATENT DOCUMENTS

| | | |
|---|---|---|
| 5,905,489 A | 5/1999 | Takahama et al. |
| 8,749,501 B2 | 6/2014 | Oda et al. |
| 9,182,872 B2* | 11/2015 | Sugiyama ............... G06F 3/041 |
| 2003/0217871 A1 | 11/2003 | Chao et al. |
| 2007/0124515 A1* | 5/2007 | Ishikawa ................. G06F 3/046 |
| | | 710/15 |
| 2008/0150914 A1 | 6/2008 | Yamamoto |

(Continued)

FOREIGN PATENT DOCUMENTS

| | | |
|---|---|---|
| JP | H10-049301 A | 2/1998 |
| JP | 2006-085488 A | 3/2006 |
| JP | 2006-085490 A | 3/2006 |

*Primary Examiner* — Pegeman Karimi
(74) *Attorney, Agent, or Firm* — K&L Gates LLP

(57) ABSTRACT

Provided is an input detection device capable of suppressing a change in detection sensitivity depending on a position. The input detection device includes: signal wirings having end portions, and arranged so as to extend in a first direction; drive electrodes each extending in a second direction crossing the first direction, and arranged in parallel to the first direction; a plurality of first switches arranged between the end portions of the drive electrodes and the signal wirings; a drive signal circuit supplying a drive signal to the end portions; and a selection circuit controlling the first switches in detecting proximity of an external object.

17 Claims, 17 Drawing Sheets

(56) References Cited

U.S. PATENT DOCUMENTS

2014/0152621 A1\* 6/2014 Okayama .............. G06F 3/0416
 345/174
2015/0185935 A1\* 7/2015 Jang ...................... G06F 3/0416
 345/174

\* cited by examiner

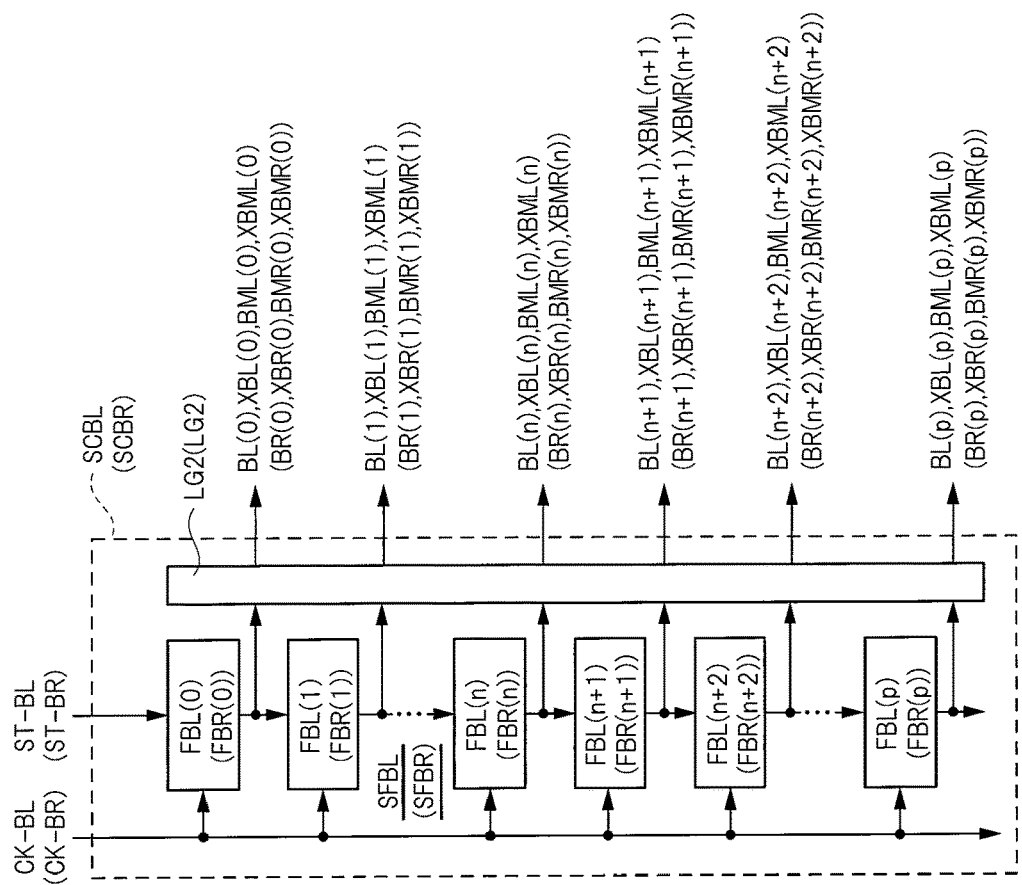
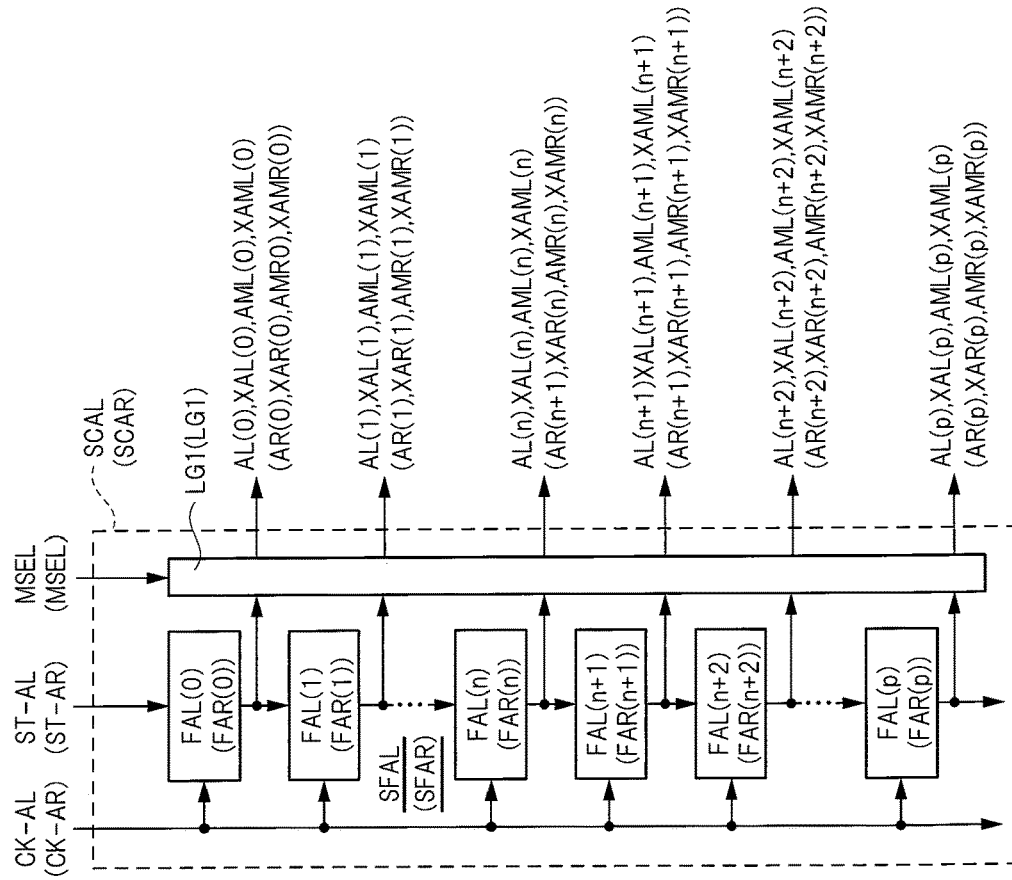
FIG. 9B
FIG. 9A

FIG. 15A
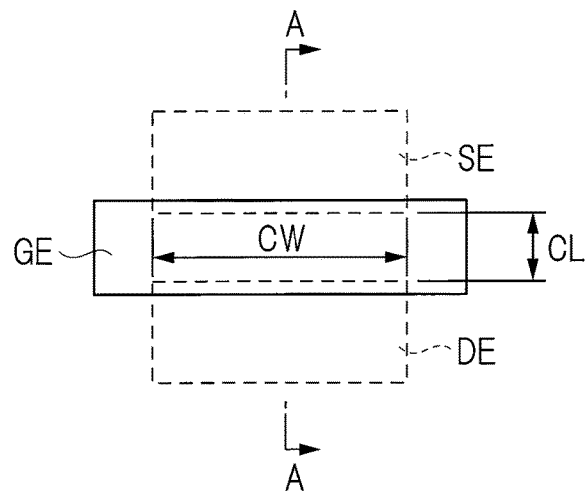
FIG. 15B
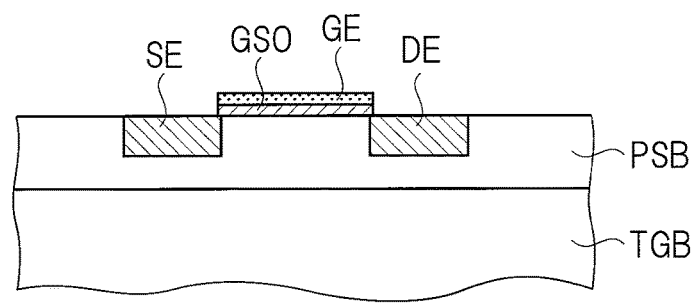
FIG. 16
|  | FAR-END VICINITY | MIDDLE VICINITY | NEAR-END VICINITY |
|---|---|---|---|
| MAGNETIC FIELD TRANSISTOR | LARGE | MEDIUM | SMALL |
| ELECTRIC FIELD TRANSISTOR | SMALL | MEDIUM | LARGE |

INPUT DETECTION DEVICE

CROSS-REFERENCE TO RELATED APPLICATION

The present application is a continuation of U.S. application Ser. No. 15/686,707, filed on Aug. 25, 2017, which application claims priority from Japanese Patent Application No. 2016-165498 filed on Aug. 26, 2016, the content of which is hereby incorporated by reference.

TECHNICAL FIELD OF THE INVENTION

The present invention relates to an input detection device and, in particular, to an input detection device having a touch detection function capable of detecting proximity of an external object.

BACKGROUND OF THE INVENTION

In recent years, attention has been paid to, as an input detection device, an input detection device having a touch detection function capable of detecting proximity (hereinafter, also including contact) of an external object, and such a device is called a touch panel. The touch panel is provided as a display device with a touch detection function, which is attached to or integrated in a display device, for example, a liquid crystal display device.

As an external object, for example, there is a touch panel enabling use of a pen. By using the pen, for example, a small area can be designated, or a handwritten character(s) can be inputted. There are various technologies for detecting a touch of the pen. One of the various technologies is an electromagnetic induction method. Since the electromagnetic induction method can realize high accuracy and high writing pressure detection accuracy, and can also realize a hovering detection function of detecting the external object separated from a touch panel surface, the electromagnetic induction method is a useful technology as a technology to detect the touch of the pen.

In addition, there is a touch detection device capable of detecting a finger(s) or the like as an external object. In this case, since a detection target is different from the pen, a method different from the electromagnetic induction method is adopted as a technology for detecting the touch. For example, there is a method for detecting an optical change, a change in a resistance value, or a change in an electric field caused by the touch of the finger or the like. Among these methods, the method for detecting the change in the electric field includes, for example, an electrostatic capacitance method using electrostatic capacitance. Since the electrostatic capacitance method has a relatively simple structure and has low power consumption, the electrostatic capacitance method is used for a personal digital assistant and the like.

Technologies related to the touch panel of the electromagnetic induction method are described in, for example, Patent Document 1 (Japanese Patent Application Laid-open No. 10-49301).

SUMMARY OF THE INVENTION

In the electromagnetic induction method, for example, the input detection device is provided with a coil for generating a magnetic field (hereinafter also referred to as a "magnetic field generation coil") and a coil for detecting the magnetic field (hereinafter also referred to as a "magnetic field detection coil"). In addition, the pen as an external object incorporates a coil and a capacitive element constituting a resonance circuit. The magnetic field generated by the magnetic field generation coil causes the pen-in coil to create an induced voltage, and the capacitive element is changed. The magnetic field generated by the pen-in coil according to an amount of charges accumulated in the capacitive element is detected by the magnetic field detection coil. This enables the detection of whether or not the pen is close to the input detection device.

In order to extract a position (area) where the pen is close thereto, the input detection device includes a plurality of magnetic field generation coils arranged at mutually different positions, and each of the magnetic field generation coils is driven by a magnetic field drive signal so as to create a magnetic field at different timings. The magnetic field generation coils are arranged in mutually different positions. Therefore, when the arrangement of the magnetic field generation coils and a drive signal circuit forming the magnetic field drive signal is seen in plan view, there occur the magnetic field generation coil close to the drive signal circuit and the magnetic field generation coil away from the drive signal circuit. Accordingly, a signal wiring for supplying, to the remote magnetic field generation coil, the drive signal from the drive signal circuit becomes longer than a signal wiring for supplying the drive signal to the close magnetic field generation coil. As the signal wiring lengthens, resistance associated with the signal wiring increases, and therefore a current flowing through the remote magnetic field generation coil in generating the magnetic field becomes smaller than the current flowing through the magnetic field generation coil. Since an intensity change in the magnetic field is generated by the magnetic field generation coil is generated depending on a magnitude of the flowing current, variations in intensity of the magnetic field generated depending on the position occur in the input detection device. That is, in a plane in which the touch is detected, the position-dependent intensity change occurs in the generated magnetic fields.

When the intensity change occurs in the magnetic fields generated depending on the position, an amount of charges accumulated in a pen-in capacitive element also changes depending on the position touched. As a result, the intensity change in the magnetic field generated by the pen-in coil also occurs depending on the position, and detection sensitivity changes depending on the position, which is undesirable.

Patent Document 1 describes a technique relating to a touch panel with the electromagnetic induction method, but neither discloses nor recognizes that the detection sensitivity varies depending on the position.

An object of the present invention is to provide an input detection device capable of reducing the change in detection sensitivity depending on the position.

An input detection device according to one embodiment of the present invention comprises: a first signal wiring having an end portion, and arranged so as to extend in a first direction from the end portion in a plan view; a plurality of drive electrodes each having an end portion, each extending in a second direction crossing the first direction in a plan view, and arranged parallel to the first direction; a plurality of first switches each arranged between each of the end portions of the drive electrodes and the first signal wiring; a drive signal circuit supplying a drive signal to the end portion of the first signal wiring; and a selection circuit controlling the first switches arranged between the one end portion of each of the plurality of drive electrodes and the first signal wiring when proximity of an external object is detected. Here, when the proximity of the external object is detected based on a magnetic field from the external object, the first switches electrically connecting the drive electrodes arranged close to the end portion of the first signal wiring to the first signal wiring are made smaller in number than the first switches electrically connecting the drive electrodes arranged away from the end portion of the first signal wiring to the first signal wiring.

In addition, in the input detection device according to one embodiment of the present invention, the number of switches connected in parallel between the drive electrodes arranged apart from the end portion of the above-mentioned first signal wiring and the first signal wiring, and the number of switches connected in parallel between the drive electrodes arranged close to the end portion of the above-mentioned first signal wiring and the first signal wiring are made the same (first number). In this case, the switches connected in parallel include a first connection switch, and second connection switches to be brought into conduction states when the proximity of the external object is detected based on a magnetic field from the external object. The number of the second connection switches connected between the drive electrodes arranged close to the end portion of the first signal wiring and the first signal wiring are made smaller than the number of the second connection switches connected between the drive electrodes arranged away from the end portion of the first signal wiring and the first signal wiring.

BRIEF DESCRIPTIONS OF THE DRAWINGS

FIG. 9A is a block diagram showing configurations of a first scanner circuit and a second scanner circuit according to the embodiment;

FIG. 9B is a block diagram showing the configurations of a first scanner circuit and a second scanner circuit according to the embodiment;

FIG. 15A is a plan view showing a structure of a transistor;

FIG. 15B is a cross-sectional view showing the structure of a transistor;

FIG. 16 is a diagram explaining a size of a transistor according to a modification of the embodiment;

DESCRIPTIONS OF THE PREFERRED EMBODIMENTS

Figure 1A:
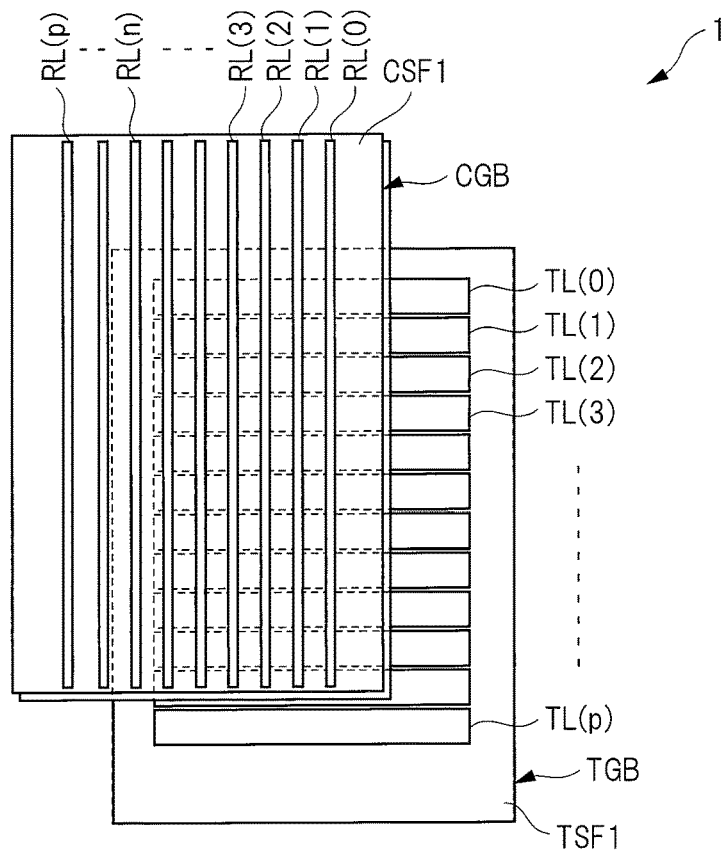
FIG. 1A is a plan view showing the configuration of a display device.

In the following, each embodiment of the present invention will be described with reference to the drawings. It should be noted that the disclosure is merely an example, and appropriate changes with the gist of the invention kept which can be easily made by a person skilled in the art are naturally included in the scope of the present invention. In addition, in order to make the description clearer, the drawings may schematically represent the width, the thickness, the shape, and the like of each part as compared with the actual form, but it is only an example and the construction of the present invention is not limited thereto.

In addition, in the present specification and each of the Figures, the same reference numerals are given to the same elements as those previously described with reference to the preceding Figures, and their detailed descriptions may be omitted appropriately. In the following description, a liquid crystal display device with a touch detection function will be described as an example of an input detection device, but the present invention is not limited thereto. For example, the input detection device may be an OLED display device with a touch detection function, a touch panel not having a display function, or the like.

Embodiment

In the embodiment, provided is a liquid crystal display device with a touch detection function (hereinafter also referred to as a "display device") capable of detecting both a touch of a pen and a touch of a finger. First, a basic configuration of the display device will be described, and then principles of the magnetic field detection for detecting a touch of a pen (hereinafter also referred to as "magnetic field touch detection") and the electric field detection for detecting a touch of a finger (hereinafter also referred to as "electric field touch detection") will be described based on this basic configuration.

<Basic Configuration of Display Device>

Figure 1B:
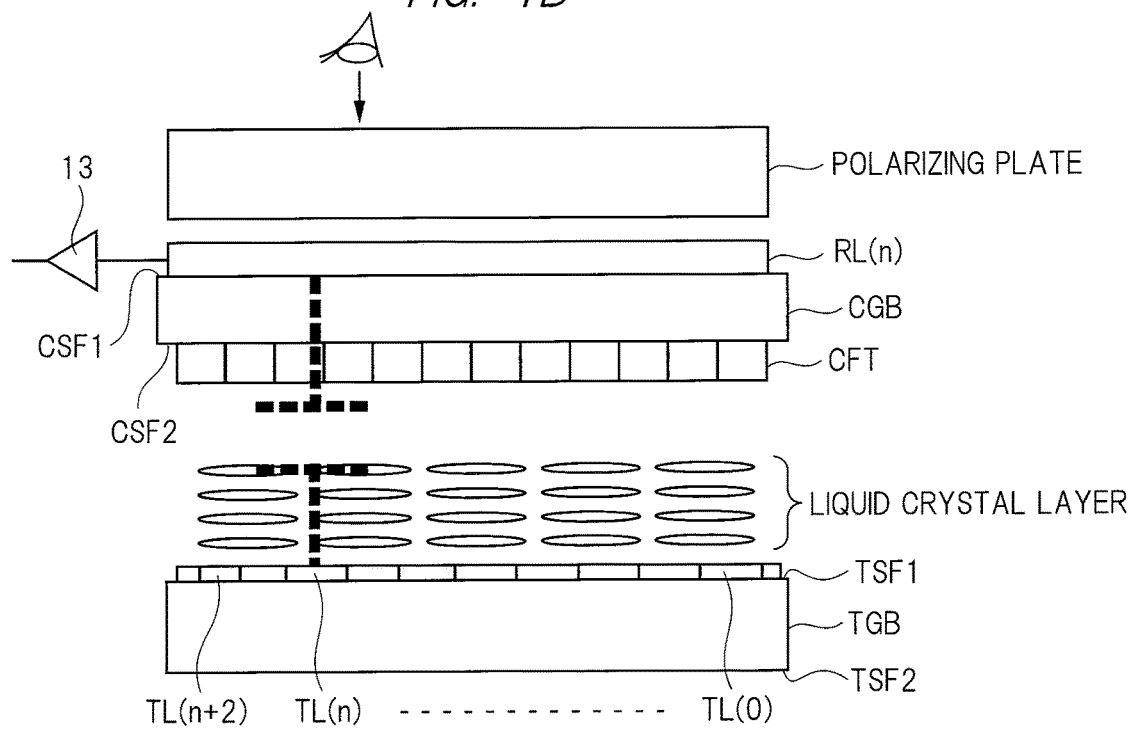
FIG. 1B is a cross-sectional view showing the configuration of a display device.

FIGS. 1A and 1B are diagrams schematically showing the configuration of the display device. In FIGS. 1A and 1B, reference numeral "1" denotes a display device, FIG. 1A is a plan view showing a plane of the display device 1, and FIG. 1B is a cross-sectional view showing a cross section of the display device 1. The display device 1 includes: a first substrate TGB; a layer laminated on the first substrate TGB; a color filter CFT; a second substrate CGB; and a layer laminated on the second substrate CGB. The first substrate TGB and the second substrate CGB are insulating substrates. For example, each of the first substrate TGB and the second substrate CGB is a glass substrate or a film substrate.

In FIG. 1A, "TL(0)" to "TL(p)" show drive electrodes constituted by the layers formed on a first main surface TSF1 of the first substrate TGB. In addition, "RL(0)" to "RL(p)" show detection electrodes constituted by the layers formed on a first main surface CSF1 of the second substrate CGB. Although the first substrate TGB and the second substrate CGB are illustrated separately in FIG. 1A for ease of understanding, they are actually arranged so that the first main surface TSF1 of the first substrate TGB and the second main surface CSF2 of the second substrate CGB sandwich the liquid crystal layer and face each other.

A plurality of layers, a liquid crystal layer, and the like are sandwiched between the first main surface TSF1 of the first substrate TGB and the second main surface CSF2 of the second substrate CGB. But, FIG. 1B shows only the drive electrodes TL(0) to TL(n+2), the liquid crystal layer, and the color filter CFT which are sandwiched between the first main surface TSF1 and the second main surface CSF2. In addition, a plurality of detection electrodes RL(0) to RL(p) and a polarizing plate are arranged on the first main surface CSF1 of the second substrate CGB as shown in FIG. 1A. In addition, in FIG. 1B, reference numeral "13" denotes a unit detection circuit connected to the detection electrode RL(n).

In the present specification, as shown in FIG. 1B, a state of viewing the display device 1 from the first main surface CSF1 and TSF1 sides of the second substrate CGB and the first substrate TGB is described as a plan view. When viewed from the first main surface CSF1 and TSF1 sides in a plan view, the drive electrodes TL(0) to TL(p) extend in a row direction (lateral direction), and are arranged parallel in a column direction (longitudinal direction) on the first main surface TSF1 of the first substrate TGB as shown in FIG. 1A. In addition, the detection electrodes RL(0) to RL(p) extend in the column direction (longitudinal direction), and are arranged parallel to the row direction (lateral direction) on the first main surface CSF1 of the second substrate CGB as shown in FIG. 1A.

The second substrate CGB, the liquid crystal layer, and the like are interposed between the drive electrodes TL(0) to TL(p) and the detection electrodes RL(0) to RL(p). Therefore, although the drive electrodes TL(0) to TL(p) and the detection electrodes RL(0) to RL(p) intersect when viewed in a plan view, they are electrically separated from each other. Since capacity exists between the drive electrodes and the detection electrodes, this capacitance is shown in FIG. 1B as a capacitive element by a broken line.

The drive electrodes TL(0) to TL(p) and the detection electrodes RL(0) to RL(p) make it desirable to be orthogonal to each other when viewed in a plan view, but the drive electrodes and the detection electrodes may intersect obliquely when viewed in a plan view. Therefore, it should be understood that the term "orthogonal" used in the following description also includes "intersecting".

<Principle of Magnetic Field Detection>

Figure 2A:
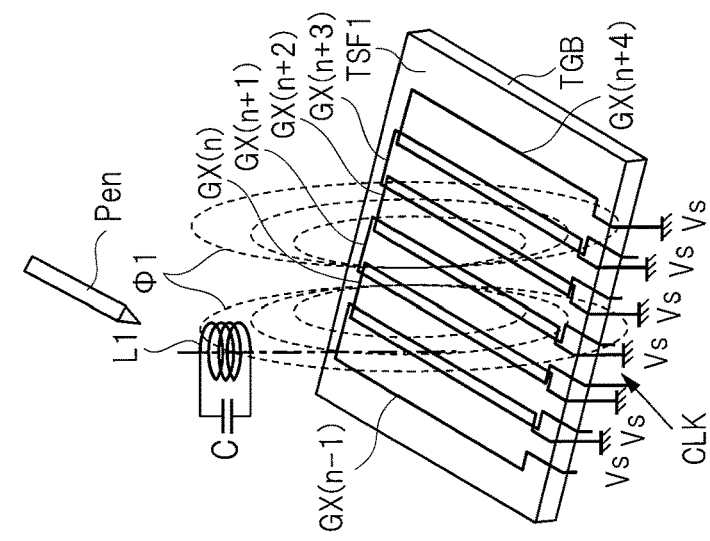
FIG. 2A is an explanatory diagram showing a principle of magnetic field detection.
Figure 2B:
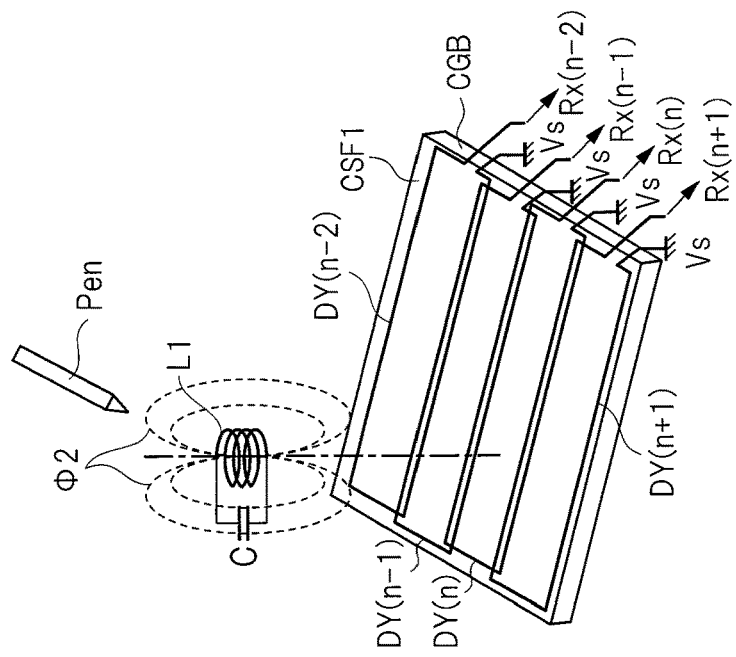
FIG. 2B is an explanatory diagram showing the principle of magnetic field detection.
Figure 2C:
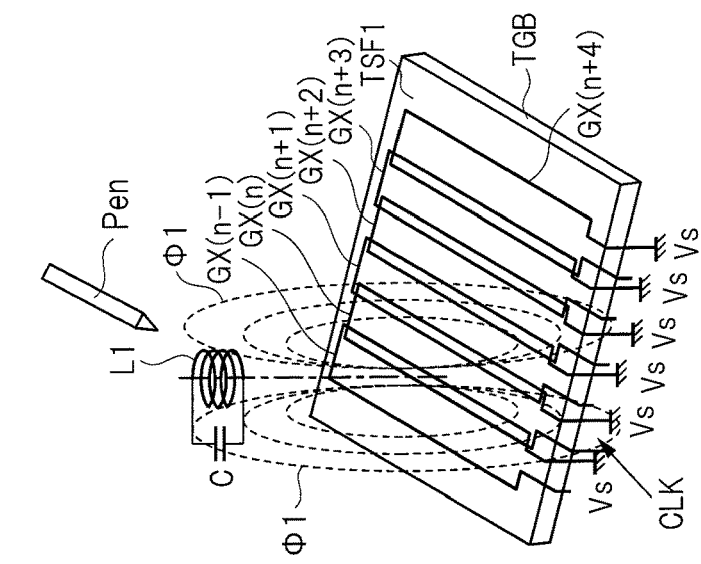
FIG. 2C is an explanatory diagram showing the principle of magnetic field detection.

FIGS. 2A to 2C are explanatory diagrams showing a principle of magnetic field detection. A period of the magnetic field detection includes: a magnetic field generation period for generating a magnetic field; and a magnetic field detection period for detecting the magnetic field. FIGS. 2A and 2C show an operation during the magnetic field generation period, and FIG. 2B shows an operation during the magnetic field detection period. For convenience of description, FIGS. 2A to 2C show a state in which FIG. 1A is rotated by 90 degrees.

In the magnetic field generation period, end portions of the predetermined drive electrodes out of the drive electrodes TL(0) to TL(p) are electrically connected, and a predetermined voltage (for example, a first voltage Vs) and a magnetic field drive signal are supplied to the drive electrodes whose end portions are connected to each other. For example, the other end portions out of the respective end portions of the drive electrodes TL(0) and TL(2) shown in FIGS. 1A and 1B are electrically connected to each other on a right side in FIG. 1A. Thereby, the drive electrodes TL(0) and TL(2) arranged in parallel with each other are connected in series. The first substrate Vs is supplied to one end portion of the drive electrode TL(0) on a left side in FIG. 1A, and a magnetic field drive signal is supplied to one end portion of the drive electrode TL(2) on the left side in FIG. 1A. Here, the magnetic field drive signal is a signal whose voltage periodically changes. By the drive electrodes TL(0) and TL(2), the magnetic field generation coil whose inside is an area sandwiched (formed) between these drive electrodes is constituted, and this magnetic field generation coil generates therein a magnetic field in response to the change in the voltage of the magnetic field drive signal. For example, the first voltage Vs is a ground voltage or a reference voltage.

In FIG. 2A, "GX(n−1)" shows the magnetic field generation coil constituted by the drive electrodes TL(0) and TL(2), and each of "GX(n)" to "GX(n+4)" shows the magnetic field generation coil constituted by the drive electrodes TL(1) and TL(3) to TL(p) similarly to the magnetic field generation coil GX(n−1).

In FIG. 2A, "C" and "L1" show a capacitive element and a coil built in the pen Pen. The capacitive element C and the coil L1 are connected in parallel so as to form a resonance circuit. In the magnetic field generation period, the first voltage Vs is supplied to one end portion of each of the magnetic field generation coils GX(n−1) to GX(n+3). The magnetic field drive signal CLK is supplied to the other end portion of the magnetic field generation coil GX(n). This causes the magnetic field generation coil GX(n) to generate a magnetic field $\phi 1$ depending on the voltage change in the magnetic field drive signal CLK. If the pen Pen is close to the magnetic field generation coil GX(n), the magnetic field generation coil GX(n) and the coil L1 are electromagnetically coupled, an induced voltage due to mutual induction is generated in the coil L1 by the magnetic field $\phi 1$, and the capacitive element C is charged.

Next, the operation of FIG. 2A proceeds to the magnetic field detection period shown in FIG. 2B. In the magnetic field detection period, the detection of the magnetic field is performed by using the detection electrodes RL(0) to RL(p). Each of the detection electrodes RL(0) to RL(p) has a pair of end portions. The other end portions between the predetermined detection electrodes among the detection electrodes RL(0) to RL(p) are electrically connected to each other. For example, the other end portions of the detection electrodes RL(0) and RL(3) shown in FIG. 1A are electrically connected to each other on an upper side of FIG. 1A. Thereby, the detection electrodes RL(0) and RL(3) arranged in parallel are serially connected to each other. In the magnetic field detection period, the first voltage Vs is supplied to one end portion of the detection electrode RL(3), and one end portion of the detection electrode RL(0) is connected to the unit detection circuit. Thereby, a magnetic field detection coil whose inside is an area sandwiched (formed) between the detection electrodes RL(0) and RL(3) is formed, and the magnetic field detection coil detects the magnetic field generated by the pen Pen.

In FIG. 2B, "DY(n−2)" shows a magnetic field detection coil constituted by the detection electrodes RL(0) and RL(3) and, similarly, "DY(n−1)" to "DY(n+1)" show magnetic field detection coils constituted by the detection electrodes RL(2) to RL(p). In the magnetic field detection period, the first voltage Vs is supplied to one end portion of each of the magnetic field detection coils DY(n−1) to DY(n+1), and the signals Rx(n−2) to Rx(n+1) at the other end portions of the respective magnetic field detection coils are supplied to the unit detection circuits.

If the capacitive element C is charged during the magnetic field generation period, the coil L1 generates a magnetic field φ2 that varies depending on a resonance frequency of the resonance circuit according to the charges charged in the capacitive element C during the magnetic field detection period. In FIG. 2B, a center of the coil L1 (one-dot chain line) exists inside the magnetic field detection coil DY(n). Therefore, an electromagnetic coupling is generated between the magnetic field detection coil DY(n) and the coil L1, and an induced voltage is generated in the magnetic field detection coil DY(n) by mutual induction. As a result, the signal Rx(n) at the other end portion of the magnetic field detection coil DY(n) changes depending on the amount of charges charged in the capacitive element C. The unit detection circuit connected to the magnetic field detection coil DY(n) outputs, as a detection signal, the change in this signal Rx(n). This allows extraction of whether or not the pen Pen is close (touched) thereto and the extraction of its coordinates. In addition, since the detection signal varies depending on the charge amount, a distance between the pen Pen and the display device can be obtained.

FIG. 2C shows the magnetic field generation period shifted following FIG. 2B. A difference from FIG. 2A is that the magnetic field drive signal CLK is supplied to the magnetic field generation coil GX(n+1). Since a position of the pen Pen has not changed, no induced voltage is generated in the coil L1 and the capacitive element C is not charged during the magnetic field generation period shown in FIG. 2C. Thereby, during the magnetic field detection period shifted following FIG. 2C, it is detected that the pen Pen is not close thereto. Hereinafter, the pen Pen is detected in the same manner.

<Principle of Electric Field Detection>

Figure 3A:
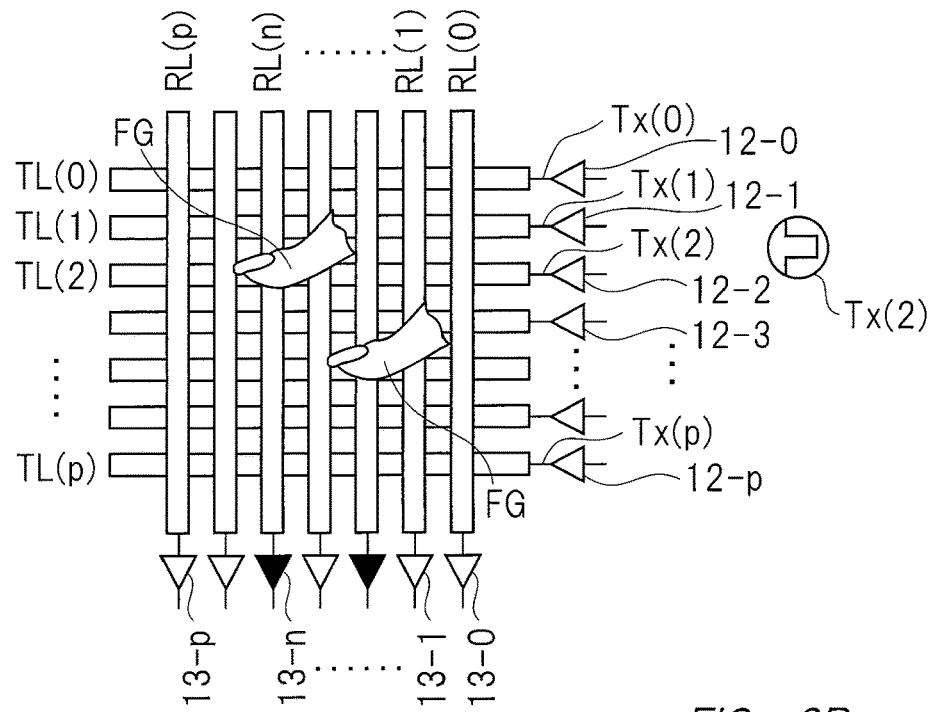
FIG. 3A is an explanatory diagram showing a principle of electric field detection.
Figure 3B:
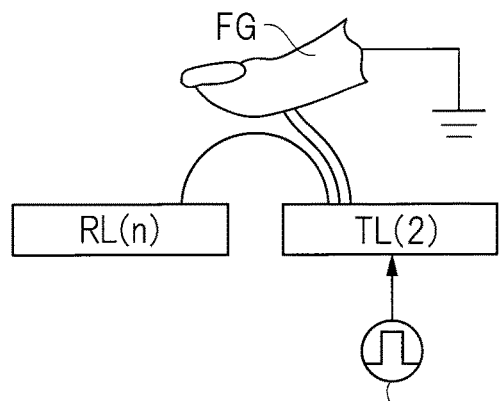
FIG. 3B is an explanatory diagram showing the principle of electric field detection.
Figure 3C:
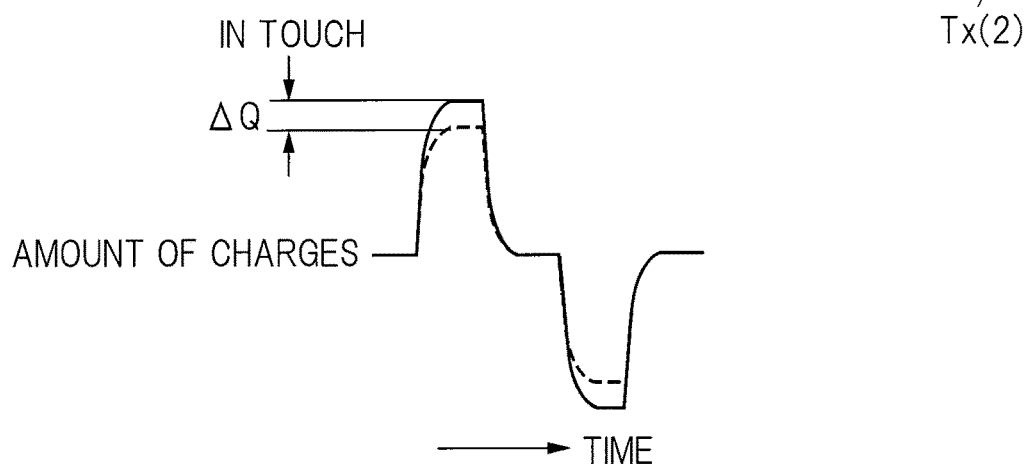
FIG. 3C is an explanatory diagram showing the principle of electric field detection.

FIGS. 3A to 3C are explanatory diagrams showing a principle of electric field detection. In FIG. 3A, each of "12-0" to "12-*p*" shows a unit drive circuit for outputting an electric field drive signal, and each of "13-0" to "13-*p*" shows a unit detection circuit. In addition, in FIG. 3A, a pulse signal surrounded by a solid line circle (○) shows a waveform of the electric field drive signal Tx(2) supplied to the drive electrode TL(2). As an external object, a finger is denoted as FG.

When the electric field drive signal Tx(2) is supplied to the drive electrode TL(2), an electric field is generated between the drive electrode TL(2) and the detection electrode RL(n) orthogonal to the drive electrode TL(2) as shown in FIG. 3B. At this time, if the finger FG touches vicinity of the drive electrode TL(2), an electric field is also generated between the finger FG and the drive electrode TL(2), and the electric field generated between the drive electrode TL(2) and the detection electrode RL(n) decreases. Thereby, the charge amount between the drive electrode TL(2) and the detection electrode RL(n) is reduced. As a result, as shown in FIG. 3C, when the finger FG is touched, the charge amount generated in response to supply of the drive signal Tx(2) decreases by ΔQ as compared with a case where it is not touched. A difference in the charge amount emerges as a voltage difference, is supplied to the unit detection circuit 13-*n*, and is then outputted as a detection signal.

Also regarding other drive electrodes similarly, by supplying electric field drive signals, voltage changes in signals depending on whether or not the finger FG is touched occur in the detection electrodes RL(0) to RL(p), and are then outputted as detection signals. This allows the extraction of whether or not the finger FG is touched and the extraction of its coordinates.

As described above, when the magnetic field is detected, a magnetic field drive signal is supplied to the selected drive electrode out of the drive electrodes TL(0) to TL(p), and when the electric field is detected, an electric field drive signal is supplied to the selected drive electrode. On the other hand, at a time of display, a display drive signal is supplied to the drive electrodes TL(0) to TL(p). Since the drive electrodes TL(0) to TL(p) are set to the same voltage by the display drive signal, the drive electrodes TL(0) to TL(p) can be regarded as one common electrode.

<Overall Configuration of Display Device>

Figure 4:
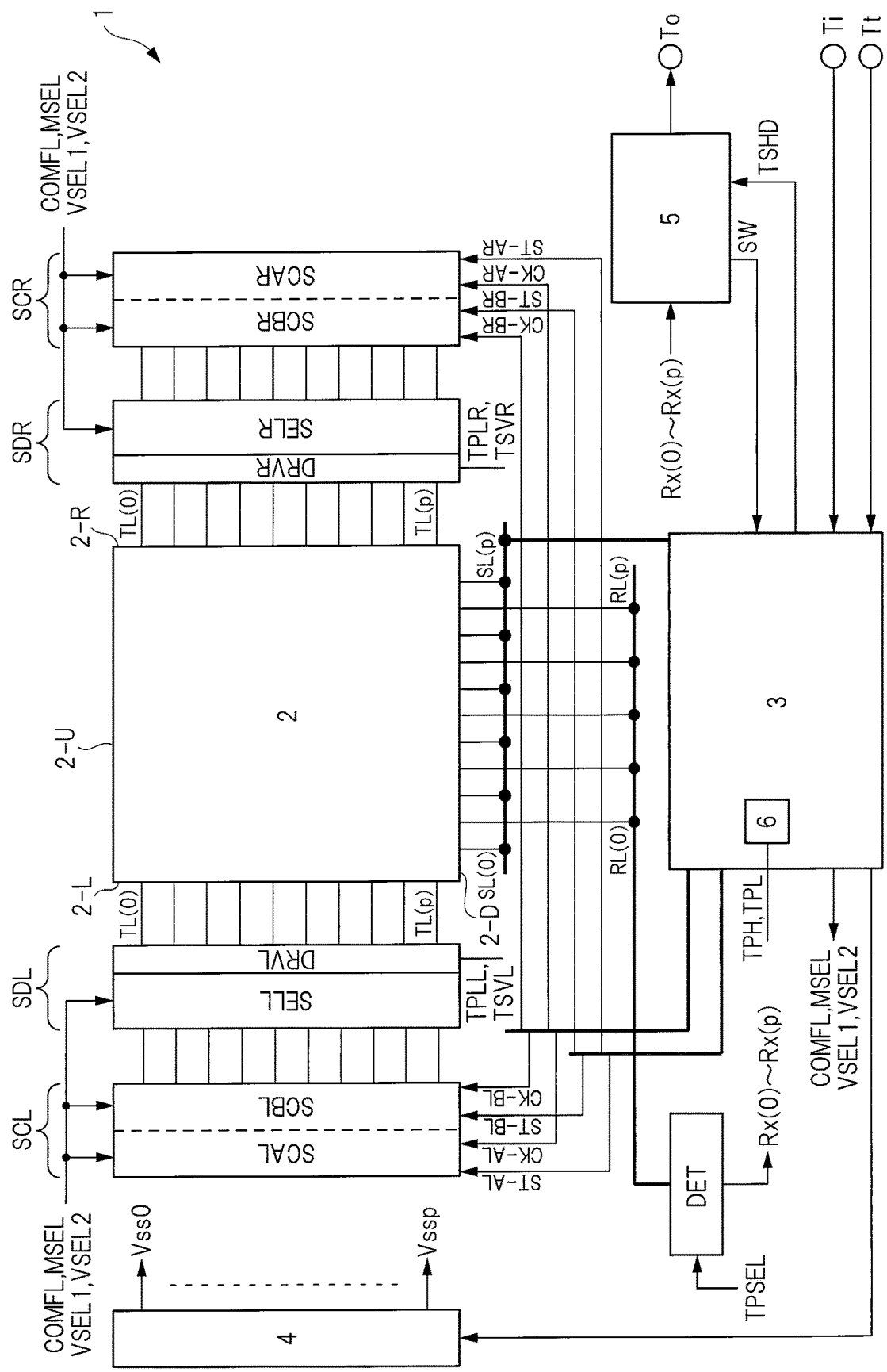
FIG. 4 is a block diagram showing a configuration of a display device according to an embodiment.

FIG. 4 is a block diagram showing a configuration of a display device 1 according to an embodiment. In FIG. 4, the display device 1 includes a display panel (liquid crystal panel), a control device 3, a gate driver 4, and a touch control device 5. In addition, the display device 1 includes a first scanner circuit SCL, a second scanner circuit SCR, a first selection drive circuit SDL, a second selection drive circuit SDR, and a detection circuit DET. The display panel includes a display area (display portion) for the display and a peripheral area (peripheral portion). When viewed from the viewpoint of display, the display area is an active area and the peripheral area surrounding the display area is an inactive area. In FIG. 4, reference numeral "2" denotes the display area. In addition, the display area 2 is an area for magnetic field touch detection due to an electromagnetic induction method and for electric field touch detection due to an electrostatic capacitance method.

The display area 2 has a pixel array in which a plurality of pixels are arranged in a matrix. In the pixel array, a plurality of signal lines, a plurality of drive electrodes, a plurality of scanning lines, a plurality of pixel electrodes, and a plurality of detection electrodes are arranged. When described with reference to FIG. 4, the signal lines SL(0) to SL(p) in the pixel array extend in the longitudinal direction (column direction) and are arranged parallel to the lateral direction (row direction). In addition, the drive electrodes TL(0) to TL(p) extend in the lateral direction and are arranged parallel to the longitudinal direction. The pixel electrodes are arranged in a matrix. Furthermore, the scanning lines extend in the lateral direction and are arranged parallel to the longitudinal direction, and the detection electrodes RL(0) to RL(p) extend in the longitudinal direction and are arranged parallel to the lateral direction. In this case, the pixels are arranged in a space formed by intersections of the plurality of signal lines and the plurality of scanning lines. In a period for the display (hereinafter, also referred to as a "display period"), the pixel is selected by the signal line and the scanning line, a voltage of the pixel electrode provided via the signal line and a voltage of the drive electrode at the moment are applied to the selected pixel, and the selected pixel is displayed according to a voltage difference between the pixel electrode and the drive electrode.

The control device 3 receives a timing signal supplied to an external terminal Tt, and image information supplied to an input terminal Ti, forms an image signal in accordance with the image information in the display period, and supply the image signal to the plurality of signal lines SL(0) to SL(p). In addition, the control device 3 receives the timing signal supplied to the external terminal Tt, and a control signal SW from the touch control device 5, and forms various signals. In FIG. 4, only signals needed for description among the signals formed by the control device 3 are drawn as representatives. The control device 3 includes a drive signal circuit 6 for forming drive signals TPH and TPL. In addition, the control device 3 forms a synchronization signal TSHD, a control signal COMFL, an electric field selection signal MSEL, and state selection signals VSEL1 and VSEL2. Further, the control device 3 forms shift clock signals CK-AR, CK-BR, CK-AL, and CK-BL and start signals ST-AR, ST-BR, ST-AL, and ST-BL.

The synchronization signal TSHD is a synchronization signal for discriminating a display period for performing display in the display area 2 from a period for performing touch detection (hereinafter also referred to as a "touch detection period"). The control device 3 controls the touch control device 5 by the synchronization signal TSHD so that the touch control device 5 operates during the touch detection period. Since signals other than the synchronization signal TSHD are described below, their descriptions will be omitted here.

At a time of display, the gate driver 4 forms the scanning line signals Vss0 to Vssp in accordance with the timing signal from the control device 3, and supply them to the scanning lines in the display area 2. In the display period, the pixel connected to the scanning line to which the high-level scanning line signal is supplied is selected, and the selected pixel performs display according to the image signal supplied to the signal lines SL(0) to SL(p) at the moment.

The detection circuit DET detects a change in the signals in the detection electrodes RL(0) to RL(p) at times of the magnetic field touch detection and the electric field touch detection, and outputs, as detection signals Rx(0) to Rx(p), the change.

The touch control device 5 receives the detection signals Rx(0) to Rx(p), extracts coordinates of the touched position, and outputs them from the external terminal To. In addition, the touch control device 5 outputs the control signal SW and receives the synchronization signal TSHD, and operates in synchronization with the display control device 3.

The display area 2 has sides 2-U and 2-D parallel to the rows of the pixel array and sides 2-R and 2-L parallel to the columns of the pixel array. Here, the side 2-U and the side 2-D are sides facing each other, and a plurality of drive electrodes and a plurality of scanning lines in the pixel array are arranged between the two sides. In addition, the side 2-R and the side 2-L are also sides facing each other, and a plurality of signal lines and a plurality of detection electrodes in the pixel array are arranged between the two sides.

The first scanner circuit SCL and the first selection drive circuit SDL are arranged so as to be close to one end portions of the plurality of drive electrodes along the side 2-L of the display area 2, and the first selection drive circuit SDL is connected to one end portion of each of the drive electrodes TL(0) to TL(p) on the side 2-L. Similarly, the second scanner circuit SCR and the second selection drive circuit SDR are arranged so as to be close to the other end portions of the plurality of drive electrodes along the side 2-R of the display area 2, and the second selection drive circuit SDR is connected to the other end portion of each of the drive electrodes TL(0) to TL(p) on the side 2-R.

The first scanner circuit SCL includes a pair of scanner circuits SCAL and SCBL, and the first selection drive circuit SDL includes a first selection circuit SELL and a first drive circuit DRVL. Similarly, the second scanner circuit SCR includes a pair of scanner circuits SCAR and SCBR, and the second selection drive circuit SDR includes a second selection circuit SELR and a second drive circuit DRVR.

The first scanner circuit SCL, the second scanner circuit SCR, the first selection drive circuit SDL, and the second selection drive circuit SDR select the desired drive electrode(s) from the drive electrodes TL(0) to TL(p), and supply a magnetic field drive signal to the selected drive electrode at the time of the magnetic field touch detection; and select the desired drive electrode(s), and supply an electric field drive signal to the selected drive electrode also at the time of the electric field touch detection. Therefore, at the times of the magnetic field touch detection and electric field touch detection, a drive circuit for driving the drive electrodes can be considered to be configured by the first scanner circuit SCL, the second scanner circuit SCR, the first selection drive circuit SDL, and the second selection drive circuit SDR.

In FIG. 4, each of "TPLL", "TPLR", "TSVL", and "TSVR" shows a signal wiring. The signal wirings TPLL and TSVL extend along the side 2-L of the display area 2 and pass through the first drive circuit DRVL. Similarly, the signal wirings TPLR and TSVR extend along the side 2-R of the display area 2 and pass through the second drive circuit DRVR. When described with reference to FIG. 4, each of the signal wirings TPLL, TPLR, TSVL, and TSVR extends in a longitudinal direction crossing the lateral direction in which each of the drive electrodes TL(0) to TL(p) extends.

The first scanner circuit SCL, the second scanner circuit SCR, the first selection drive circuit SDL, and the second selection drive circuit SDR will be described in detail below with reference to the drawings. The first drive circuit DRVL constituting the first selection drive circuit SDL corresponds to the first selection circuit SELL, and electrically connects, to the signal wiring TPLL or TSVL, the drive electrode designated by the selection signal from the first selection circuit SELL at the times of the magnetic field touch detection and the electric field touch detection. Similarly, the second drive circuit DRVR constituting the second selection drive circuit SDR corresponds to the second selection circuit SELR, and electrically connects, to the signal wiring TPLR or TSVR, the drive electrode designated by the selection signal from the second selection circuit SELR at the times of the magnetic field touch detection and the electric field touch detection.

The drive signals TPL and TSV formed by the drive signal circuit 6 provided in the control device 3 are respectively supplied to the end portions of the signal wirings TPLL, TPLR and TSVL, TSVR. As will be described in detail below, at the time of the magnetic field touch detection, the drive signals TPL and TSV respectively propagating through the signal wirings TPLL, TPLR and TSVL, TSVR are supplied to the selected drive electrode through the first drive circuit DRVL and the second drive circuit DRVR, and a magnetic field is generated. In addition, at the time of the electric field touch detection, the drive signal TSV propagating through the signal wirings TSVL and TSVR is supplied to the selected drive electrode through the first drive circuit DRVL and the second drive circuit DRVR, and an electric field is generated. In addition, the signal wiring TPLL may also be referred to as the first signal wiring, the signal wiring TSVR may also be referred to as the second signal wiring, the signal wiring TSVL may also be referred to as the third signal wiring, and the signal wiring TPLR may also be referred to as the fourth signal wiring.

<Module Configuration of Display Device 1>

Figure 5:
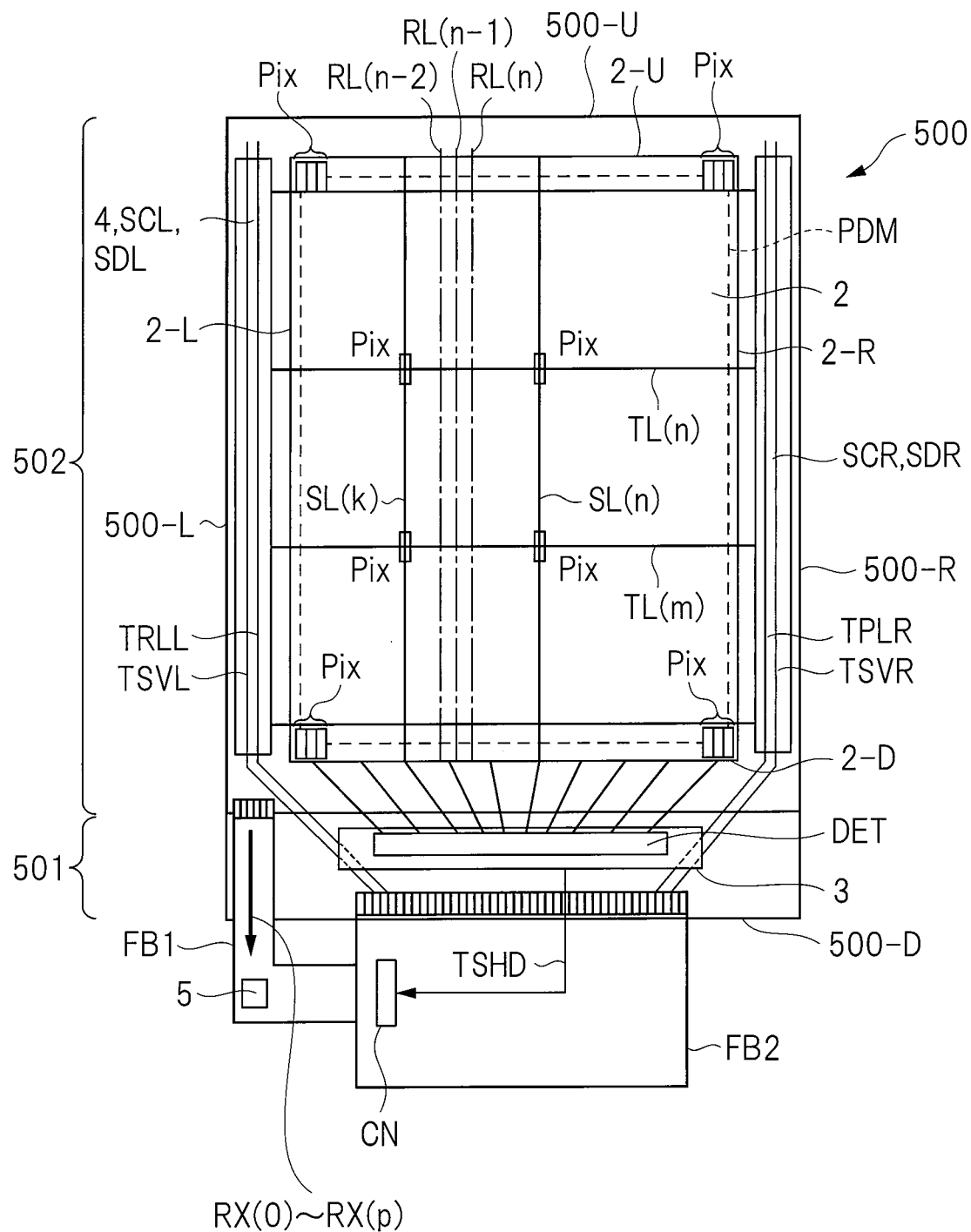
FIG. 5 is a plan view showing a configuration of a module according to the embodiment.

FIG. 5 is a schematically plan view showing the overall configuration of a module 500 on which the display device 1 is mounted. Although schematically shown, FIG. 5 is drawn according to actual arrangement. In the Figure, reference numeral "501" shows an area of the first substrate TGB illustrated in FIGS. 1A and 1B, and reference numeral "502" shows an area in which the first substrate TGB and the second substrate CGB are laminated. In the module 500, the first substrate TGB is integrated in areas 501 and 502. In addition, in the area 502, the second substrate CGB is mounted on the first substrate TGB so that a first main surface TSF1 of the first substrate TGB and a second main surface CSF2 of the second substrate CGB face each other. In FIG. 5, reference numerals "500-U" and "500-D" denote shorter sides of the module 500, and reference numerals "500-L" and "500-R" denote longer sides of the module 500.

In the area 502 between the side 2-L of the display area 2 and the longer side 500-L of the module 500, the gate driver 4, the first scanner circuit SCL, and the first selection drive circuit SDL shown in FIG. 4 are arranged. In an area between the side 2-R of the display area 2 and the longer side 500-R of the module 500, the second scanner circuit SCR and the second selection drive circuit SDR shown in FIG. 4 are arranged. In an area between the side 2-D of the display area 2 and the shorter side 500-D of the module 500, the detection circuit DET and the control device 3 shown in FIG. 4 are arranged. The detection circuit DET is constituted by wirings and parts formed on the first main surface TSF1 of the first substrate TGB in the area 501. When viewed in a plan view, the control device 3 is mounted on the first substrate TGB so as to cover the detection circuit DET. In addition, wirings and parts constituting the first scanner circuit SCL, the second scanner circuit SCR, the first selection drive circuit SDL, and the second selection drive circuit SDR are also formed on the first main surface TSF1 of the first substrate TGB in the area 502. For example, the control device is the driver IC. The detection circuit DET may be incorporated in the driver IC.

The detection signals Rx(0) to Rx(p) described in FIG. 4 are supplied to the touch control device 5 through wirings in a flexible cable FB1. A flexible cable FB2 is connected to the area 501, and signals are transmitted and received between the touch control device 5 and the control device 3 through a connector CN provided on the flexible cable FB2.

As already described, the display area 2 has a pixel array in which a plurality of pixels are arranged in a matrix, and includes the plurality of drive electrodes TL(0) to TL(p) and the scanning line arranged along the row of the pixel array, and the plurality of signal lines SL(0) to SL(p) and the plurality of detection electrodes RL(0) to RL(p) arranged along the column of the pixel array. FIG. 5 shows, as an example, two drive electrodes TL(n) and TL(m), two signal lines SL(k) and SL(n), and three detection electrodes RL(n−2) to RL(n). In FIG. 5, the lateral direction is the row direction of the pixel array, and the longitudinal direction is the column direction of the pixel arrays. Therefore, the illustrated drive electrodes TL(n) and TL(m) extend in the lateral direction, and are arranged parallel to the longitudinal direction. In addition, the illustrated signal lines SL(k) and SL(n) extend in the longitudinal direction and are arranged parallel to the lateral direction. Each of the illustrated detection electrodes RL(n−2) to RL(n) extends in the longitudinal direction and is arranged parallel to the lateral direction. Incidentally, although the scanning line is omitted in FIG. 5, the scanning line extends parallel to the illustrated drive electrodes TL(n) and TL(m).

In addition, in FIG. 5, the pixel array is shown as dashed line PDM. Out of the plurality of pixels arranged on the pixel array PDM, the pixels arranged at four corners of the display area 2 and the pixels arranged at crossing portions of the illustrated drive electrodes and the signal lines are shown as Pix. Although not shown, each of the pixels Pix includes; a switch that is switch-controlled by a scanning line signal (for example, Vss0 in FIG. 4); and a pixel electrode connected to the switch. In the display period, when the switch is turned on by the scanning line signal Vss0, the pixel electrode is connected to the signal line through the switch. During the display period, the liquid crystal layer changes according to a potential difference between the image signal supplied to the pixel electrode through the signal line and the drive electrode, and performs its display.

Each of the signal wirings TPLL and TSVL shown in FIG. 4 extends in the longitudinal direction (the column direction of the pixel array) in an area between the longer side 500-L of the module 500 and the side 2-L of the display area 2. Similarly, each of the signal wirings TPLR and TSVR extends in the longitudinal direction (the direction of the pixel array: a first direction) in an area between the longer side 500-R of the module 500 and the side 2-R of the display area 2. When the extending direction of the drive electrodes TL(0) to TL(p), that is, the lateral direction is viewed as a second direction, the signal lines SL(0) to SL(p), the detection electrodes RL(0) to RL(p), and the signal wirings TPLL, TPLR, TSVL, and TSVR extend in the first direction orthogonal to (including crossing) the second direction. At this time, the omitted scanning line extends along the second direction.

Although FIG. 4 shows an example in which the drive signal circuit 6 provided in the control device 3 forms the drive signals TPL and TSV, formation of the drive signals is not limited thereto, and the drive signals may be formed by other circuit blocks and the like. In a case of forming them by the other circuit blocks, for example, the signal wirings TPLL, TPLR, TSVL, and TSVR are connected to the wirings in the flexible cable FB2 on the first main surface TSF1 of the first substrate TGB, and are connected to other circuit blocks arranged on the flexible cable FB or in any place. In FIG. 5, broken lines shown in the control device 3 show a case where the drive signals TPL and TSV are formed by the other circuit blocks. That is, portions covered by the control device 3 are shown as the broken lines in the signal wirings TPLL, TPLR, TSVL, and TSVR that transmit drive signals formed by the other circuit blocks (drive signal circuits).

As shown in FIG. 5, the control device 3 and the flexible cable FB2 are arranged on the side 2-D side of the display area 2 and the side 500-D side of the module 500. Therefore, the drive signals TPL and TSV are respectively supplied to the signal wirings TPLL, TPLR; and TSVL, TSVR from the side 2-D side of the display area 2 and the side 500-D side of the module 500. In this case, the end portions of the signal wirings TPLL, TPLR; and TSVL, TSVR to which the drive signals are supplied are arranged on the side 2-D side of the display area 2 and the side 500-D side of the module 500. Therefore, when viewed in a plan view, the drive electrode TL(p) in FIGS. 4 and 5 is arranged nearest to the end portions of the signal wirings TPLL, TPLR; and TSVL, TSVR, and the drive electrode TL(0) is arranged furthest away from the end portions of the signal wirings TPLL, TPLR; and TSVL, TSVR. That is, the drive electrode is arranged at a position (in an area) away from the end portions of the signal wirings TPLL, TPLR; and TSVL, TSVR from the drive electrode TL(p) to the drive electrode TL(0).

<Summary of Magnetic Field Generation Period>

The principle of magnetic field detection by using the drive electrodes has been described with reference to FIG. 2. For ease of understanding, FIG. 2 shows an example in which a magnetic field generation coil is configured by electrically connecting the drive electrodes. The present inventor has considered a configuration for generating a magnetic field without electrically connecting the drive electrodes, and has applied it to the display device 1. Before the more specific description of the display device 1, the magnetic field generation considered by the present inventor will be described.

Figure 6A:
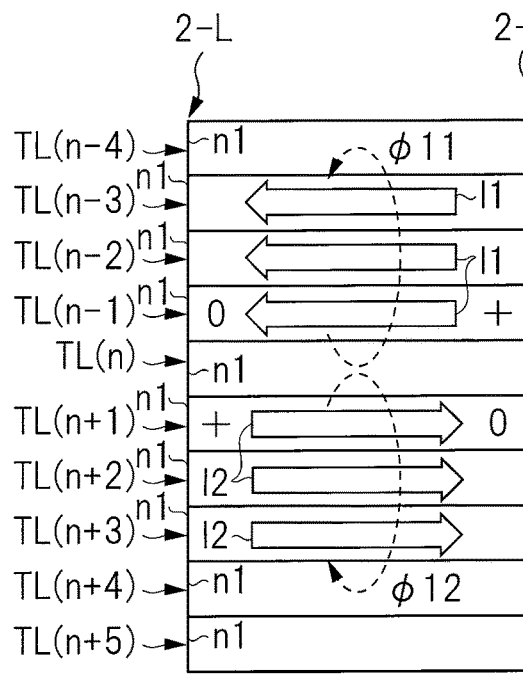
FIG. 6A is a plan view for explaining an operation during a magnetic field generation period.
Figure 6B:
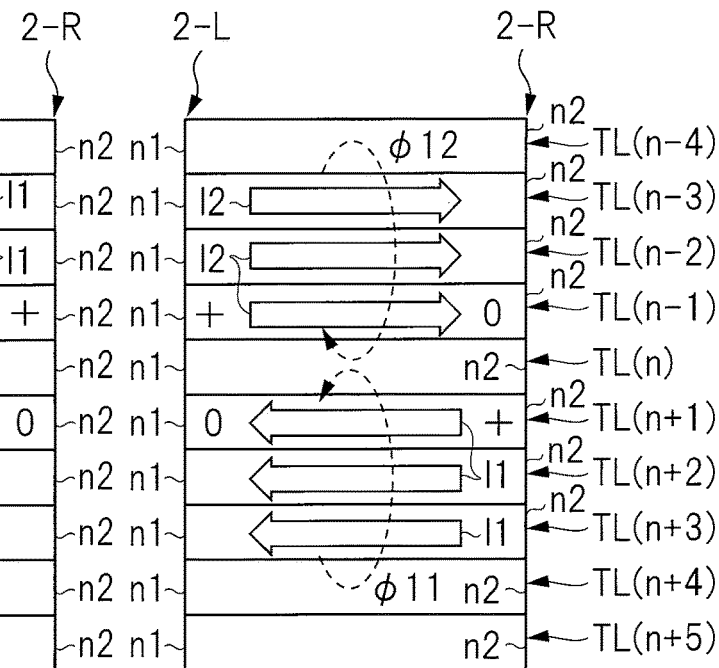
FIG. 6B is a plan view for explaining an operation during the magnetic field generation period.

FIGS. 6A and 6B are plan views for illustrating the operation in the magnetic field generation period. In FIGS. 6A and 6B, reference numerals "TL(n−4)" to "TL(n+5)" denote drive electrodes. The drive electrodes TL(n−4) to TL(n+5) are arranged parallel to each other when viewed in a plan view, and each drive electrode has a pair of end portions n1 and n2. Here, one end portion n1 of each of the drive electrodes TL(n−4) to TL(n+5) is arranged along the side 2-L of the display area 2, and the other end portion n2 of each of the drive electrodes is arranged along the side 2-R of the display area 2.

Here, a period of the magnetic field touch detection for detecting whether the pen Pen (FIGS. 2A to 2C) is touched (hereinafter also referred to as "magnetic field touch detection period") in the area of the drive electrode TL(n) will be described as an example. In the magnetic field touch detection period, the drive electrodes TL(n−3) to TL(n−1) and TL(n+1) to TL(n+3) are driven so that the drive state shown in FIG. 6A and the drive state shown in FIG. 6B occur once or a plurality of times during the magnetic field generation period.

In the magnetic field generation period, a pair of drive electrodes, between which the area of the drive electrode TL(n) for generating the magnetic field are sandwiched and arranged, are selected, and the drive electrodes are driven so that directions of currents flowing through the selected pair of drive electrodes are opposite to each other. In FIGS. 6A and 6B, three adjacent drive electrodes are bundled, and the bundle of drive electrodes (hereinafter also referred to as "bundle drive electrodes") is used as the drive electrodes for constituting a pair. That is, the drive electrodes TL(n−3) to TL(n−1) are bundled to configure the bundle drive electrodes, and the drive electrodes TL(n+1) to TL(n+3) are bundled to configure bundle drive electrodes.

In FIG. 6A, a first voltage Vs such as a ground voltage is supplied to one end portions n1 of the drive electrodes TL(n−3) to TL(n−1), and a second voltage Vd having a larger absolute value than the first voltage Vs is supplied to the other end portions n2. This causes a current I1 to flow from the other end portion n2 to the one end portion n1 in each of the drive electrodes TL(n−3) to TL(n−1). As a result, the bundle drive electrodes constituted by the drive electrodes TL(n−3) to TL(n−1) generate a magnetic field φ11 in a direction shown by a broken line in FIG. 6A. At this time, the second voltage Vd is supplied to one end portions n1 of the drive electrodes TL(n+1) to TL(n+3), and the first voltage Vs is supplied to the other end portions n2. Thereby, a current I2 flows from the one end portion n1 to the other end portion n2 in each of the drive electrodes TL(n+1) to TL(n+3). As a result, the bundle drive electrodes constituted by the drive electrodes TL(n+1) to TL(n+3) generate a magnetic field φ12 in a direction shown by the broken line in FIG. 6A.

The directions of the magnetic fields φ11 and φ12 generated by the respective bundle drive electrodes are opposite to each other since the directions of the currents I1 and I2 are opposite to each other, and the magnetic fields φ11 and φ12 are superimposed in the area of the drive electrode TL(n), so that a strong magnetic field is generated in the area of the drive electrode TL(n).

In FIG. 6B, voltages supplied to the bundle drive electrodes are made to be opposite to those in FIG. 6A. That is, the second voltage Vd is supplied to the one end portions n1 of the drive electrodes TL(n−3) to TL(n−1), and the first voltage Vs is supplied to the other end portions n2. At this time, the first voltage Vs is supplied to the one end portions n1 of the drive electrodes TL(n+1) to TL(n+3), and the second voltage Vd is supplied to the other end portions n2. Thus, a direction of the current flowing through the drive electrodes TL(n−3) to TL(n−1) is reversed from the direction of the current of FIG. 6A, and the above current is the current I2. Thereby, the direction of the generated magnetic field is also reversed, and the magnetic field φ12 in the direction indicated by the broken line is generated. Similarly, a direction of the current flowing through the drive electrodes TL(n+1) to TL(n+3) is reversed, the direction of the generated magnetic field is also reversed, and the above magnetic field is the magnetic field φ11 indicated by the broken line. As a result, the magnetic fields φ11 and φ12 are superimposed in the area of the drive electrode TL(n), and a strong magnetic field is generated.

Thus, the strong magnetic field can be generated in the area of the desired drive electrode without electrically connecting the drive electrodes with each other. Incidentally, in FIG. 6, the first voltage Vs is denoted by "0" and the second voltage Vd is denoted by "+".

It is the same description as those made with reference to FIGS. 2A to 2C that the charges are accumulated in the capacitive element of the pen Pen by the magnetic field generated during the magnetic field generation period, and that the magnetic field generated by the pen Pen is detected by the magnetic field detection coil during the magnetic field detection period.

<Study by Present Inventor>

As described with reference to FIGS. 6A and 6B during the magnetic field generation period, the first drive circuit DRVL and the second drive circuit DRVR shown in FIG. 4 are controlled by the first selection circuit SELL and the second selection circuit SELR so as to alternately supply the first voltage Vs and the second voltage Vd to the end portions n1 and n2 of the selected drive electrodes. At this time, the control device 3 supplies the drive signal TPL, which has the first voltage Vs, to the end portion of each of the signal wirings TPLL and TPLR, and supplies the drive signal TSV, which has the second voltage Vd, to the end portion of each of the signal wirings TSVL and TSVR.

Figure 17A:
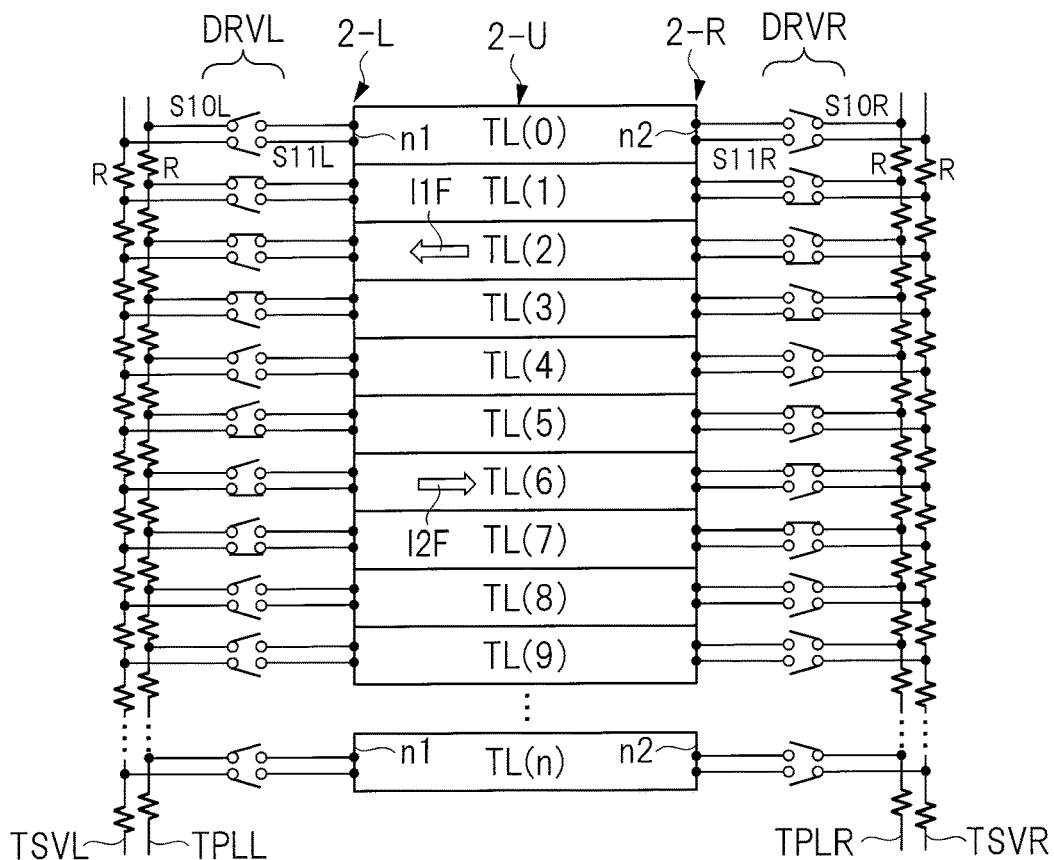
FIG. 17A is a plan view showing a configuration of drive circuits studied by the present inventor.
Figure 17B:
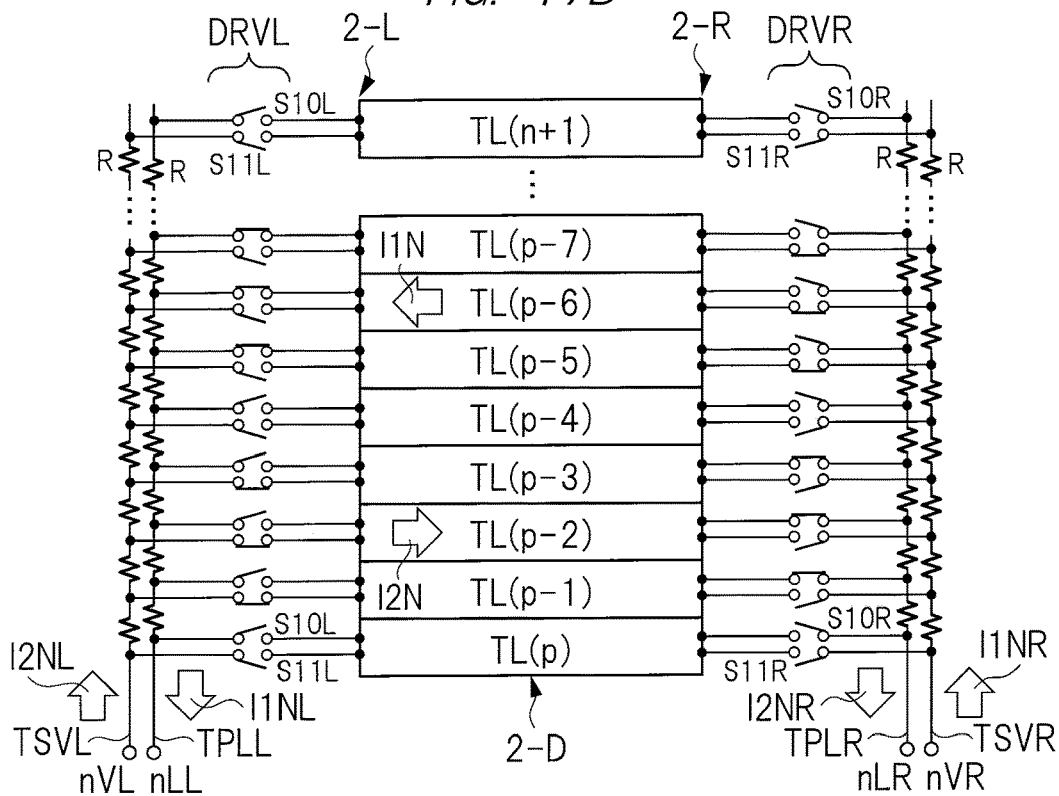
FIG. 17B is a plan view showing the configuration of drive circuits studied by the present inventor.

The present inventor has first studied, as the configuration of the first drive circuit DRVL and the second drive circuit DRVR, the configuration as shown in FIGS. 17A and 17B. FIGS. 17A and 17B are plan views showing the configuration of the drive circuits studied by the present inventor. Also in FIGS. 17A and 17B, the reference numerals "TL(0)" to "TL(p)" denote a plurality of drive electrodes arranged parallel to the longitudinal direction and between the sides 2-U and 2-D of the display area 2. Here, the drive electrodes TL(0) to TL(n) close to the side 2-U side are shown in FIG. 17A, and the drive electrodes TL(n+1) to TL(p) close to the side 2-D side are shown in FIG. 17B. The plan view of the drive electrodes TL(0) to TL(p) is completed by arranging FIG. 17A on a top side of FIG. 17B.

In addition, in FIGS. 17A and 17B, "TPLL", "TPLR"; and "TSVL", "TSVR" respectively denote signal wirings for transmitting the drive signals TPL and TSV. In FIGS. 17A and 17B, "nLL", "nLR", "nVL", and "nVR" respectively denote end portions of the signal wirings TPLL, TPLR, TSVL, and TSVR connected to the above-described drive signal circuit 6; the drive signal TPL is supplied to the end portions nLL and nLR; and the drive signal TSV is supplied to the end portions nVL and nVR. Therefore, in this Figure, among the signal wirings TPLL, TPLR, TSVL, and TSVR drawn around along the sides 2-L and 2-R of the display area 2, the end portions nLL, nLR, nVL, and nVR can be regarded as the nearest places to the drive signal circuit 6. When viewed in a plan view, the drive electrode is arranged away from the end portions nLL, nLR, nVL and nVR from the drive electrode TL(p) to the drive electrode TL(0).

The first drive circuit DRVL includes a plurality of first switches S10L connected between the one end portion n1 of each of the drive electrodes TL(0) to TL(p) and the signal wiring TPLL, and a plurality of second switches S11L connected between the one end portion n1 of each of the drive electrodes and the signal wiring TSVL. In this case, the first switch S10L or the second switch S11L becomes an on-state (conduction state) by the selection signal from the corresponding first selection circuit SELL. This allows the first voltage Vs or the second voltage Vd to be supplied to the one end portion n1 of the selected drive electrode. Similarly, the second drive circuit DRVR also includes a plurality of first switches S10R connected between the other end portion n2 of each of the drive electrodes TL(0) to TL(p) and the signal wiring TPLR, and a plurality of second switches S11R connected between the other end portion n2 of each of the drive electrodes and the signal wiring TSVR. Since the plurality of first switches S10R and second switches S11R constituting the second drive circuit DRVR are switch-controlled by selection signals from the corresponding second selection circuit SELR, the second voltage Vd or the first voltage Vs is supplied to the other end portion n2 of the selected drive electrode.

The first switches S10L and S10R and the second switches S11L and S11R are made the same size, and a single switch is used to connect each drive electrode and each signal wiring. Incidentally, in FIGS. 17A and 17B, reference numerals "S10L", "S11L", "S10R", and "S11R" are attached only to parts of the first switches and the second switches.

FIG. 17A shows states of the first switches S10L and S10R and the second switches S11L and S11R when a magnetic field is generated in the area of the drive electrode TL(4). In addition, FIG. 17B shows states of the first switches S10L and S10R and the second switches S11L and SUR when a magnetic field is generated in the area of the drive electrode TL(p-4).

At the time of the magnetic field generation period, the drive signal circuit 6 provided in the control device 3 supplies, to the end portions nVL and nVR of the signal wirings TSVL and TSVR, the drive signal TSV having the second voltage Vd, and supplies, to the end portions nLL and nLR of the signal wirings TPLL and TPLR, the drive signal TPL having the first voltage Vs. In this way, in FIG. 17A, a current I1F flows through each of the drive electrodes TL(1) to TL(3) (illustrated in TL(2)), and a current I2F flows through each of the drive electrodes TL(5) to TL(7) (illustrated in TL(6)). In addition, in FIG. 17B, a current I1N flows through each of the drive electrodes TL(p-7) to TL(p-5) (illustrated in TL(p-6)), and a current I2N flows through each of the drive electrodes TL(p-3) to TL(p-1) (illustrated in TL(p-2)). As a result, as described with reference to FIGS. 6A and 6B, the strong magnetic field is generated in the area of the drive electrode TL(4) in FIG. 17A, and the strong magnetic field is generated in the area of the drive electrode TL(p-4) in FIG. 17B.

In FIGS. 17A and 17B, "R" shown on the signal wirings TSVL, TSVR, TPLL, and TPLR represents, as distributed-constant resistance, a resistance component associated with each signal wiring. In order to avoid making the drawing complicated, the reference numeral "R" is also attached only to a part of the resistance components.

When the magnetic field is generated in the area of the drive electrode TL(p-4), the drive electrodes TL(p-7) to TL(p-5) and TL(p-3) to TL(p-1) are, in a plan view, close to the end portions nLL, nLR, nVL, and nVR of the signal wirings TPLL, TPLR, TSVL, and TSVR to which the drive signals TPL and TSV are supplied, and so the number of resistance R connected between the end portions n1 and n2 of these drive electrodes and the end portions of the signal wirings is reduced. Therefore, during the magnetic field generation period, currents having approximately the same values as the currents I1NL, I1NR, I2NL, and I2NR flowing through the end portions nLL, nLR, nVL, and nVR flow, as the currents I1N and I2N, through these drive electrodes.

In contrast, when a magnetic field is generated in the area of the drive electrode TL(4), the drive electrodes TL(1) to TL(3) and TL(5) to TL(7) are separated from the end portions nLL, nLR, nVL, and nVR of the signal wirings in a plan view, and so the number of resistance R connected between the end portions n1 and n2 of these drive electrodes and the end portions of the signal wirings is increased. Therefore, during the magnetic field generation period, the currents having less values than the currents I1NL, I1NR, I2NL, and I2NR flowing through the end portions nLL, nLR, nVL, and nVR flow, as the currents I1F and I2F, through these drive electrodes.

Since the currents flowing through the drive electrodes TL(1) to TL(3) and TL(5) to TL(7) are smaller than the currents flowing through the drive electrodes TL(p-7) to TL(p-5) and TL(p-3) to TL(p-1), the magnetic field generated by the drive electrodes TL(1) to TL(3) and TL(5) to TL(7) is weaker than the magnetic field generated by the drive electrodes TL(p-7) to TL(p-5) and TL(p-3) To TL(p-1). As a result, the magnetic field generated at the area of the drive electrode TL(4) is weaker than the magnetic field generated at the area of the drive electrode TL(p-4). That is, the magnetic field generated by the drive electrodes arranged at positions separated from the end portions nLL, nLR, nVL, and nVR in a plan view is weaker than the magnetic field generated by the drive electrodes arranged in positions close to the end portions nLL, nLR, nVL, and nVR.

Figure 18:
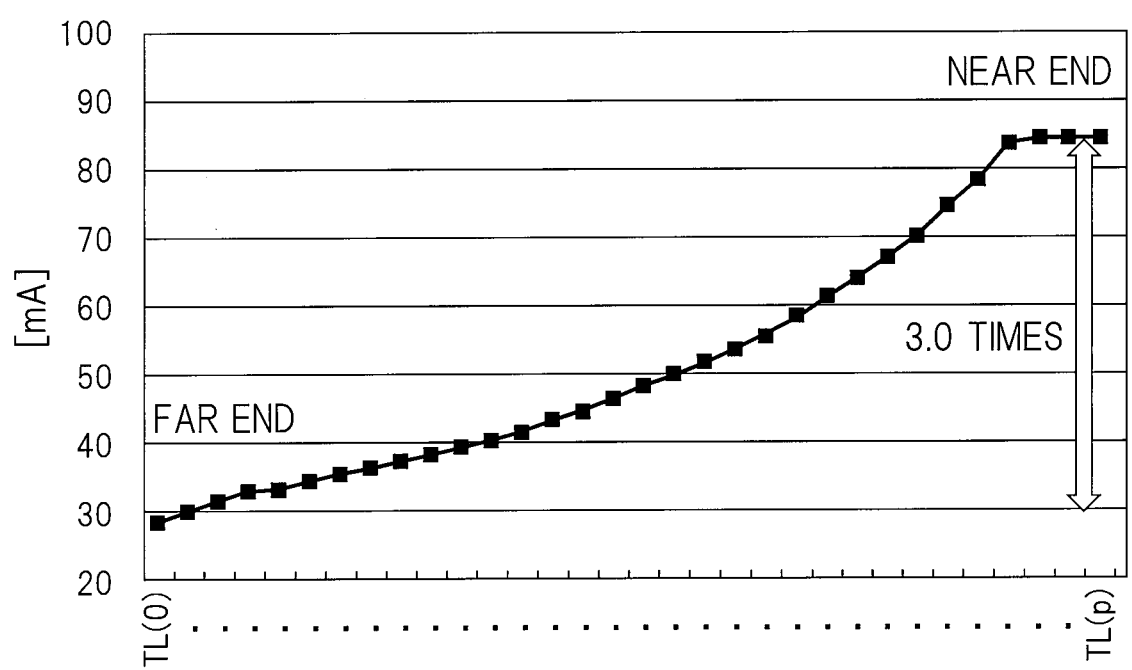
FIG. 18 is a characteristic diagram showing values of currents flowing through drive electrodes during a magnetic field generation period.

FIG. 18 is a characteristic diagram showing values of the currents flowing through the drive electrodes during the magnetic field generation period. FIG. 18 is the characteristic diagram measured and prepared by the present inventor. In FIG. 18, a horizontal axis shows the position of the drive electrode, a near end shows the drive electrode TL(p)

arranged close to the end portions nLL, nLR, nVL, and nVR, and a far end shows the drive electrode TL(0) arranged away from the end portions nLL, nLR, nVL, and nVR. The drive electrodes TL(p) to TL(0) are arranged in this order and away from the end portions of the signal wirings. That is, the far end is away from the drive signal circuit 6, and the near end is close to the drive signal circuit 6. A vertical axis in FIG. 18 shows the value of the current flowing through the drive electrode. As understood from FIG. 18, in the magnetic field generation period, the value of the current flowing through the drive electrode decreases from the near end to the far end. In addition, according to the result measured by the present inventor, the value of the current flowing through the drive electrode at the near end has a value about three times as large as the current flowing through the drive electrode at the far end.

As the value of the current flowing through the drive electrode decreases from the near end to the far end, the generated magnetic field also weakens from the near end to the far end. Therefore, during the magnetic field generation period, the charge amount accumulated in the capacitive element of the pen Pen also varies depending on the touched position. As a result, during the magnetic field detection period, the amount of changes detected by the magnetic field detection coil also changes, and detection sensitivity is displaced depending on the position. For example, in the touch control device 5 shown in FIG. 4, it is conceivable to reduce the displacement of the detection sensitivity by adjusting the received detection signals Rx(0) to Rx(p) and to make the detection sensitivity constant with respect to the position. But, as shown in FIG. 18, when a difference between the currents flowing through the drive electrode varies three times, the change in the generated magnetic field is large, and the detection sensitivity is not easy to adjust so as to become constant.

<Configuration of Display Device>

Figure 7:
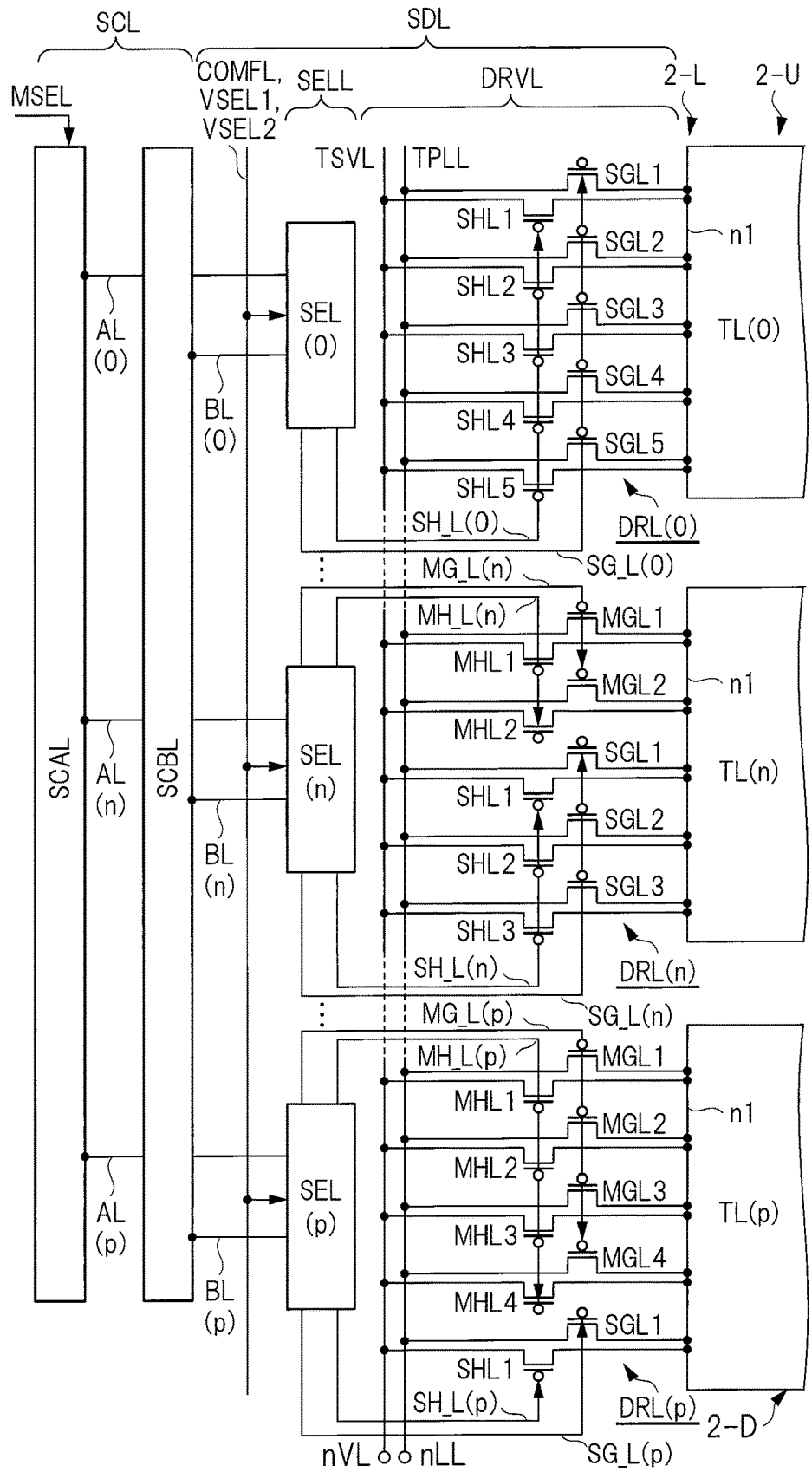
FIG. 7 is a plan view showing the configuration of the display device according to the embodiment.
Figure 8:
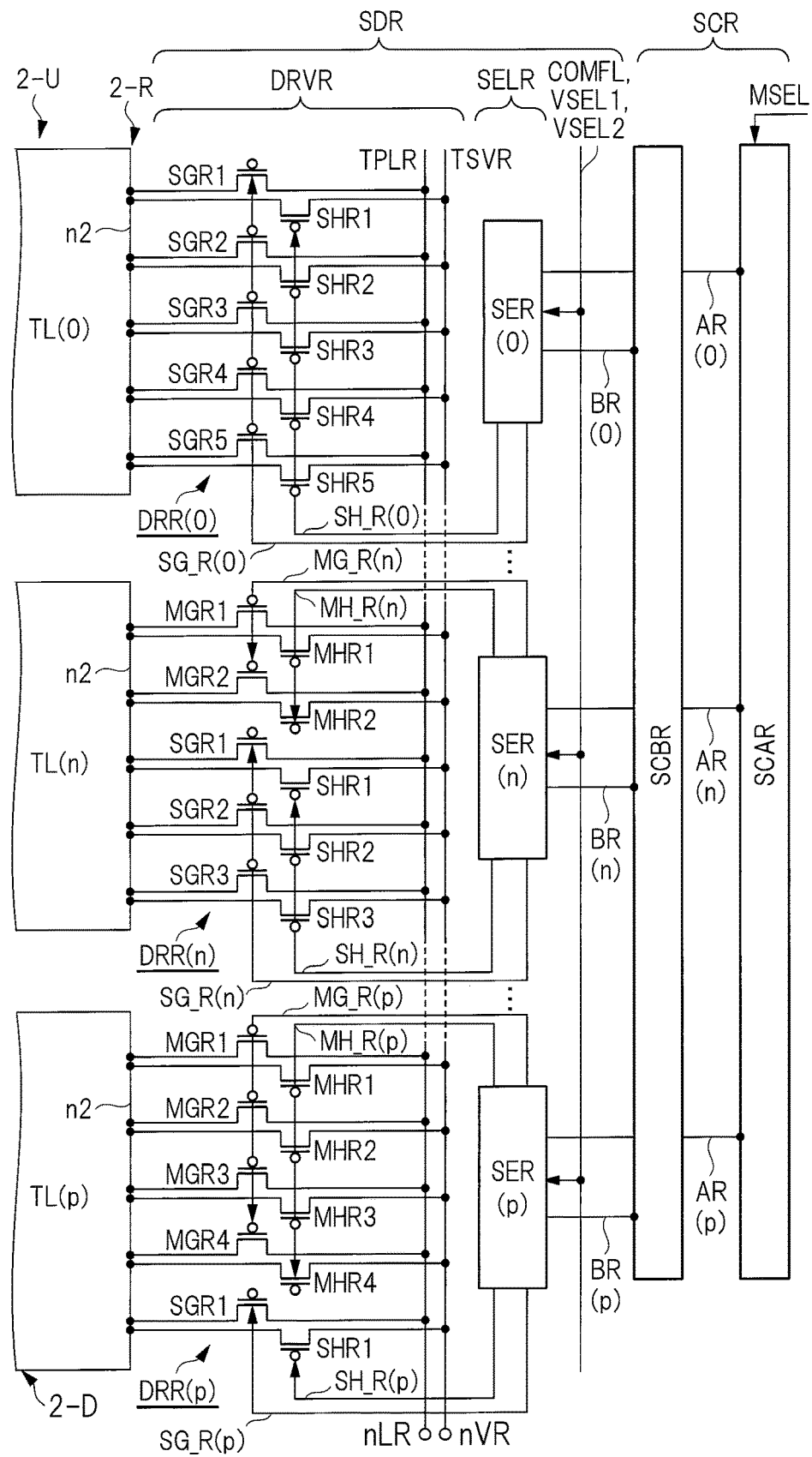
FIG. 8 is a plan view showing the configuration of the display device according to the embodiment.

FIGS. 7 and 8 are plan views showing a configuration of a display device 1 according to an embodiment. FIG. 7 shows the configurations of the first selection drive circuit SDL and the first scanner circuit SCL arranged along the side 2-L of the display area 2, and FIG. 8 shows the configurations of the second selection drive circuit SDR and the second scanner circuit SCR arranged along the side 2-R of the display area 2.

In FIGS. 7 and 8, only the drive electrodes TL(0), TL(n), and TL(p) are shown as examples out of the drive electrodes TL(0) to TL(p) arranged between the side 2-U and the side 2-D of the display area 2. Here, the drive electrode TL(p) represents a drive electrode arranged nearest to the end portions nLL, nLR, nVL, and nVR of the signal wirings TPLL, TPLR, TSVL, and TSVR in a plan view; and the drive electrode TL(0) represents a drive electrode arranged farthest from the end portions nLL, nLR, nVL, and nVR in a plan view. In addition, the drive electrode TL(n) represents a drive electrode arranged between the drive electrode TL(0) and the drive electrode TL(p) in a plan view.

In other words, the drive electrode TL(p) can be regarded as an example of a drive electrode arranged in the vicinity of the near end of the end portions nLL, nLR, nVL, and nVR in a plan view, and the drive electrode TL(0) can be regarded as an example of a drive electrode arranged in the vicinity of the far end away from the end portions nLL, nLR, nVL, and nVR in a plan view. In this case, the drive electrode TL(n) can be regarded as an example of a drive electrode arranged near a middle between the drive electrodes TL(p) and TL(0).

Herein, the position of the drive electrode is described by regarding, as references, the end portions nLL, nLR, nVL, and nVR of the signal wirings TPLL, TPLR, TSVL and TSVR arranged as the nearest place to the drive signal circuit 6. But, the end portions nLL, nLR, nVL, and nVR may be regarded as a place where the drive signal circuit 6, for example, the control device 3 or the flexible cable FB2 shown in FIG. 5 is arranged.

As described in FIG. 4, the first selection drive circuit SDL includes the first selection circuit SELL and the first drive circuit DRVL; the first selection circuit SELL is configured by a plurality of first unit selection circuits SEL(0) to SEL(p) respectively corresponding to the drive electrodes TL(0) to TL(p); and the first drive circuit DRVL is configured by a plurality of first unit drive circuits DRL(0) to DRL(p) respectively corresponding to the first unit selection circuits SEL(0) to SEL(p).

Similarly, the second selection circuit SELR constituting the second selection drive circuit SDR is also configured by a plurality of second unit selection circuits SER(0) to SER(p) respectively corresponding to the drive electrodes TL(0) to TL(p). In addition, the second drive circuit DRVR is configured by a plurality of second unit drive circuits DRR(0) to DRR(p) respectively corresponding to the second unit selection circuits SER(0) to SER(p).

FIGS. 7 and 8 show only the first unit selection circuits SEL(0), SEL(n), and SEL(p) and the second unit selection circuit SER(0), SER(n), and SER(p) corresponding to the illustrated drive electrodes TL(0), TL(n) and TL(p) in the first selection circuit SELL and the second selection circuit SELR. Similarly, shown are only the first unit drive circuits DRL(0), DRL(n), and DRL(p) and the second unit drive circuits DRR(0), DRR(n), and DRR(p) corresponding to the drive electrodes TL(0), TL(n) and TL(p) in the first drive circuit DRVL and the second drive circuit DRVR. In addition, FIGS. 7 and 8 show only the first selection signals and the second selection signals corresponding to the drive electrodes TL(0), TL(n) and TL(p) out of the plurality of first selection signals and the plurality of second selection signals outputted from the first scanner circuit SCL and the second scanner circuit SCR.

It should be noted that the drive electrodes TL(0), TL(n), and TL(p) are common in FIGS. 7 and 8. Therefore, if FIG. 8 is arranged on the right side of FIG. 7, the first selection drive circuit SDL, the second selection drive circuit SDR, the first scanner circuit SCL, and the second scanner circuit SCR corresponding to these drive electrodes are completed.

<Operation Summary of Magnetic Field Touch Detection and Electric Field Touch Detection>

Since the configuration of each of the first scanner circuit SCL, the second scanner circuit SCR, and the unit selection circuit is described below with reference to FIGS. 9A to 12, their operation summary will be described here.

At the time of the magnetic field touch detection, the first scanner circuit SCL and the second scanner circuit SCR output a first selection signal and a second selection signal for designating a drive electrode, which generates a magnetic field, from among the drive electrodes TL(0) to TL(p). Although each of the first selection signal and the second selection signal is configured by a plurality of selection signals, FIGS. 7 and 8 illustrates, as the first selection signals, the selection signals AL(0), AL(n), and AL(p) and the selection signals BL(0), BL(n), and BL(p). Similarly, the selection signals AR(0), AR(n), and AR(p) and the selection signals BR(0), BR(n), and BR(p) are illustrated as the second selection signals.

At the time of the magnetic field touch detection, the scanner circuit SCAL constituting the first scanner circuit SCL and the scanner circuit SCBR constituting the second scanner circuit SCR are paired to designate a drive electrode out of the drive electrodes TL(0) to TL(p). Similarly, the scanner circuit SCBL constituting the first scanner circuit SCL and the scanner circuit SCAR constituting the second scanner circuit SCR are paired to designate a drive electrode out of the drive electrodes TL(0) to TL(p). Thus, at the time of the magnetic field touch detection, the plurality of drive electrodes arranged at positions (in areas) different from each other are designated from among the drive electrodes TL(0) to TL(p).

At the time of the magnetic field touch detection, the first unit selection circuit (for example, SEL(n)), to which the first selection signal for designating the drive electrodes is supplied, from among the plurality of first unit selection circuits SEL(0) to SEL(p) outputs a first magnetic field selection signal SG_L(n) and a second magnetic field selection signal SH_L(n) periodically changing in voltage. At this time, voltages of the first magnetic field selection signal SG_L(n) and the second magnetic field selection signal SH_L(n) are changed so that their respective low levels do not overlap temporally.

Similarly, the second unit selection circuit (for example, SER(n)) to which the second selection signal for designating the drive electrodes is supplied from among the plurality of second unit selection circuits SER(0) to SER(p) outputs a first magnetic field selection signal SG_R(n) and a second magnetic field selection signal SH_R(n) periodically changing in voltage. Also in this case, the voltages of the first magnetic field selection signal SG_R(n) and the second magnetic field selection signal SH_R(n) are changed so that their respective low levels do not overlap temporally. In addition, in order that the second magnetic field selection signal SH_R(n) becomes a low level when the first magnetic field selection signal SG_L(n) is at the low level, and in order that the first magnetic field selection signal SG_R(n) becomes a low level when the second magnetic field selection signal SH_L(n) is at the low level, each of the voltages is changed.

The first unit drive circuit DRL(n) corresponding to the first unit selection circuit SEL(n) electrically connects the one end portion n1 of the corresponding drive electrode TL(n) to the signal wiring TPLL since the first magnetic field selection signal SG_L(n) becomes a low level, and electrically connects the one end portion n1 of the drive electrode TL(n) to the signal wiring TSVL since the second magnetic field selection signal SH_L(n) becomes a low level. In addition, the second unit drive circuit DRR(n) corresponding to the second unit selection circuit SER(n) electrically connects the other end portion n2 of the corresponding drive electrode TL(n) to the signal wiring TPLR since the first magnetic field selection signal SG_R(n) becomes a low level, and electrically connects the other end portion n2 of the drive electrode TL(n) to the signal wiring TSVR since the second magnetic field selection signal SH_R(n) becomes a low level.

Thus, when the drive signal TPL is supplied to the one end portion n1 of the drive electrode TL(n), the drive signal TSV is supplied to the other end portion n2. In addition, when the drive signal TSV is supplied to the one end portion n1 of the drive electrode TL(n), the drive signal TPL is supplied to the other end portion n2. As a result, as described with reference to FIGS. 6A and 6B, during the magnetic field generation period, a current whose direction alternately changes flows through the selected drive electrode TL(n), and a magnetic field is generated.

The drive electrode TL(n) has been described as an example. But, when another drive electrode is designated by the first scanner circuit SCL and the second scanner circuit SCR, a magnetic field is similarly generated around the designated drive electrode.

In this embodiment, as described above, at the time of the magnetic field touch detection, the plurality of drive electrodes are designated by the scanner circuits SCAL, SCBR, SCBL, and SCAR. Therefore, a magnetic field is generated around each of the designated plurality of drive electrodes. Thus, as described with reference to FIGS. 6A and 6B, the magnetic fields are superimposed in the area of the drive electrode sandwiched between the plural drive electrodes. In addition, as described in FIGS. 6A and 6B, it is possible to configure the bundle drive electrodes by the plurality of drive electrodes.

At the time of the electric field touch detection, the scanner circuit SCAL and the scanner circuit SCAR are paired, and the drive electrode is designated from among the drive electrodes TL(0) to TL(p) by the first selection signal outputted from the scanner circuit SCAL and the second selection signal outputted from the scanner circuit SCAR. When the drive electrode TL(n) is designated, the first unit selection circuit SEL(n) corresponding to the drive electrode TL(n) outputs a first electric field selection signal MG_L(n) with a high level and a second electric field selection signal MH_L(n) with a low level in response to the first selection signal from the scanner circuit SCAL. In addition, at this time, the first unit selection circuit SEL(n) outputs a first magnetic field selection signal SG_L(n) with a high level and a second magnetic field selection signal SH_L(n) with a low level. Similarly, the second unit selection circuit SER(n) corresponding to the drive electrode TL(n) outputs a first electric field selection signal MG_R(n) with a high level and a second electric field selection signal MH_R(n) with a low level, and outputs a first magnetic field selection signal SG_R(n) with a high level and a second magnetic field selection signal SH_R(n) with a low level in response to the second selection signal from the scanner circuit SCAR.

The first unit drive circuit DRL(n) electrically connects the one end portion n1 of the drive electrode TL(n) to the signal wiring TSVL since the second electric field selection signal MH_L(n) with the low level and the second magnetic field selection signal SH_L(n) at the low level being supplied. Similarly, the second unit drive circuit DRR(n) electrically connects the other end portion n2 of the drive electrode TL(n) to the signal wiring TSVR since the second electric field selection signal MH_R(n) with the low level and the second magnetic field selection signal SH_R(n) with the low level are supplied thereto.

At the time of the electric field touch detection, the voltage of the drive signal TSV supplied to the signal wirings TSVL and TSVR periodically changes. Therefore, voltages at both end portions n1 and n2 of the selected drive electrode TL(n) periodically change according to the drive signal TSV, and the drive electrode TL(n) generates an electric field according to the change in the drive signal TSV.

A case where the drive electrode TL(n) is selected during the electric field touch detection has been described, but the same applies to a case where another drive electrode is selected.

<Configurations of First Unit Drive Circuit and Second Unit Drive Circuit>

Next, the configuration of the first unit drive circuit and the second drive circuit will be described with reference to FIGS. 7 and 8. In this embodiment, although not particularly limited, each of the first unit drive circuit and the second unit drive circuit includes ten switches. In addition, in this embodiment, although not particularly limited, each switch is configured by a P-channel type field-effect transistor (hereinafter also referred to as a "P-type transistor").

The configuration of the first unit drive circuit will be described by taking, as an example, the first unit drive circuit DRL(n) shown in FIG. 7. The first unit drive circuit DRL(n) has: a plurality of (five in this embodiment) P-type transistors whose source/drain paths are connected in parallel between the signal wiring TPLL and the one end portion n1 of the drive electrode TL(n); and a plurality of (five in this embodiment) P-type transistors whose source/drain paths are connected in parallel between the signal wiring TSVL and the one end portion n1 of the drive electrode TL(n).

In this embodiment, the ten P-type transistors are divided into two sets, and controlled. That is, they are divided into an electric field switch set for electrically connecting between the signal wirings TPLL and TSVL and the drive electrode TL(n) only at the time of the electric field touch detection, and a magnetic field switch set for electrically connecting between the signal wirings TPLL and TSVL and the drive electrode TL(n) at the time of the magnetic field touch detection and electric field touch detection. In a case of the first unit drive circuit DRL(n), the P-type transistors constituting the electric field switch set (hereinafter also referred to as "electric field transistors") are denoted by four reference numerals "MGL1", "MGL2", "MHL1", and "MHL2", and the P-type transistors constituting the magnetic field switch set (hereinafter also referred to as "magnetic field transistors") are denoted by six reference numerals "SGL1" to "SGL3" and "SHL1" to "SHL3".

The magnetic field transistors SGL1 to SGL3 are connected between the signal wiring TPLL and the drive electrode TL(n), and the first magnetic field selection signal SG_L(n) is supplied from the corresponding first unit selection circuit SEL(n) to each gate. The magnetic field transistors SHL1 to SHL3 are connected between the signal wiring TSVL and the drive electrode TL(n), and the second magnetic field selection signal SH_L(n) is supplied from the corresponding first unit selection circuit SEL(n) to each gate. On the other hand, the first electric field transistors MGL1 and MGL2 are connected between the signal wiring TPLL and the drive electrode TL(n), and the first electric field selection signal MG_L(n) is supplied from the first unit selection circuit SEL(n) to each gate. In addition, the second electric field transistors MHL1 and MHL2 are connected between the signal wiring TSVL and the drive electrode TL(n), and the second electric field selection signal MH_L(n) is supplied from the first unit selection circuit SEL(n) to each gate.

When the drive electrode TL(n) is designated at the time of the magnetic field touch detection, as described above, the first magnetic field selection signal SG_L(n) and the second magnetic field selection signal SH_L(n) change periodically so as to alternately have values each indicating an on-state of the switch. Thus, the magnetic field transistors SGL1 to SGL3 and the magnetic field transistors SHL1 to SHL3 alternately electrically connect the one end portion n1 of the drive electrodes TL(n) to the signal wirings TPLL and TSVL at timing when each of the transistors is turned on, and the drive signal TPL having the first voltage Vs and the drive signal TSV having the second voltage Vd are alternately supplied. During this interval, the first electric field transistors MGL1 and MGL2 and the second electric field transistors MHL1 and MHL2 become off-states.

On the other hand, when the drive electrode TL(n) is designated at the time of the electric field touch detection, as described above, the second magnetic field selection signal SH_L(n) and the second electric field selection signal MH_L(n) become the low levels. Thus, the two electric field transistors MHL1 and MHL2 and the three magnetic field transistors SHL1 to SHL3 become on-states. As a result, the one end portion n1 of the drive electrode TL(n) is electrically connected to the signal wiring TSVL through each of these five P-type transistors, and at the time of the electric field touch detection, the drive signal TSV with a periodically changing voltage is supplied to the drive electrode TL(n).

Although the first unit drive circuit corresponding to each of the remaining drive electrodes also has ten P-type transistors similarly to the illustrated first unit drive circuit DRL(n), a ratio of the number of the magnetic field transistors constituting the magnetic field switch set to that of the electric field transistors constituting the electric field switch set is varied according to the position of the corresponding drive electrode. That is, in a plan view, from the first unit drive circuit DRL(0) connected to the drive electrode TL(0) arranged farthest from the end portions nLL and nVL to the first unit drive circuit DRL(p) connected to the drive electrode TL(p) arranged nearest to the end portions nLL and nVL, the number of magnetic field transistors constituting the magnetic field switch set constituting the first unit drive circuit decreases and, conversely, the number of electric field transistors constituting the electric field switch set increases. In other words, a first drive electrode (for example, drive electrode TL(P)) and a second drive electrode (for example, drive electrode TL(0)) are included in the drive electrodes, a distance between the first drive electrode and one end of the first signal wirings connected to a drive signal circuit 6 is smaller than a distance between the second drive electrode and the one end of the first signal wirings. The first unit drive circuit connected to the first drive electrode (for example, DRL(p)) includes the first number of magnetic field transistors, and the first unit drive circuit connected to the second drive electrode (for example, DRL(0)) includes the second number of magnetic field transistors larger than the first number of magnetic field transistors. The first unit drive circuit connected to the first drive electrode (for example, DRL(p)) includes the third number of electric field transistors, and the first unit drive circuit connected to the second drive electrode (for example, DRL(0)) includes the forth number of electric field transistors smaller than the third number of electric field transistors.

In FIG. 7, tips of the end portions nVL and nLL of the signal wirings TSVL and TPLL are connected to the drive signal circuit 6 shown in FIG. 4. That is, distances from the end portions nVL and nLL correspond to wiring distances of the signal wirings TSVL and TPLL from the drive signal circuit 6. As the drive electrode has longer wiring distance of the signal wiring between the drive signal circuit 6 and each drive electrode, the number of magnetic field transistors increases. In addition, since the total number of P-type transistors arranged on each drive electrode does not change, the number of electric field transistors becomes relatively small.

The first unit drive circuit DRL(n) connected between the drive electrode TL (n) arranged near a middle and the signal wirings TPLL and TSVL has six magnetic field transistors SGL1 to SGL3 and SHL1 to SHL3 and four electric field transistors MGL1, MGL2, MHL1, and MHL2 as described above. On the other hand, the first unit drive circuit DRL(0) connected between the drive electrode TL(0) arranged at the farthest end and the signal wirings TPLL and TSVL has ten magnetic field transistors SGL1 to SGL5 and SHL1 to SHL5, and zero electric field transistors as shown in FIG. 7. In this case, each of the magnetic field transistors SGL1 to SGL5 is arranged between the one end portion n1 of the drive electrode TL(0) and the signal wiring TPLL so that their source/drain paths are connected parallel to each other. In addition, each of the magnetic field transistors SHL1 to SHL5 is arranged between the one end portion n1 of the drive electrode TL(0) and the signal wiring TSVL so that their source/drain paths are connected parallel to each other. The first magnetic field selection signal SG_L(0) is supplied from the first unit selection circuit SEL(0) to each of the gates of the magnetic field transistors SGL1 to SGL5, and the second magnetic field selection signal SH_L(0) is supplied to each of the gates of the magnetic field transistors SHL1 to SHL5.

In addition, the first unit drive circuit DRL(p) connected between the drive electrode TL(p) arranged at the nearest end and the signal wirings TPLL and TSVL has two magnetic-fields transistors SGL1 and SHL1, and eight electric field transistors MGL1 to MGL4 and MHL1 to MHL4 as shown in FIG. 7. In this case, the source/drain path of the magnetic field transistor SGL1 is connected between the one end portion n1 of the drive electrode TL(p) and the signal wiring TPLL, and the source/drain path of the magnetic field transistor SHL1 is connected between the one end portion n1 of the drive electrode TL(p) and the signal wiring TSVL. In addition, the electric field transistors MGL1 to MGL4 are arranged so that their respective source/drain paths are connected in parallel between the one end portion n1 of the drive electrode TL(p) and the signal wiring TPLL, and the electric field transistors MHL1 to MHL4 are arranged so that their respective source/drain paths are connected in parallel between the one end portion n1 of the drive electrode TL(p) and the signal wiring TSVL.

The first magnetic field selection signal SG_L(p) from the corresponding first unit selection circuit SEL(p) is supplied to the gate of the magnetic field transistor SGL1 in the first unit drive circuit DRVL (p), and the second magnetic field selection signal SH_L(p) is supplied to the gate of the magnetic field transistor SHL1. In addition, the first electric field selection signal MG_L(p) from the corresponding first unit selection circuit SEL(p) is supplied to the gates of the electric field transistors MGL1 to MGL4 in the first unit drive circuit DRVL(p), and the second electric field selection signal MH_L(p) is supplied to the gates of the electric field transistors MHL1 to MHL4.

Although not shown in FIG. 7 in a plan view, the first unit drive circuit corresponding to the drive electrode arranged between the drive electrode TL(n) arranged near the middle and the drive electrode TL(0) arranged at the farthest end (for example, the drive electrode TL(9) in FIG. 6) has the magnetic field transistors within a range of six to ten in number, and the electric field transistors within a range of zero to four. Similarly, the first unit drive circuit corresponding to the drive electrode arranged between the drive electrode TL(n) arranged near the middle and the drive electrode TL(p) arranged at the nearest end (for example, the drive electrode TL(p−9) in FIG. 6) has the magnetic field transistors within a range of two to six, and the electric field transistors within a range of four to eight.

It should be noted that a number ratio between the magnetic field transistors and the electric field transistors may be the same between the plurality of first unit drive circuits connected to the adjacent drive electrodes. In addition, operations of the magnetic field transistors and the electric field transistors at the times of the magnetic field touch detection and the electric field touch detection are the same as the operations of the magnetic field transistors and the electric field transistors in the first unit drive circuit DRL(n) described above.

Although the first unit drive circuits DRL(0) to DRL(p) have been described, the second unit drive circuits DRR(0) to DRR(p) also have the same configuration. That is, each of the second unit drive circuits DRR(0) to DRR(p) also includes ten switches, and the ten switches are divided into a magnetic field switch set and an electric field switch set. In each second unit drive circuit, a ratio of the number of the magnetic field transistors constituting the magnetic field switch set to that of the electric field transistors constituting the electric field switch set is set according to the position of the corresponding drive electrode.

In the example shown in FIG. 8, the second unit drive circuit DRR(n) corresponding to the drive electrode TL(n) has six magnetic field transistors SGR1 to SGR3 and SHR1 to SHR3 and four electric field transistors MGR1, MGR2, MHR1 and MHR2 similarly to the first unit drive circuit DRL(n). Here, the magnetic field transistors SGR1 to SGR3 are arranged between the other end portion n2 of the drive electrode TL(n) and the signal wiring TPLR so that their respective source/drain paths are connected in parallel, and the magnetic field transistors SHR1 to SHR3 are arranged between the other end portion n2 of the drive electrode TL(n) and the signal wiring TSVR so that their respective source/drain paths are connected in parallel. In addition, the electric field transistors MGR1 and MGR2 are arranged between the other end portion n2 of the drive electrode TL(n) and the signal wiring TPLR so that their respective source/drain paths are connected in parallel, and the electric field transistors MHR1 and MHR2 are arranged between the other end portion n2 of the drive electrode TL(n) and the signal wiring TSVR so that their respective source/drain paths are connected in parallel.

The first magnetic field selection signal SG_R(n) is supplied from the corresponding second unit selection circuit SER(n) to the gates of the magnetic field transistors SGR1 to SGR3 in the second unit drive circuit DRR(n), and the second magnetic field selection signal SH_R(n) is supplied to the gates of the magnetic field transistors SHR1 to SHR3. In addition, the first electric field selection signal MG_R(n) is supplied from the second unit selection circuit SER(n) to the gates of the electric field transistors MGR1 and MGR2, and the second electric field selection signal MH_R(n) is supplied to the gates of the electric field transistors MHR1 and MHR2.

The second unit drive circuit DRR(0) corresponding to the drive electrode TL(0) arranged at the farthest end from the drive signal circuit 6 has ten magnetic field transistors SGR1 to SGR5 and SHR1 to SHR5 connected in parallel between the other end portion n2 of the drive electrode TL(0) and the signal wirings TPLR and TSVR similarly to the first unit drive circuit DRL(0). The first magnetic field selection signal SG_R(0) and the second magnetic field selection signal SH_R(0) from the corresponding second unit selection circuit SER(0) are supplied to the gates of these magnetic field transistors.

The second unit drive circuit DRR(p) corresponding to the drive electrode TL(p) arranged at the nearest end from the drive signal circuit 6 has two magnetic field transistors SGR1 and SHR1 and eight electric field transistors MGR1 to MGR4 and MHR1 to MHR4 connected in parallel between the other end portion n2 of the drive electrode TL(p) and the signal wirings TPLR and TSVR similarly to the first unit drive circuit DRL(p). The first magnetic field selection signal SG_R(p) and the second magnetic field selection signal SH_R(p) from the corresponding second unit selection circuit SER(p) are supplied to the gates of these magnetic field transistors. In addition, the first electric field selection signal MG_R(p) and the second electric field selection signal MH_R(p) are supplied from the second unit selection circuit SER(p) to the gates of the electric field transistors MGR1 to MGR4 and MHR1 to MHR4.

The same also applies to the second unit drive circuits corresponding to the remaining drive electrodes, and the number of the magnetic field transistors decreases and the number of the electric field transistors increases from the second unit drive circuit DRR(0) to the second unit drive circuit DRR(p).

The operations of the second unit drive circuits DRR(0) to DRR(p) at the times of the magnetic field touch detection and the electric field touch detection are the same as those of the first unit drive circuits DRL(0) to DRL(p). For example, when the drive electrode TL(n) is designated at the time of the magnetic field touch detection, the second unit selection circuit SER(n) periodically changes the first magnetic field selection signal SG_R(n) and the second magnetic field selection signal SH_R(n). At this time, if the first magnetic field selection signal SG_L(n) (or the second magnetic field selection signal SH_L(n)) with the low level is outputted from the first unit selection circuit SEL(n), the second unit selection circuit SER(n) outputs the second magnetic field selection signal SH_R(n) (or the first magnetic field selection signal SG_R(n)) with the low level. Thus, the other end portion n2 of the drive electrode TL(n) is also electrically connected to the signal wiring TSVR or TPLR through each of the three magnetic field transistors. As a result, a current flows through the drive electrode TL(n), and a magnetic field is generated.

In addition, at the time of the electric field touch detection, since the second unit selection circuit SER(n) makes the second magnetic field selection signal SH_R(n) and the second electric field selection signal MH_R(n) the low levels, the other end portion n2 of the drive electrode TL(n) is electrically connected to the signal wiring TSVR through each of the five P-type transistors. As a result, at the time of the electric field touch detection, the periodically changing drive signal TSV is supplied also to the other end portion n2 of the drive electrode TL(n), and an electric field according to the change in the drive signal TSV is generated.

At the times of the magnetic field touch detection and the electric field touch detection, since the operation of the second unit drive circuit in designating another drive electrode is the same as that of the second unit drive circuit DRR(n) described above, description thereof is omitted.

Thus, by changing the number of magnetic field transistors arranged on each drive electrode, it is possible to improve nonuniformity of an intensity of magnetic field generation in the display area due to a difference in the wiring distances of the signal wirings between the drive signal circuit 6 and the drive electrodes. That is, the number of magnetic field transistors connected in parallel is increased for the drive electrode, to which the drive signal is supplied, in a state of having a long wiring distance from the drive signal circuit 6 and being subjected to a lot of resistance on the signal wirings; the number of magnetic field transistors connected in parallel is decreased for the drive electrode having a short wiring distance from the drive signal circuit 6; and so an intensity of the magnetic field generated around each drive electrode can be made uniform, and sensitivity of the touch detection can be made constant regardless of the distance from the drive signal circuit 6 as a signal supply source. On the other hand, the numbers of the magnetic field transistors and the electric field transistors arranged on each drive electrode are set to the same, and by operating both the magnetic field transistors and the electric field transistors during the electric field generation, the intensity of the electric field generated in each drive electrode can be made uniform.

In the present specification, the signal wiring TSVL may be referred to as the first signal wiring, the signal wiring TPLL may be referred to as the second signal wiring, the signal wiring TSVR may be referred to as the third signal wiring, and the signal wiring TPLR may be referred to as the fourth signal wiring. In addition, the magnetic field transistor and the electric field transistor connected between the one end portion n1 of each drive electrode and the first signal wiring TSVL may also be referred to as first switches, and the magnetic field transistor and the electric field transistor connected between the one end portion n1 of each drive electrode and the second signal wiring TPLL may also be referred to as second switches. Similarly, the magnetic field transistor and the electric field transistor connected between the other end portion n2 of each drive electrode and the third signal wiring TSVR may also be referred to as third switches, and the magnetic field transistor and the electric field transistor connected between the other end portion n2 of each drive electrode and the fourth signal wiring TPLR may also be referred to as fourth switches.

If described by taking the drive electrode TL(n) as an example, the magnetic field transistors SHL1 to SHL3 and the electric field transistors MHL1 and MHL2 are also referred to as first switches, and the magnetic field transistors SGL1 to SGL3 and the electric field transistors MGL1 and MGL2 are also referred to as second switches. In addition, the magnetic field transistors SHR1 to SHR3 and the electric field transistors MHR1 and MHR2 are also referred to as third switches, and the magnetic field transistors SGR1 to SGR3 and the electric field transistors MGR1 and MGR2 are also referred to as fourth switches.

In addition, the electric field transistor may also be referred to as a first connection switch, and the magnetic field transistor may also be referred to as a second connection switch.

<Configurations of First Scanner Circuit and Second Scanner Circuit>

FIGS. 9A and 9B are block diagrams showing the configurations of the first scanner circuit SCL and the second scanner circuit SCR according to the embodiment. FIG. 9A is a block diagram showing the configuration of the scanner circuit SCAL constituting the first scanner circuit SCL, and FIG. 9B is a block diagram showing the configuration of the scanner circuit SCBL constituting the first scanner circuit SCL.

The scanner circuit SCAR constituting the second scanner circuit SCR has the same configuration as the scanner circuit SCAL, and the scanner circuit SCBR constituting the second scanner circuit SCR has the same configuration as the scanner circuit SCBL. In FIG. 9A, reference numerals in parentheses indicate the configuration of the scanner circuit SCAR. Similarly, in FIG. 9B, reference numerals in parentheses indicate the configuration of the scanner circuit SCBR.

Although not particularly limited, the scanner circuit SCAL includes a plurality of shift stages FAL(0) to FAL(p) each having a one-to-one correspondence to the drive electrodes TL(0) to TL(p). Each shift stage is connected in series to constitute a shift register SFAL. A start signal ST-AL is supplied from the control device 3 to the shift stage FAL(0) corresponding to a first stage of the shift register SFAL. Since the shift clock signal CK-AL outputted from the control device 3 varies, each of the shift stages FAL(0) to FAL(p) retrieves and holds the start signal from the preceding stage and supplies it to the logic circuit LG1. Thereby, the start signal ST-AL retrieved in the shift stage FAL(0) sequentially shifts and moves each time the shift clock signal CK-AL varies.

The logic circuit LG1 receives the electric field selection signal MSEL outputted from the control device 3, and the start signal from each shift stage, and forms the first selection signals AL(0), XAL(0), AML(0), XAML(0) to AL(p), XAL(p), AML(p), XAML(p).

Similarly to the scanner circuit SCAL, the scanner circuit SCAR also includes a plurality of shift stages FAR(0) to FAR(p), and a logic circuit LG1. The start signal ST-AR supplied to the shift stage FAR(0) corresponding to a first stage of the shift register SFAR constituted by the shift stages FAR(0) to FAR(p) shifts and moves each time the shift clock signal CK-AR varies. In addition, the logic circuit LG1 in the scanner circuit SCAR also receives the start signal from each shift stage and the electric field selection signal MSEL, and forms the first selection signals AR(0), XAR(0), AMR(0), XAMR(0) to AR(p), XAR(p), AMR(p), XAMR(p).

Similarly to the scanner circuit SCAL, the scanner circuit SCBL includes a plurality of shift stages FBL(0) to FBL(p), and a logic circuit LG2. The shift stages FBL(0) to FBL(p) are connected in series, and constitute a shift register SFBL. A start signal ST-BL is supplied to the shift stage FBL(0) corresponding to a first stage of the shift register SFBL, and since the shift clock signal CK-BL varies, the start signal ST-BL is retrieved in the shift register SFBL, and moves sequentially. The logic circuit LG2 receives a start signal from each of the shift stages FBL(0) to FBL(p), and forms the second selection signals BL(0), XBL(0), BML(0), XBML(0) to BL(p), XBL(p), BML(p), XBML(p).

Similarly to the scanner circuit SCBL, the scanner circuit SCBR includes a plurality of shift stages FBR(0) to FBR(p) constituting the shift register SFBR, and a logic circuit LG2. The start signal ST-BR supplied to the first stage of the shift register SFBR moves each time the shift clock signal CK-BR varies. The logic circuit LG2 receives the start signal from each of the shift stages, and forms the second selection signals BR(0), XBR(0), BMR(0), XBMR(0) to BR(p), XBR(p), BMR(p), XBMR(p).

In this embodiment, the shift clock signals CK-AL, CK-BL, CK-AR, and CK-BR are synchronized with each other, and are set to have the same frequency so that the shift registers SFAL, SFBL, SFAR, and SFBR operate in synchronization with each other. In addition, at the times of the magnetic field touch detection and the electric field touch detection, the high-level start signal is used as selection information for designating the drive electrode, and the low-level start signal is used as non-selection information for designating non-selection of the drive electrode.

For example, when the high-level start signal ST-AL is supplied to the first stage of the shift register SFAL and the shift clock signal CK-AL is changed, the high-level start signal is retrieved in the shift stage FAL(0), and is outputted. Thereby, the selection of the drive electrode TL(0) corresponding to the shift stage FAL(0) is designated. In supplying the high-level start signal ST-AL, then supplying the low-level start signal ST-AL to the shift stage FAL(0), and changing the shift clock signal CK-AL, the high-level start signal previously retrieved is retrieved in the next-stage shift stage FAL(1), and is outputted. Thereby, the selection of the drive electrode TL(1) corresponding to the shift stage FAL(1) is designated. At this time, since the shift stage FAL(0) retrieves and outputs the low-level start signal ST-AL, the drive electrode TL(0) is designated as non-selection. Thus, the high level start signal is supplied to the first stage of the shift register SFAL, and the shift clock signal CK-AL is changed, so that the selection of the drive electrode can be sequentially designated. In addition, the high-level start signal ST-AL is continuously supplied to the first stage of the shift register SFAL, the plurality of adjacent drive electrodes can be designated.

Although the shift register SFAL has been described as an example, the same applies to the shift registers SFBL, SFAR, and SFBR.

As described with reference to FIGS. 7 and 8, at the time of the magnetic field touch detection, the scanner circuits SCAL and SCBR are paired, and the scanner circuits SCBL and SCAR are paired in this embodiment. At the time of the magnetic field touch detection, one or more drive electrodes for generating a magnetic field are designated from the drive electrodes TL(0) to TL(p) by the scanner circuits SCAL and SCBR to be paired, and one or more drive electrodes for generating a magnetic field are designated from the drive electrodes TL(0) to TL(p) by the scanner circuits SCBL and SCAR to be paired. The designation of the drive electrodes by the scanner circuits SCAL, SCBL, SCAR, and SCBR is performed based on the start signals from the shift registers SFAL, SFBL, SFAR, and SFBR.

For example, the high-level start signal ST-AL and the high-level start signal ST-BR are supplied to the shift register SFAL and the shift register SFBR at the same timing. By changing the shift clock signals CK-AL and CK-BR, the high-level start signal moves through the shift registers SFAL and SFBR. At this time, the shift registers SFAL and SFBR designate the same drive electrode. Similarly, the high-level start signal ST-AR and the high-level start signal ST-BL are supplied to the shift register SFAR and the shift register SFBL at the same timing. By changing the shift clock signals CK-AR and CK-BL, the high-level start signal moves through the shift registers SFAR and SFBL. At this time, the shift registers SFAR and SFBL designate the same drive electrode. This allows the paired scanner circuits to designate the same drive electrode.

In addition, the shift clock signals CK-AL, CK-BL, CK-AR, and CK-BR are synchronized to have the same frequency. Therefore, for example, by delaying the timing of supplying the high-level start signals ST-AR and ST-BL to the shift register as compared with the timing of supplying the high-level start signals ST-AL and ST-BR to the shift register, the non-selected drive electrode can be sandwiched between the drive electrode designated by the scanner circuits SCAL and SCBR and the drive electrode designated by the scanner circuits SCAR and SCBL. Thus, as described with reference to FIGS. 6A and 6B, the magnetic fields can be superimposed in the area of the non-selected drive electrode. In addition, in this case, since the high-level start signal is continuously retrieved, a magnetic field can be generated around the bundle drive electrodes as described with reference to FIGS. 6A and 6B.

At the time of the electric field touch detection, unlike the magnetic field touch detection, the scanner circuits SCAL and SCAR are paired to designate the drive electrodes for generating electric fields. In this case, the high-level start signals ST-AL and ST-AR are supplied to the first stages of the shift registers SFAL and SFAR at the same timing. Since the shift clock signals CK-AL and CK-AR are changed, the high-level start signal moves through the shift registers SFAL and SFAR. Thus, at the time of the electric field touch detection, both of the shift registers SFAL and SFAR can designate the same drive electrode, and the scanner circuits SCAL and SCAR can designate the same drive electrode.

Figure 10A:
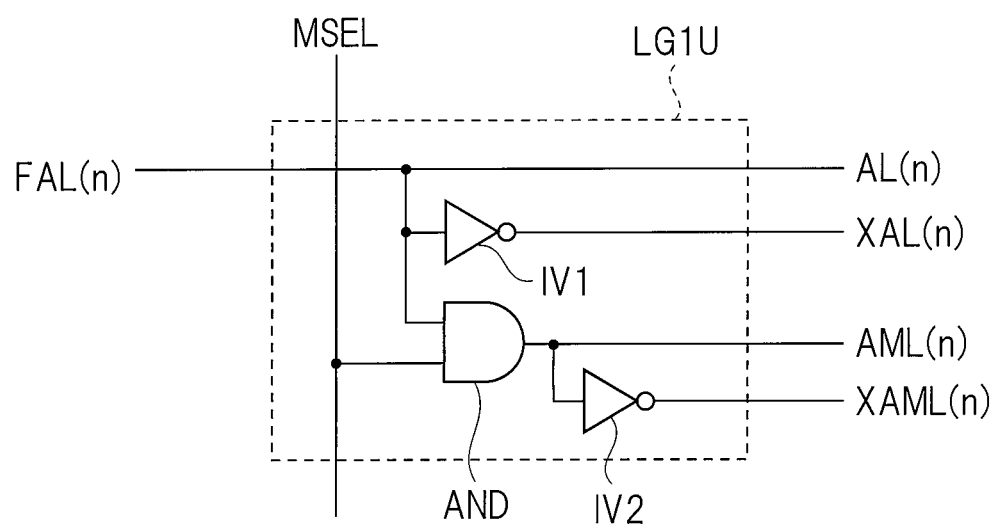
FIG. 10A is a block diagram showing a configuration of a logic circuit included in a scanner circuit according to the embodiment.
Figure 10B:
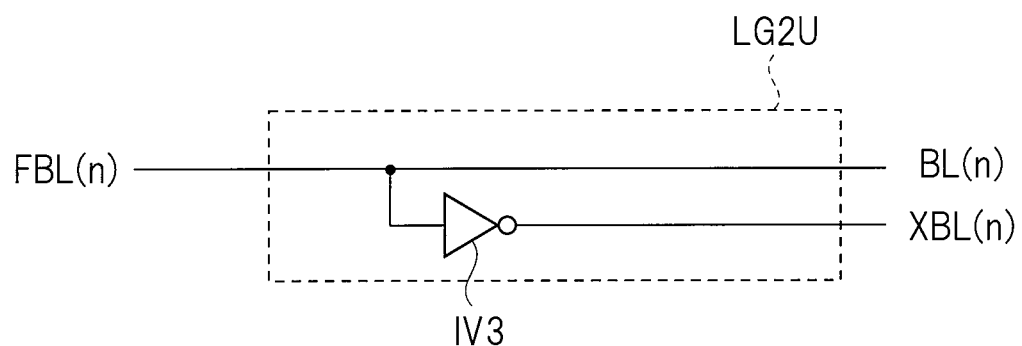
FIG. 10B is a block diagram showing the configuration of a logic circuit included in a scanner circuit according to the embodiment.

FIGS. 10A and 10B are block diagrams showing configurations of logic circuits LG1 and LG2 included in the scanner circuits according to the embodiment. FIG. 10A shows the configuration of the logic circuit LG1, and FIG. 10B shows the configuration of the logic circuit LG2.

The logic circuit LG1 includes a plurality of unit logic circuits LG1U each having a one-to-one correspondence to the shift stages (FAL(0) to FAL(p) and FAR(0) to FAR(p)). Since the configurations of the unit logic circuits LG1U are the same as each other, FIG. 10A shows the configuration of the unit logic circuit LG1U corresponding to the shift stage FAL(n).

The unit logic circuit LG1U includes an AND circuit AND and inverter circuits IV1 and IV2. The start signal from the shift stage FAL(n) is outputted as a first selection signal AL(n). In addition, the first selection signal AL(n) is phase-inverted by the inverter circuit IV1, and is outputted as the first selection signal XAL(n). The first selection signal AL(n) and the electric field selection signal MSEL are inputted into the AND circuit AND, an output of the AND circuit AND is outputted as the first selection signal AML (n), and a signal obtained by phase-inverting the first selection signal AML(n) with the inverter circuit IV2 is outputted as the first selection signal XAML(n).

In the present specification, the phase-inverted signal is distinguished by attaching a symbol "X" to the original signal. In addition, for convenience of description, the first selection signal XAL(n) is also referred to as a first inverted selection signal XAL(n). Similarly, the first selection signal XAML(n) is also referred to as a first inverted selection signal XAML(n).

In this embodiment, the control device 3 makes the electric field selection signal MSEL the high level at the time of the electric field touch detection, and makes the electric field selection signal MSEL the low level at the time of the magnetic field touch detection. At the times of the magnetic field touch detection and the electric field touch detection, when the shift stage FAL(n) of the shift register SFAL outputs a high-level start signal, that is, designates the selection of the drive electrode TL(n), the unit logic circuit LG1U corresponding to the shift stage FAL(n) makes the first selection signal AL(n) the high level, and makes the first inverted selection signal XAL(n) the low level. At this time, if the embodiment is at the electric field touch detection, the AND circuit AND transmits the high-level first selection signal AL(n), so that the first selection signal AML(n) also becomes the high level and the first inverted selection signal XAML(n) becomes the low level. On the other hand, if this time is at the magnetic field touch detection, the first selection signal AML(n) becomes the low level regardless of a logical value of the first selection signal AL(n), and the first inverted selection signal XAML(n) becomes the high level.

In addition, when the shift stage FAL(n) of the shift register SFAL outputs the low-level start signal, that is, designates the non-selection of the drive electrode TL(n), the first selection signals AL(n) and AML(n) become the low levels and the first inverted selection signals XAL(n) and XAML(n) become the high levels.

The logic circuit LG2 also includes a plurality of unit logic circuits LG2U each having a one-to-one correspondence to the shift stages (FBL(0) to FBL(p) and FBR(0) to FBR(p)). Since the configuration of the unit logic circuit LG2U is also the same as each other, FIG. 10B shows the configuration of the unit logic circuit LG2U corresponding to the shift stage FBL(n).

The unit logic circuit LG2U includes an inverter circuit IV3 and outputs, as a first selection signal BL(n), a start signal from the corresponding shift stage FBL(n). In addition, the unit logic circuit LG2U phase-inverts the first selection signal BL(n) with the inverter circuit IV3, and outputs it as the first inverted selection signal XBL(n). Therefore, when a high-level start signal for designating the selection of the drive electrode TL(n) is outputted from the corresponding shift stage FBL(n), the unit logic circuit LG2U outputs the first selection signal BL(n) with the high level and the first inverted selection signal XBL(n) with the low level. On the other hand, when a low-level start signal for designating the non-selection of the drive electrode TL(n) is outputted from the shift stage FBL(n), the unit logic circuit LG2U outputs the first selection signal BL(n) with the low level and the first inverted selection signal XBL(n) with the high level.

As will be described below with reference to FIG. 11, the first selection signal AML(n) and the first inverted selection signal XAML(n) described above are used to form the first electric field selection signal and the second electric field selection signal described above. Therefore, in the following, the first selection signal AML(n) is also referred to as an "electric field selection signal AML(n)", and the first inverted selection signal XAML(n) is also referred to as an "electric field inverted selection signal XAML(n)". In addition, the first selection signal AL(n) and the first inverted selection signal XAL(n) described above are used to form the first magnetic field selection signal and the second magnetic field selection signal described above. Therefore, in the following, the first selection signal AL(n) is also referred to as a "magnetic field selection signal AL(n)", and the first inverted selection signal XAL(n) is also referred to as a "magnetic field inverted selection signal XAL(n)".

<First Selection Circuit and Second Selection Circuit>

Figure 11:
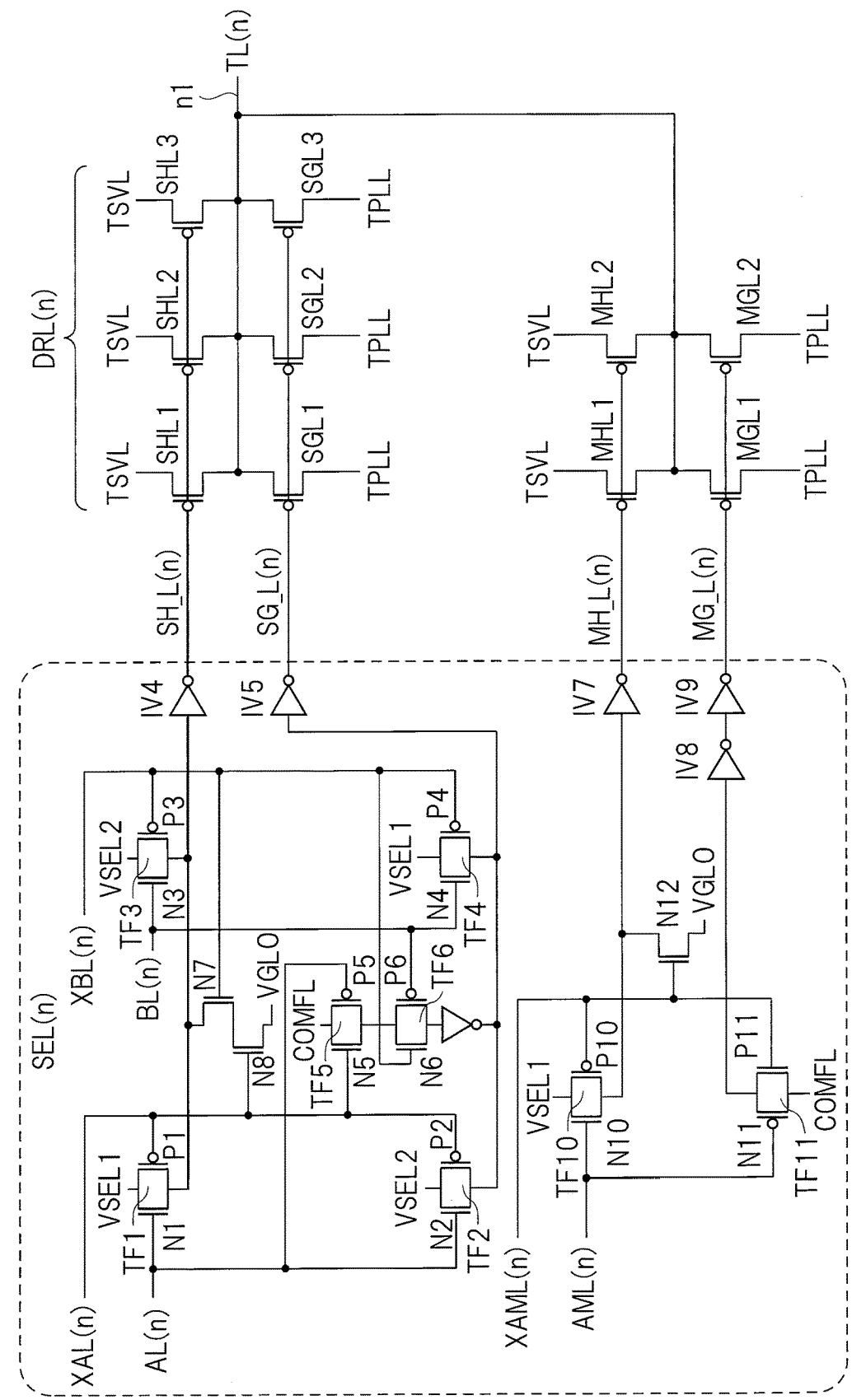
FIG. 11 is a circuit diagram showing a configuration of a first selection circuit according to the embodiment.
Figure 12:
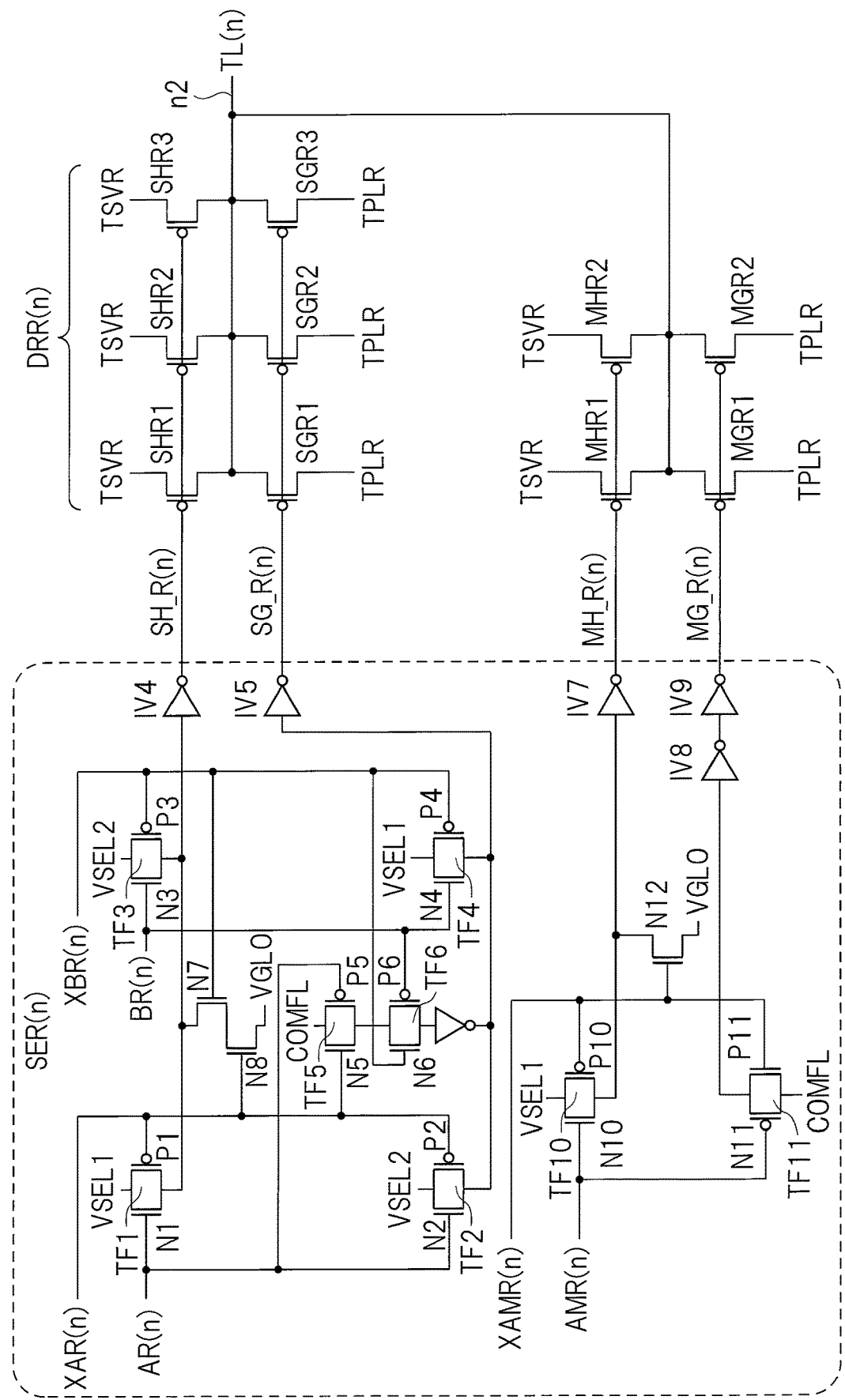
FIG. 12 is a circuit diagram showing a configuration of a second selection circuit according to the embodiment.

FIGS. 11 and 12 are circuit diagrams showing the configurations of the first selection circuit SELL and the second selection circuit SELR according to the embodiment. As already described, the first selection circuit SELL includes a plurality of first unit selection circuits SEL(0) to SEL(p), and the second selection circuit SELR includes a plurality of second unit selection circuits SER(0) to SER(p).

The first unit selection circuits SEL(0) to SEL(p) correspond to the shift stages FAL(0) to FAL(p) shown in FIG. 9A and the shift stages FBL(0) to FBL(p) shown in FIG. 9B. For example, the first unit selection circuit SEL(n) corresponds to the shift stage FAL(n) and the shift stage FBL(n), is connected to the shift stage FAL(n) through the unit logic circuit LG1U corresponding to the shift stage FAL(n), and is further connected to the shift stage FBL(n) through the unit logic circuit LG2U corresponding to the shift stage FBL(n). In addition, the second unit selection circuits SER(0) to SER(p) correspond to the shift stages FAR(0) to FAR(p) shown in FIG. 9A and the shift stages FBR(0) to FBR(p) shown in FIG. 9B. If a description will be made by taking the second unit selection circuit SER(n) as an example, the second unit selection circuit SER(n) corresponds to the shift stage FAR(n) and the shift stage FBR(n), is connected to the shift stage FAR(n) through the unit logic circuit LG1U corresponding to the shift stage FAR(n), and is further connected to the shift stage FBR(n) through the unit logic circuit LG2U corresponding to the shift stage FBR(n). The remaining first unit selection circuits and second unit selection circuits are also similarly connected to the corresponding shift stages through the unit logic circuits LG1U and LG2U.

Since the plurality of first unit selection circuits have mutually the same configuration, the configuration of the first unit selection circuit SEL(n) corresponding to the drive electrode TL(n) is shown in FIG. 11. In addition, since the plurality of second unit selection circuits have mutually the same configuration, the configuration of the second unit selection circuit SER(n) corresponding to the drive electrode TL(n) is shown in FIG. 12. In addition, for convenience of description, the configuration of the first unit drive circuit DRL(n) corresponding to the first unit selection circuit SEL(n) is also shown in FIG. 11, and the configuration of the second unit drive circuit DRR(n) corresponding to the second unit selection circuit SER(n) is also shown in FIG. 12.

Next, the configuration of the first unit selection circuit will be described by using the first unit selection circuit SEL(n) shown in FIG. 11 as an example. Incidentally, since the first unit drive circuit DRL(n) is described in FIG. 7, a detailed description thereof will be omitted.

Although not particularly limited, the first unit selection circuit SEL(n) includes: a magnetic-field-selection signal forming section for forming the first magnetic field selection signal SG_L(n) and the second magnetic field selection signal SH_L(n); and an electric-field-selection signal forming section for forming the first electric field selection signal MG_L(n) and the second electric field selection signal MH_L(n). Here, the magnetic-field-selection signal forming section forms the first magnetic field selection signal SG_L(n) and the second magnetic field selection signal SH_L(n) based on the magnetic field selection signal AL(n) and the inverted magnetic field selection signal XAL(n) outputted from the unit logic circuit LG1U corresponding to the shift stage FAL(n) and on the magnetic field selection signal BL(n) and the inverted magnetic field selection signal XBL(n) outputted from the unit logic circuit LG2U corresponding to the shift stage FBL(n). On the other hand, the electric-field-selection signal forming section forms the first electric field selection signal MG_L(n) and the second electric field selection signal MH_L(n) based on the electric field selection signal AML(n) and the inverted electric field selection signal XAML(n) outputted from the unit logic circuit LG1U corresponding to the shift stage FAL(n).

The magnetic-field-selection signal forming section described above has N-channel field effect transistors (hereinafter also referred to as "N-type transistors") N1 to N8, P-type transistors P1 to P6, and inverter circuits IV4 to IV6. In addition, the electric-field-selection signal forming section has N-type transistors N10 to N12, P-type transistors P10 and P11, and inverter circuits IV7 to IV9.

First, the magnetic-field-selection signal forming section will be described. The N-type transistor N1 and the P-type transistor P1 are connected in parallel so that their respective source/drain paths are in parallel with each other, and thereby constitute a transfer switch TF1. Similarly to the N-type transistor N1 and the P-type transistor P1, the N-type transistors N2 to N6 and the P-type transistors P2 to P6 are also connected in parallel so that their respective source/drain paths are in parallel with each other, and thereby constitute transfer switches TF2 to TF6.

The magnetic field selection signal AL(n) is supplied to gates of the N-type transistors N1 and N2 constituting the transfer switches TF1 and TF2, and the inverted magnetic field selection signal XAL(n) is supplied to gates of the P-type transistors P1 and P2. In addition, the magnetic field selection signal BL(n) is supplied to gates of the N-type transistors N3 and N4 constituting the transfer switches TF3 and TF4, and the inverted magnetic field selection signal XBL(n) is supplied to gates of the P-type transistors P3 and P4.

An output of the transfer switch TF1 and an output of the transfer switch TF3 are connected in common to an input of the inverter circuit IV4, the state selection signal VSEL1 formed by the control device 3 is supplied to the input of the transfer switch TF1, and the state selection signal VSEL2 formed by the control device 3 is supplied to an input of the transfer switch TF2. In this embodiment, the control device 3 periodically changes voltages of the state selection signals VSEL1 and VSEL2 at the time of the magnetic field touch detection. In this case, the voltages of the state selection signals VSEL1 and VSEL2 are changed so as to be complementary. That is, when the state selection signal VSEL1 is at a high level (or low level), the state selection signal VSEL2 is changed so as to be at a low level (or high level).

At the time of the magnetic field touch detection, when the selection of the drive electrode TL(n) is designated, the magnetic field selection signal AL(n) or BL(n) becomes the high level. Therefore, at the time of the magnetic field touch detection, when the drive electrode TL(n) is designated, the transfer switch TF1 or TF3 becomes an on-state, and the state selection signal VSEL1 or VSEL2 is supplied to the inverter circuit IV4. The output of the inverter circuit IV4 becomes the second magnetic field selection signal SH_L(n). Therefore, at the time of the magnetic field touch detection, when the drive electrode TL(n) is designated, a signal formed by inverting a voltage change in the state selection signal VSEL1 or VSEL2 with the inverter circuit IV4 is outputted as the second magnetic field selection signal SH_L(n).

In addition, the output of the transfer switch TF2 and the output of the transfer switch TF4 are connected in common to an input of the inverter circuit IV5. In addition, the state selection signal VSEL2 is supplied to the input of the transfer switch TF2, and the state selection signal VSEL1 is supplied to the input of the transfer switch TF4. At the time of the magnetic field touch detection, when the selection of the drive electrode TL(n) is designated, the transfer switch TF2 or TF4 become an on-state. Therefore, the state selection signal VSEL2 or VSEL1 is supplied to an input of the inverter circuit IV5. The supplied state selection signal VSEL2 or VSEL1 is inverted by the inverter circuit IV5, and the signal obtained by the inversion is outputted from the inverter circuit IV5 as the first magnetic field selection signal SG_L(n).

That is, at the time of the magnetic field touch detection, when the selection of the drive electrode TL(n) is designated by the scanner circuit SCAL, a signal obtained by inverting the state selection signal VSEL1 is outputted as the second magnetic field selection signal SH_L(n), and a signal obtained by inverting the state selection signal VSEL2 is outputted as the first magnetic field selection signal SG_L(n). On the other hand, at the time of the magnetic field touch detection, when the selection of the drive electrode TL(n) is designated by the scanner circuit SCBL, a signal obtained by inverting the state selection signal VSEL2 is outputted as the second magnetic field selection signal SH_L(n), and a signal obtained by inverting the state selection signal VSEL1 is outputted as the first magnetic field selection signal SG_L(n).

Since the voltages of the state selection signals VSEL1 and VSEL2 change complementarily, the magnetic field transistors SHL1 to SHL3 and the magnetic field transistors SGL1 to SGL2 become alternately on-states (conduction state). As a result, the drive electrode TL(n) is electrically connected to the signal wiring TSVL or TPLL through the magnetic field transistors SHL1 to SHL3 or the magnetic field transistors SGL1 to SGL3.

The N-type transistors N7 and N8 are connected so that the respective source/drain paths are in series between the input of the inverter circuit IV4 and a predetermined voltage VGLO. Here, the predetermined voltage VGLO is a voltage corresponding to a low level of the logical value. In addition, the inverted magnetic field selection signal XAL(n) is supplied to the gate of the N-type transistor N7, and the inverted magnetic field selection signal XBL(n) is supplied to the gate of the N-type transistor N8. When the scanner circuits SCAL and SCBL designate the non-selection of the drive electrode TL(n), the magnetic field selection signals AL(n) and BL(n) become the low levels. In other words, the inverted magnetic field selection signals XAL(n) and XBL(n) become the high levels. Therefore, at the time of the magnetic field touch detection, when the non-selection of the drive electrode TL(n) is designated, the N-type transistors N7 and N8 become on-states. Thus, the predetermined voltage VGLO corresponding to the low level is supplied to the input of the inverter circuit IV4, and the second magnetic field selection signal SH_L(n) becomes the high level. As a result, the magnetic field transistors SHL1 to SHL3 become off-states when the drive electrode TL(n) is not selected.

A control signal COMFL is supplied to the input of the transfer switch TF5; the output of the transfer switch TF5 is connected to the input of the transfer switch TF6; and the output of the transfer switch TF6 is connected to the input of the inverter circuit IV6. In addition, the output of the inverter circuit IV6 is connected to the input of the inverter circuit IV5.

The control device 3 makes the control signal COMFL the high level at the time of the magnetic field touch detection, and makes the control signal COMFL the low level at the times of the display and the electric field touch detection. The inverted magnetic field selection signal XAL(n) is supplied to the gate of the N-type transistor N5 constituting the transfer switch TF5, and the magnetic field selection signal AL(n) is supplied to the gate of the P-type transistor P5. In addition, the inverted magnetic field selection signal XBL(n) is supplied to the gate of the N-type transistor N6 constituting the transfer switch TF6, and the magnetic field selection signal BL(n) is supplied to the gate of the P-type transistor P6.

Therefore, the transfer switch TF5 becomes an on-state when the scanner circuit SCAL designates the non-selection of the drive electrode TL(n). In addition, the transfer switch TF6 becomes an on-state when the scanner circuit SCBL designates the non-selection of the drive electrode TL(n). As a result, at the time of the magnetic field touch detection, when the non-selection of the drive electrode TL(n) is designated, the control signal COMFL is supplied to the input of the inverter circuit IV6 through the transfer switches TF5 and TF6. At the time of the magnetic field touch detection, since the control signal COMFL becomes the high level, the inverter circuit IV6 outputs the low level, and the inverter circuit IV5 outputs the first magnetic field selection signal SG_L(n) with the high level. Thus, at the time of the magnetic field touch detection, when the non-selection of the drive electrode TL(n) is designated, the magnetic field transistors SGL1 to SGL3 also become off-states.

Next, the electric-field-selection signal forming section will be described. Similarly to the N-type transistor N1 and the P-type transistor P1, the N-type transistors N10 and N11 and the P-type transistors P10 and P11 are connected in parallel so that their respective source/drain paths are in parallel with each other, and thereby constitute the transfer switches TF10 and TF11. The electric field selection signal AML(n) is supplied to the gate of the N-type transistor N10 constituting the transfer switch TF10, and the inverted electric field selection signal XAML(n) is supplied to the gate of the P-type transistor P10. In addition, the inverted electric field selection signal XAML(n) is supplied to the gate of the N-type transistor N11 constituting the transfer switch TF11, and the electric field selection signal AML(n) is supplied to the gate of the P-type transistor P11.

The state selection signal VSEL1 is supplied to the input of the transfer switch TF10, and its output is connected to the input of the inverter circuit IN7. The N-type transistor N12 is connected between the input of the inverter circuit IV7 and the predetermined voltage VGLO so that its source/drain path is in series, and the inverted electric field selection signal XAML(n) is supplied to the gate of the N-type transistor N12. The output of the inverter circuit IV7 is supplied, as the second electric field selection signal MH_L(n), to the gates of the electric field transistors MHL1 and MHL2.

The control signal COMFL is supplied to the input of the transfer switch TF11, and its output is connected to the input of the inverter circuit IV8 as the first stage of the inverter circuits IV8 and IV9 connected in series. The output from the inverter circuit IV9 as the last stage of the inverter circuits connected in series is supplied, as the first electric field selection signal MG_L(n), to the gates of the electric field transistors MGL1 and MGL2.

At the time of the magnetic field touch detection, since the electric field selection signal MSEL becomes the low level as described in FIGS. 10A and 10B, the electric field selection signal AML(n) becomes the low level, and the inverted electric field selection signal XAML(n) becomes the high level. Thus, the transfer switch TF10 becomes an off-state, and the N-type transistor N12 becomes an on-state. As a result, the predetermined voltage VGLO corresponding to the low level of the logical value is supplied to the input of the inverter circuit IV7 through the N-type transistor N12, the inverter circuit IV7 outputs the second electric field selection signal MH_(n) with the high level, and the electric field transistors MHL1 and MHL2 become off-states. At this time, the transfer switch TF11 becomes an on-state, and the high-level control signal COMFL is supplied to the input of the inverter circuit IV8 through the transfer switch TF11. As a result, the inverter circuit IV9 outputs the first electric field selection signal MG_L(n) with the high level, and the electric field transistors MGL1 and MGL2 become off-states.

That is, at the time of the magnetic field touch detection, regardless of selection and non-selection instructions, both of the first electric field selection signal MG_L(n) and the second electric field selection signal MH_L(n) become the high levels, and the electric field transistors MGL1, MGL2, MHL1, and MHL2 become off-states.

As already described in the electric field touch detection, the drive electrode is designated by the scan electrodes SCAL and SCAR. At the time of the electric field touch detection, when the selection of the drive electrode TL(n) is designated by the scanner circuit SCAL, not only the magnetic field selection signal AL(n) but also the electric field selection signal AML(n) becomes the high level as can be understood from FIGS. 10A and 10B. The electric field selection signal AML(n) becomes the high level, and so the transfer switch TF10 becomes the on-state, and the state selection signal VSEL1 is supplied to the input of the inverter circuit IV7 through the transfer switch TF10.

The control device 3 periodically changes the state selection signals VSEL1 and VSEL2 at the time of the magnetic field touch detection, but makes the state selection signal VSEL2 the first voltage Vs (corresponding to the low level of the logical value) such as the ground voltage, and makes the state selection signal VSEL1 a second voltage Vd (corresponding to the high level of the logical value) whose absolute value is larger than that of the first voltage Vs at the time of the electric field touch detection. In addition, as described above, the control device 3 periodically changes the voltage of the drive signal TSV at the time of the electric field touch detection.

As a result, at the time of the electric field touch detection, the state selection signal VSEL1 with the high level is supplied to the gates of the electric field transistors MHL1 and MHL2, and the drive electrode TL(n) is electrically connected to the signal wiring TSVL through the electric field transistors MHL1 and MHL2.

In addition, at the time of the electric field touch detection, when the scanner circuit SCAL designates the selection of the drive electrode TL(n), the magnetic field selection signal AL(n) also becomes the high level as described above. As a result, the above-described transfer switches TF1 and TF2 also become the on-states. In this case, since the state selection signal VSEL2 having the first voltage Vs corresponding to the low level is supplied to the input of the inverter circuit IV5 through the transfer switch TF2, the first magnetic field selection signal SG_L(n) becomes the high level, and the magnetic field transistors SGL1 to SGL3 become the off-states. On the other hand, since the state selection signal VSEL1 having the second voltage Vd corresponding to the high level is supplied to the input of the inverter circuit IV4 through the transfer switch TF1, the second magnetic field selection signal SH_L(n) becomes the low level. As a result, the magnetic field transistors SHL1 to SHL3 connected between the signal wiring TSVL and the drive electrode TL(n) become the on-states, and the signal wiring TSVL and the drive electrode TL(n) are electrically connected also by the magnetic field transistors SHL1 to SHL3.

Thus, in the electric field touch detection, both of the magnetic field transistor and the electric field transistor connected between the selected drive electrode TL(n) and the signal wiring TSVL for supplying the drive signal TSV become the on-states, and are electrically connected.

Incidentally, at the time of the electric field touch detection, when the non-selection of the drive electrode TL(n) is designated, the transfer switch TF11 becomes the on-state, and the control signal COMFL with the low level is supplied to the input of the inverter circuit IV8 through the transfer switch TF11. Thus, the first electric field selection signal MG_L(n) becomes the low level, the electric field transistors MGL1 and MGL2 become the on-states, and the drive electrode TL(n) is electrically connected to the signal wiring TPLL to which the predetermined first voltage Vs is supplied. In addition, at this time, the magnetic field selection signal BL(n) also becomes the low level, so that the transfer switches TF5 and TF6 become the on-states, the magnetic field transistors SGL1 to SGL3 connected between the signal wiring TPLL and the drive electrode TL(n) can be made the on-states, and the drive electrode TL(n) can be electrically connected to the signal wiring TPLL also by these magnetic field transistors.

In this way, at the time of the electric field touch detection, since the drive electrode to be non-selected is connected to the predetermined first voltage Vs, occurrence of noises can be reduced.

In addition, at the time of the magnetic field touch detection, the magnetic field transistors SHL1 to SHL3 and SGL1 to SGL3, and the electric field transistors MHL1, MHL2, MGL1, and MGL2 connected to the drive electrode to be non-selected become the off-states as described above. Therefore, at the time of the magnetic field touch detection, the drive electrode to be non-selected can be made a floating state, and so parasitic capacitance that is charged and discharges can be reduced.

The second unit selection circuit SER(n) shown in FIG. 12 is similar to the first unit selection circuit SEL(n) shown in FIG. 11. A difference therebetween is that the magnetic field selection signal AR(n), the inverted magnetic field selection signal XAR(n), the electric field selection signal AMR(n), and the inverted electric field selection signal XAMT(n) are supplied from the scanner circuit SCAR instead of the scanner circuit SCAL, and that the magnetic field selection signal BR(n) and the inverted magnetic field selection signal XBR(n) are supplied from the scanner circuit SCBR instead of the scanner circuit SCBL. In addition, the second unit selection circuit SER(n) forms the first magnetic field selection signal SG_R(n) instead of the first magnetic field selection signal SG_L(n) and forms the second magnetic field selection signal SH_R(n) instead of the second magnetic field selection signal SH_L(n). Furthermore, the second unit selection circuit SER(n) forms the first electric field selection signal MG_R(n) instead of the first electric field selection signal MG_L(n) and forms the second electric field selection signal MH_R(n) instead of the second electric field selection signal MH_L(n). Since an operation of the second unit selection circuit SER(n) is the same as the operation of the first unit selection circuit SEL(n), description thereof will be omitted.

For example, at the time of the magnetic field touch detection, when the drive electrode TL(n) is designated by the scanner circuit SCAL and the scanner circuit SCBR, the transfer switches TF1 and TF2 shown in FIG. 11 become the on-states, and the transfer switches TF3 and TF4 shown in FIG. 12 become the on-states. At this time, if the state selection signal VSEL1 is at the high level, the magnetic field transistors SHL1 to SHL3 connected between the one end portion n1 of the drive electrode TL(n) and the signal wiring TSVL become the on-states, and the magnetic field transistors SGR1 to SGR3 connected between the other end portion n2 of the drive electrode TL(n) and the signal wiring TPLR become the on-states. Thus, a current in a direction from the one end portion n1 to the other end portion n2 flows, and a magnetic field is generated. On the other hand, if the state selection signal VSEL2 becomes the high level, the magnetic field transistors SGL1 to SGL3 connected between the one end portion n1 of the drive electrode TL(n) and the signal wiring TPLL become the on-states, and the magnetic field transistors SHR1 to SHR3 connected between the other end portion n2 of the drive electrode TL(n) and the signal wiring TSVR become the on-states. Thus, a current in the direction from the other end portion n2 to the one end portion n1 flows, and a magnetic field is generated.

In addition, at the time of the electric field touch detection, the magnetic field transistors SHL1 to SHL3 and the electric field transistors MHL1 and MHL2 connected between the one end portion n1 of the drive electrode TL(n) and the signal wiring TSVL become the on-states. At this time, the magnetic field transistors SHR1 to SHR3 and the electric field transistors MHR1 and MHR2 connected between the other end portion n2 of the drive electrode TL(n) and the signal wiring TSVR become the on-states. Thus, the electric field generated by the drive electrode TL(n) changes according to the change in the drive signal TSV supplied to the signal wirings TSVL and TSVR.

At the time of the display, the magnetic field selection signal and the electric field selection signal outputted from each of the scanner circuits SCAL, SCBL, SCAR, and SCBR are set to become the low levels. Thus, the inverted magnetic field selection signal and the inverted electric field selection signal become the high levels. In addition, the control signal COMFL is set to the low level at the time of the display as described above. Thus, the magnetic field transistor and the electric field transistor connected between the drive electrode and the signal wirings TPLL and TPLR become the on-states, and the drive electrode and the signal wirings TPLL and TPLR are electrically connected. At this time, by the control device 3, the drive signal TPL supplied to the signal wirings TPLL and TPLR is set to a drive signal for display. Thus, a voltage suitable for display can be supplied to each of the drive electrodes TL(0) to TL(p).

Incidentally, as such a configuration that the magnetic field selection signal and the electric field selection signal outputted from each of the scanner circuits SCAL, SCBL, SCAR, and SCBR are set to the low level at the time of display, for example, the scanner circuit may be controlled only by the synchronization signal TSHD (FIG. 4). Needless to say, the embodiment is not limited to this configuration.

<Operation of Display Device 1>
<Magnetic Field Touch Detection and Display>

Figure 13:
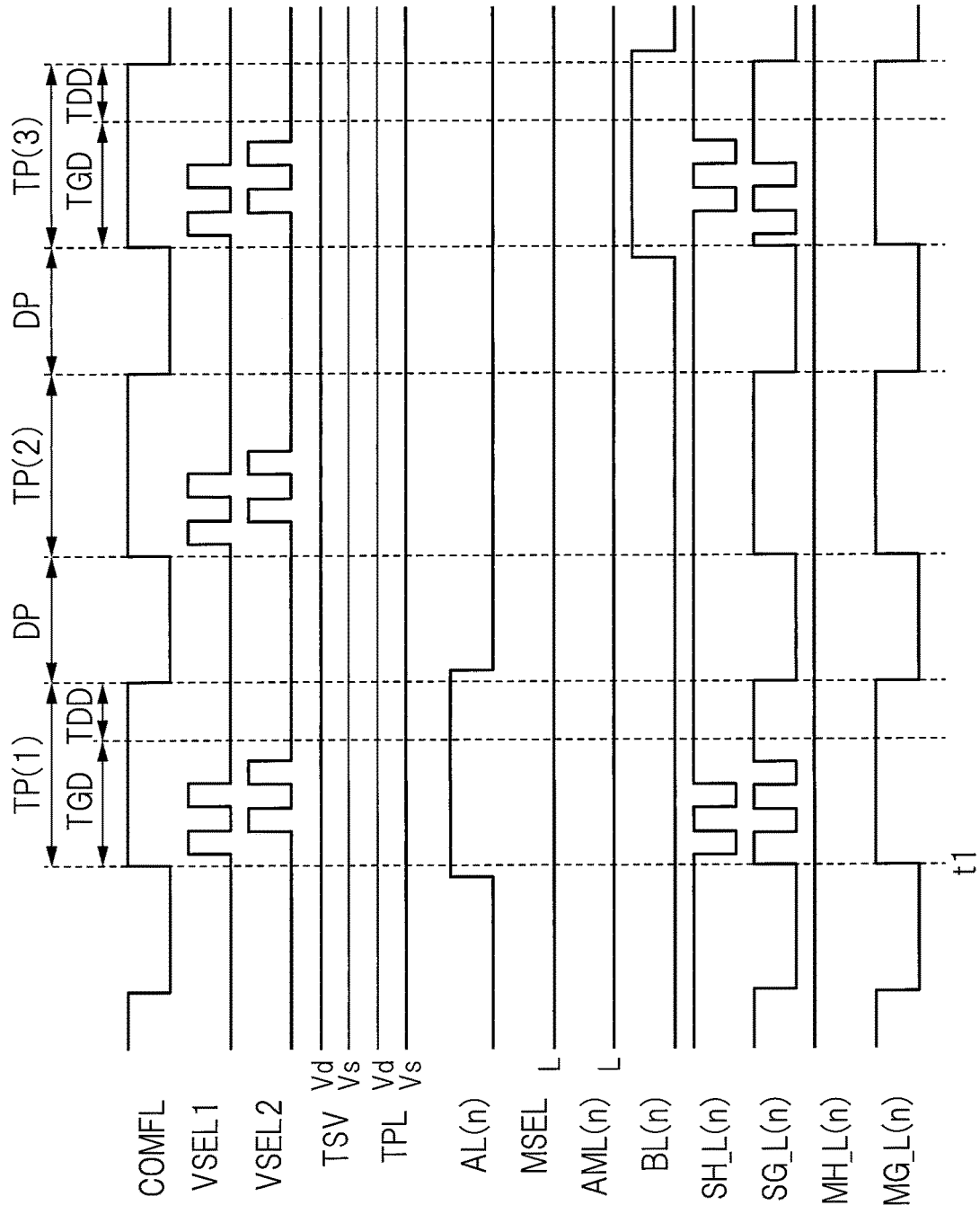
FIG. 13 is a waveform diagram showing the operation of the display device according to the embodiment.

FIG. 13 is a waveform diagram showing the operation of the display device 1 according to the embodiment. In the Figure, a waveform diagram when the display and the magnetic field touch detection are alternately performed is shown. In FIG. 13, "TP(1)" to "TP(3)" each denote a period of the magnetic field touch detection, and "DP" denotes a period of the display. Here, shown is a case where the scanner circuit SCAL indicates the drive electrode TL(n) in the magnetic field touch detection period TP(1) and the scanner circuit SCBL indicates the drive electrode TL(n) in the magnetic field touch detection period TP(3). In the magnetic field touch detection periods TP(1) and TP(3), "TGD" denotes a magnetic field generation period, and "TDD" denotes a magnetic field detection period.

At a time t1, the control device 3 changes the control signal COMFL to the high level, and starts the magnetic field touch detection period TP(1). In addition, in the magnetic field generation period TGD, the control device 3 periodically changes the state selection signals VSEL1 and VSEL2. In this case, the state selection signals VSEL1 and VSEL2 are changed so that their high levels do not overlap with each other. Furthermore, the drive signal circuit 6 in the control device 3 forms the drive signal TSV having the second voltage Vd, and the drive signal TPL having the first voltage Vs, and supplies them to the respective end portions nVL, nVR, nLL, and nLR (FIGS. 7 and 8) of the signal wirings TSVL, TSVR, TPLL, and TPLR, and the control device 3 outputs the electric field selection signal MSEL with the low level L.

The shift stage FAL(n) of the scanner circuit SCAL outputs a high-level start signal, and so the magnetic field selection signal AL(n) changes from the low level to the high level. At this time, the scanner circuit SCBL outputs the magnetic field selection signal BL(n) with the low level. In addition, since the electric field selection signal MSEL is at the low level, the electric field selection signal AML(n) becomes the low level.

In the magnetic field generation period TGD, since the state selection signal VSEL1 changes to the high level, the second magnetic field selection signal SH_L(n) changes to the low level, and since the state selection signal VSEL2 changes to the high level, the first magnetic field selection signal SG_L(n) changes to the low level. Thus, as described above, the magnetic field transistors SHL1 to SHL3 and the magnetic field transistors SGR1 to SGR3 alternately become the on-states. As a result, the drive electrode TLL(n) is alternately electrically connected to the signal wirings TSVL and TPLL. Thus, a current whose direction changes alternately flows through the drive electrode TL(n), and a magnetic field is generated.

In the magnetic field touch detection period TP(1), since the electric field selection signal MSEL is at the low level L, the inverted electric field selection signal XAML(n) becomes the high level, and since the control signal COMFL is at the high level, both of the first electric field selection signal MG_L(n) and the second electric field selection signal MH_L(n) become the high levels as described with reference to FIG. 11. Thus, the electric field transistors MGL1, MGL2, MHL1, and MHL2 shown in FIG. 11 become the off-states.

Thus, in the magnetic field generation period TGD of the magnetic field touch detection period TP(1), the drive electrode TL(n) is electrically connected to the signal wiring TSVL or TPLL by the three magnetic field transistors, and generates a magnetic field.

In the magnetic field detection period TDD of the magnetic field touch detection period TP(1), as described with reference to FIGS. 2A to 2C, the magnetic field around the pen Pen is detected by the detection electrode.

In the display period DP, by the control device 3, the control signal COMFL, the state selection signals VSEL1 and VSEL2, and the electric field selection signal MSEL are set to the low levels, and the drive signal TPL is set to a voltage (the first voltage Vs in the Figure) suitable for the display. In the display period DP, since the scanner circuits SCAL, SCBL, SCAR, and SCBR do not designate the selection of the drive electrode, the magnetic field selection signals AL(n) and BL(n) become the low levels. In addition, since the electric field selection signal MSEL becomes the low level, the electric field selection signal AML(n) also becomes the low level.

Thus, the transfer switches TF5, TF6, and TF11 shown in FIGS. 11 and 12 become the on-states, the first magnetic field selection signal SG_L(n) and the first electric field selection signal MG_L(n) become the low levels, and the magnetic field transistor and the electric field transistor connected between the drive electrode TL(n) and the signal wirings TPLL and TPLR become the on-states. As a result, the drive electrode TL(n) is electrically connected to the signal wirings TPLL and TPLR, and the drive signal TPL suitable for the display is supplied thereto. In the display period, an image signal is supplied from a signal line to a pixel electrode having a pixel(s), and a display according to a voltage difference between the voltage of the drive signal TPL supplied to the drive electrode and the image signal supplied to the pixel electrode is performed.

In the next magnetic field touch detection period TP(2), another drive electrode (for example, TL(n+1)) generates a magnetic field, and the pen Pen is detected. In this magnetic field touch detection period TP(2), since the scanner circuits SCAL and SCBL do not designate the selection of the drive electrode TL(n), the magnetic field selection signals AL(n) and BL(n) become the low levels, and the inverted magnetic field selection signals XAL(n) and XBL(n) (not shown) become the high levels. Thus, the N-type transistors N7, N8, and N12 and the transfer switches TF5, TF6, and TF11 shown in FIGS. 11 and 12 become the on-states. At this time, since the predetermined voltage VGLO is the voltage (for example, the first voltage Vs) corresponding to the low level of the logical value and the control signal COMFL is at the high level, the first magnetic field selection signal SG_L(n), the second magnetic field selection signal SH_L(n), the first electric field selection signal MG_L(n), and the second electric field selection signal MH_L(n) become the high levels, and the drive electrode TL(n) is isolated from the signal wirings TPLL, TPLR, TSVL, and TSVR and becomes a floating state.

When the operation of the display device 1 reaches the magnetic field touch detection period TP(3) after the display period DP subsequent to the magnetic field touch detection period TP(2), the scanner circuit SCBL designates the selection of the drive electrode TL(n). That is, the magnetic field selection signal BL(n) becomes the high level, and the magnetic field selection signal AL(n) keeps the low level state. Thus, in the magnetic field generation period TGD, the transfer switches TF3 and TF4 become the on-states instead of the transfer switches TF1 and TF2 shown in FIG. 11; the second magnetic field selection signal SH_L(n) and the first magnetic field selection signal SG_L(n) change according to the state selection signals VSEL2 and VSEL1; the magnetic field transistors SHL1 to SHL3 and the magnetic field transistors SGL1 to SGL3 alternately become the on-states; and the drive electrode TL(n) is alternately electrically connected to the signal wirings TSVL and TPLL. Since other operations are the same as those in the magnetic field touch detection period TP(1), description thereof will be omitted.

In addition, in the magnetic field touch detection period TP(1) shown in FIG. 13, the scanner circuit SCBR designates the selection of the drive electrode TL(n). Thus, the second unit selection circuit SER(n) and the second unit drive circuit DRR(n) shown in FIG. 12 perform the same operations as those in the magnetic field touch detection period TP(3) shown in FIG. 13. In addition, in the display period DP shown in FIG. 13, the second unit selection circuit SER(n) and the second unit drive circuit DRR(n) shown in FIG. 12 perform the same operations as those in the display period DP shown in FIG. 13. Furthermore, in the magnetic field touch detection period TP(3) shown in FIG. 13, the scanner circuit SCAR designates the selection of the drive electrode TL(n). Thus, the second unit selection circuit SER(n) and the second unit drive circuit DRR(n) shown in FIG. 12 perform the same operations as those in the magnetic field touch detection period TP(1) shown in FIG. 13.

Thereafter, the above-described operations are repeated, and the detection of the pen Pen and the display are alternately performed.

<Electric Field Touch Detection and Display>

Figure 14:
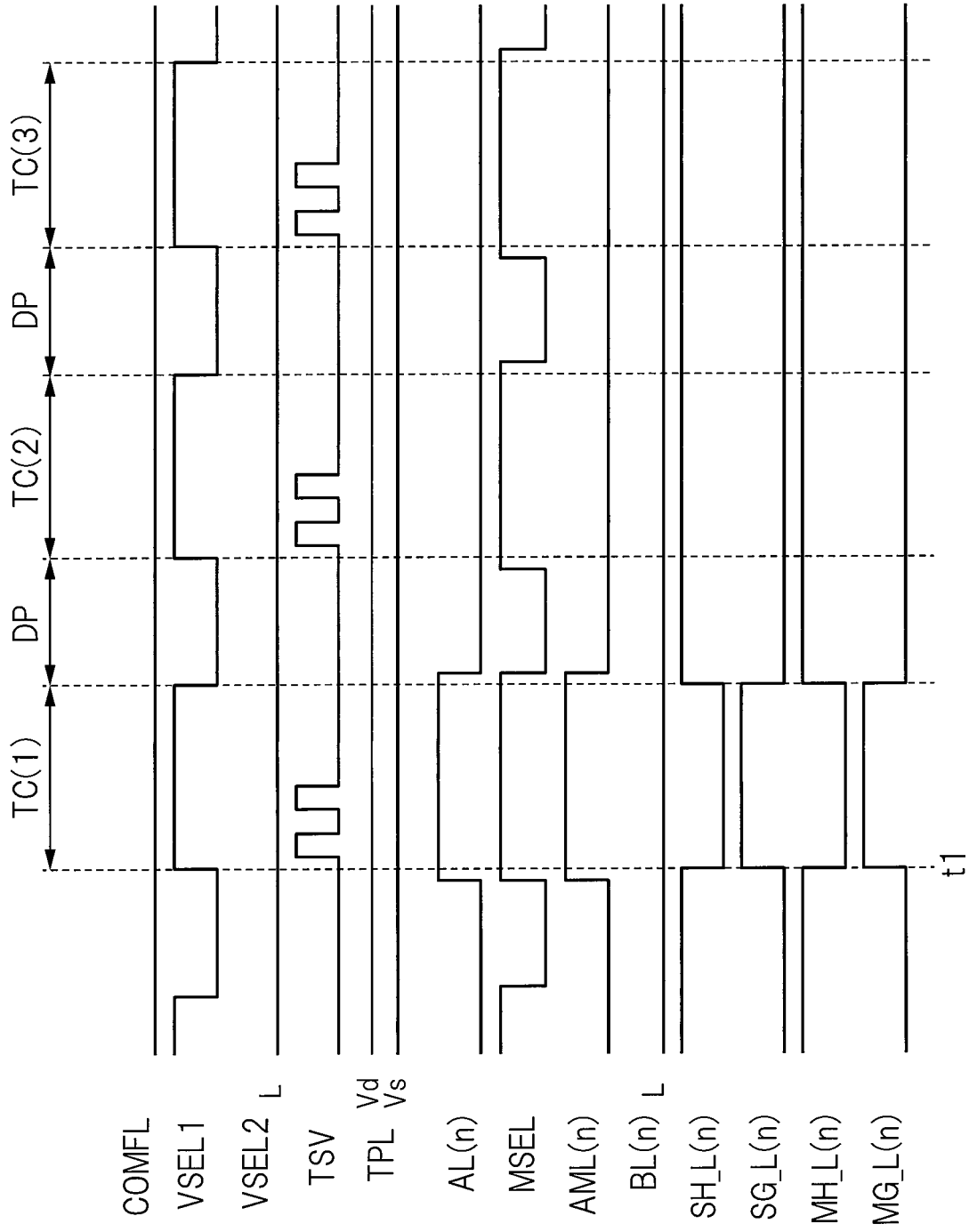
FIG. 14 is a waveform diagram showing the operation of the display device according to the embodiment.

FIG. 14 is a waveform diagram showing the operation of the display device 1 according to the embodiment. In the Figure, a waveform diagram when the display and the electric field touch detection are alternately performed is shown. In FIG. 14, "TC(1)" to "TC(3)" each denote a period of the electric field touch detection (hereinafter also referred to as "electric field touch detection period"), and "DP" denotes the display period. Here, shown is a case where the scanner circuit SCAL indicates the drive electrode TL(n) in the electric field touch detection period TC(1). Since the operation in the display period DP is described with reference to FIG. 13, description thereof is omitted here.

In the electric field touch detection periods TC(1) to TC(3), the control device 3 makes the control signal COMFL the low level, and controls the voltage of the electric field selection signal MSEL so that the electric field selection signal MSEL becomes the high level in these electric field touch detection periods. In addition, in the electric field touch detection period, the control device 3 makes the state selection signal VSEL1 the high level, and keeps the state selection signal VSEL2 at a low level. Furthermore, at the time of the electric field touch detection period, the drive signal circuit 6 in the control device 3 periodically changes the voltage of the drive signal TSV, and keeps the drive signal TPL at the first voltage Vs.

In the electric field touch detection, the scanner circuits SCAL and SCAR designate the drive electrode to select. Therefore, the scanner circuits SCBL and SCBR output a magnetic field selection signal (BL(n) in FIG. 14) with the low level indicating the non-selection of the drive electrode. In FIG. 14, in the electric field touch detection period TC(1), the scanner circuit SCAL outputs a high-level magnetic field selection signal (first selection signal) AL(n) in order to select the drive electrode TL(n) during the electric field touch detection period TC(1).

The magnetic field selection signal AL(n) becomes the high level, so that the transfer switches TF1 and TF2 shown in FIG. 11 become the on-state, the high-level state selection signal VSEL1 is supplied to the inverter circuit IV4 through the transfer switch TF1, and the low-level state selection signal VSEL2 is supplied to the inverter circuit IV5 through the transfer switch TF2. As a result, the second magnetic field selection signal SH_L(n) becomes the low level, and the magnetic field transistors SHL1 to SHL3 connected between the drive electrode TL(n) and the signal wiring TSVL become the on-states.

In addition, at the time of the electric field touch detection period TC(1), since the electric field selection signal MSEL becomes the high level, the electric field selection signal AML(n) becomes the high level. Thus, the transfer switch TF10 shown in FIG. 11 becomes the on-state, and the state selection signal VSEL1 with the high level is supplied to the inverter circuit IV7. As a result, the second electric field selection signal MH_L(n) becomes the low level, and the electric field transistors MHL1 and MHL2 connected between the drive electrode TL(n) and the signal wiring TSVL become the on-states.

Thus, the signal wiring TSVL and the drive electrode TL(n) are electrically connected by the magnetic field transistors SHL1 to SHL3 and the electric field transistors MHL1 and MHL2; the drive signal TSV whose voltage periodically changes is supplied to the drive electrode TL(n); and an electric field according to a voltage change in the drive signal TSV is generated.

In the electric field touch detection periods TC(2) and TC(3), since the drive electrode TL (n) is not selected, the magnetic field selection signal (first selection signal) AL(n) also becomes the low level. As a result, the electric field selection signal AML(n) also becomes the low level; and similarly to the operation in the display period DP, the first magnetic field selection signal SG_L(n) and the first electric field selection signal MG_L(n) become the low levels, and the second magnetic field selection signal SH_L(n) and the second electric field selection signal MH_L(n) become the high levels. Since these selection signals in the above periods are the same as those in the display period DP, the drive electrode TL(n) is connected to the signal wiring TPLL.

As described in FIGS. 2A to 2C in the electric field touch detection periods TC(1) to TC(3), the detection electrode detects a change in the electric field, and the proximity of the finger. Thereafter, the operations are alternately performed about the electric field touch detection and the display similarly to the above.

The second unit selection circuit SER(n) shown in FIG. 12 also performs the same operation as the first unit selection circuit SEL(n) shown in FIG. 11.

For ease of description in FIGS. 7 and 8, a case where the magnetic field is generated around one drive electrode has been described. Actually, as described with reference to FIGS. 6A and 6B, each of the plurality of drive electrodes arranged so as to sandwich the drive electrode on which the magnetic fields are superimposed is driven as described with reference to FIGS. 7 and 8, and generates the magnetic field.

In this embodiment, the number of switches (transistors), which electrically connect the drive electrodes TL(0) to TL(p) and the signal wirings TPLL, TPLR, TSVL, and TSVR for supplying the drive signals decreases from the switch, which electrically connects the drive electrode TL(0) arranged at the far end to the signal wiring, to the switch, which electrically connects the drive electrode TL(p) arranged at the near end to the signal wiring. Thus, even if the resistance of the signal wirings TPLL, TPLR, TSVL, and TSVR increases from the near end to the far end, a difference between the current flowing through the drive electrode arranged at the far end and the current flowing through the drive electrode arranged at the near end can be reduced at the time of the magnetic field touch detection. As a result, at the time of the magnetic field touch detection, the change in the charge amount accumulated on the pen Pen depending on the position of the drive electrode can be reduced, and the change in the detection sensitivity depending on the position can be reduced.

In addition, in the embodiment, the switch connected between each of the drive electrodes and the signal wiring includes a switch set for the magnetic field and a switch set for the electric field. According to the arrangement of the drive electrodes, set is a ratio of the number of the magnetic-field transistors constituting the magnetic field switch set to the number of the electric field transistors constituting the electric field switch set. That is, the number of the magnetic field transistors decreases from the far end to the near end, whereas the number of the electric field transistors decreases from the near end to the far end. At the time of the magnetic field touch detection, since the drive electrode and the signal wiring are electrically connected by the magnetic field transistor, the difference between the current flowing through the drive electrode arranged at the far end and the current flowing through the drive electrode arranged at the near end can be reduced.

On the other hand, at the time of the electric field touch detection, the drive electrode and the signal wiring are electrically connected by both of the magnetic field transistor and the electric field transistor. That is, the ON resistance of the magnetic field transistor and the ON resistance of the electric field transistor are connected in parallel, and the drive electrode and the signal wiring are electrically connected by combined resistance of these transistors. Thus, at the time of the electric field touch detection, a large change in value of the combined resistance depending on the position of the drive electrode can be suppressed.

Since the size (for example, channel length CL) of the drive transistor connected to the drive electrode and the signal wiring is shorter than the length of the drive electrode, the combined resistance formed by the ON resistance of the magnetic field transistor and the ON resistance of the electric field transistor can be regarded as a resistance component having a concentrated constant with respect to the parasitic capacitance of the drive electrode. Since a large change in the value of the combined resistance depending on the position of the drive electrode can be suppressed, a large change in a time constant represented by a product of the parasitic capacitance of the drive electrode and the combined resistance of the drive transistors depending on the position of the drive electrode can be prevented. As a result, it can be suppressed that the voltage change in the drive electrode in response to the voltage change in the drive signal TSV at the time of the electric field touch detection is largely changed depending on the position of the drive electrode, and deterioration in detection performance at the time of the magnetic field touch detection can be reduced.

In addition, in the embodiment, both of the magnetic field transistor and the electric field transistor become the on-states even at the time of display. Thus, at the time of display similarly to the electric field touch detection, it can be suppressed that the voltage change in the drive electrode in response to the voltage change in the drive signal TPL supplied to the signal wirings TPLL and TPLR is largely changed depending on the position of the drive electrode, and deterioration in performance at the time of the display can be reduced.

<Modification>

FIGS. 15A and 15B are diagrams showing the structures of the magnetic field transistor and the electric field transistor shown in FIGS. 7, 8, 11, 12, and the like. Hereinafter, the magnetic field transistor and the electric field transistor are collectively referred to as "drive transistors". FIG. 15A is a plan view of a drive transistor, and FIG. 15B is a cross-sectional view of the drive transistor.

As shown in FIG. 15B, the drive transistor has P-type semiconductor areas SE and DE formed in an N-type semiconductor layer PSB formed on a first substrate TGB, and a gate electrode GE formed over the N-type semiconductor layer PSB through a gate insulating film GSO. The P-type semiconductor area SE functions as a source of the drive transistor, and the P-type semiconductor area DE functions as a drain of the drive transistor. A selection signal from the above-described first unit selection circuit (or second unit selection circuit) is supplied to the gate electrode GE of the drive transistor, the source SE (or drain DE) is connected to the signal wiring (for example, TPLL), and the drain DE (or source SE) is connected to the end portion n1 (or n2) of the drive electrode.

A cross section taken along line A-A' in FIG. 15A has the cross section shown in FIG. 15B previously described. In FIG. 15A, "CL" denotes a channel length indicating a distance between a source area SE and a drain area DE, and "CW" denotes a channel width indicating each width of the source area SE and the drain area DE.

In FIGS. 7 and 8, in a plan view, the size of the drive transistor connected to each of the drive electrodes TL(0) to TL(p) is made the same regardless of positions of arranging the drive electrodes. That is, regarding each of the drive transistor connected to the drive electrode TL(p) arranged at the near end, the drive transistor connected to the drive electrode TL(n) arranged near the middle, and the drive transistor connected to the drive electrode TL(0) arranged at the far end, the channel width CW and the channel length CL are made the same.

In the modification, in a plan view, the size of the drive transistor connected to the drive electrode is changed according to the position of arranging the drive electrode. FIG. 16 is a diagram for describing the size of the drive transistor according to the modification. Here, the size of the drive transistor means the channel width CW of the drive transistor. In FIG. 16, "large", "medium", and "small" each denote a magnitude of the channel width CW of the drive transistor. Here, the "medium" shows a case where the channel width CW of the drive transistor has a predetermined width CW1, the "large" shows that the channel width CW of the drive transistor is larger than the predetermined width CW1, and the "small" shows that the channel width CW of the drive transistor is smaller than the predetermined width CW1. The channel lengths CL of the drive transistors are the same length regardless of the arrangement of the connected drive electrodes.

The size of the magnetic field transistor connected to the drive electrode arranged at the far end is larger than that of the magnetic field transistor connected to the drive electrode arranged near the middle. On the other hand, the size of the magnetic field transistor connected to the drive electrode arranged at the near end is smaller than the size of the magnetic field transistor connected to the drive electrode arranged near the middle. That is, the size (channel width CW) of the magnetic field transistor decreases from the far end to the near end.

On the other hand, in the electric field transistor, the size (channel width CW) of the electric field transistor connected to the drive electrode arranged at the far end is smaller than the size of the electric field transistor connected to the drive electrode arranged near the middle. In addition, the size of the electric field transistor connected to the drive electrode arranged at the near end is larger than the size of the electric field transistor connected to the drive electrode arranged near the middle. That is, contrary to the magnetic field transistor, the size of the electric field transistor increases from the far end to the near end.

The size (channel width CW) of the magnetic field transistor, which constitutes the first and second unit drive circuits connected to the drive electrode at the far-end vicinity arranged close to the drive electrode TL(0) arranged at the farthest end, is made larger than the size of the magnetic field transistor, which constitutes the first and second unit drive circuits DRL(n) and DRR(n) connected to the drive electrode TL(n). In addition, the size of the magnetic field transistor, which constitutes the first and second unit drive circuits connected to the drive electrode at the near-end vicinity arranged close to the drive electrode TL(p) arranged at the nearest end, is made smaller than the size of the magnetic field transistor, which constitutes the first and second unit drive circuits DRL(n) and DRR(n) connected to the drive electrode TL(n).

In contrast, the size (channel width CW) of the electric field transistor, which constitutes the first and second unit drive circuits connected to the drive electrode at the far-end vicinity, is made smaller than the size of the electric field transistor, which constitutes the first and second unit drive circuits DRL(n) and DRR(n) connected to the drive electrode TL(n). In addition, the size of the electric field transistor, which constitutes the first and second unit drive circuits connected to the drive electrode at the near-end vicinity, is made larger than the size of the electric field transistor, which constitutes the first and second unit drive circuits DRL(n) and DRR(n) connected to the drive electrode TL(n).

When the drive transistor is made the on-state by a selection signal supplied to its gate, the ON resistance varies depending on the magnitude of the channel width CW. That is, when the channel width CW is decreased (narrowed), the ON resistance increases, and when the channel width CW is increased (widened), the ON resistance decreases.

Thus, in the magnetic field touch detection period, when the drive electrode TL(0) arranged at the far end is selected, the combined resistance connected between the drive electrode at the far-end vicinity and the signal wirings TPLL, TPLR, TSVL, and TSVR can be reduced as compared with the case where the drive electrode at a middle vicinity or the drive electrode at the near-end vicinity is selected. Similarly, when the drive electrode TL(n) arranged at the middle vicinity is selected, the combined resistance connected between the drive electrode TL(n) and the signal wirings TPLL, TPLR, TSVL, and TSVR can be reduced as compared with the case where the drive electrode at the near-end vicinity is selected. That is, the combined resistance connecting between the drive electrode and the signal wiring can be further reduced from the near end to the far end.

For example, a first drive electrode (for example, drive electrode TL(p)) and a second drive electrode (for example, drive electrode TL(0)) are included in the drive electrodes, a distance between the first drive electrode and one end of the first signal wirings connected to a drive signal circuit 6 is smaller than a distance between the second drive electrode and the one end of the first signal wirings. In the first and second unit drive circuits connected to the first drive electrode shown in FIGS. 7 and 8 (for example, DRL(p) or DRR(p)), the size of the magnetic field transistor is set to a first channel width. In the first and second unit drive circuits connected to the second drive electrode (for example, DRL(0) or DRR(0)), the size of the magnetic field transistor is set to a second channel width larger than the first channel width. In the first and second unit drive circuits connected to the first drive electrode, the size of the electric field transistor is set to a third channel width larger than the first channel width. In contrast, in the first and second unit drive circuits connected to the second drive electrode, the size of the electric field transistor is set to a fourth channel width smaller than the second channel width. Thus, in the electric field touch detection period, both of the magnetic field transistor and the electric field transistor become the on-states, and so an increase in the combined resistance connected between the drive electrode TL(p) and the signal wiring can be suppressed.

In addition, the size of the electric field transistor is set to increase from the far-end vicinity to the near-end vicinity. Therefore, even if the size of the magnetic field transistor is set to increase from the near-end vicinity to the far-end vicinity, it is possible at the time of the electric field touch detection to compensate the increase in the ON resistance due to the small-size magnetic field transistor with a decrease in the ON resistance due to the large-size electric field transistor, and to keep the combined resistance connected between the drive electrode and the signal wiring almost constant. As a result, the change in the voltage of the drive electrode due to the position of the drive electrode at the time of the electric field touch detection can further be reduced, and the deterioration in the detection performance can be reduced. In addition, also in the display period, the combined resistance electrically connected between each drive electrode and the signal wirings TPLL and TPLR can be made almost constant, the change in the voltage change in the drive electrode due to the position of the drive electrode at the time of the display can further be reduced, and the deterioration in the performance at the time of the display can be reduced.

In the embodiment, at the time of the magnetic field touch detection, the adjacent drive electrodes are set to the bundle drive electrodes, and the magnetic fields are generated by the plurality of drive electrodes. On the other hand, the drive electrodes generating the electric fields at the time of the electric field touch detection are lees in umber than those at the time of the magnetic field touch detection. When the above is described with reference to FIGS. 6A and 6B at the time of the magnetic field touch detection, the drive electrodes TL(n−4) to TL(n−1) and TL(n+1) to TL(n+5) are set to a bundle, the magnetic field drive signal is supplied thereto, and the strong magnetic field is generated in the area of the drive electrode TL(n) sandwiched between these drive electrodes. On the other hand, at the time of the electric field touch detection, the electric field drive signal is supplied to the drive electrode TL(n). That is, the number of the drive electrodes driven simultaneously by the drive signal at the time of the magnetic field touch detection is larger than the number of the drive electrodes driven simultaneously by the drive signal at the time of the electric field touch detection. In other words, the number of the drive electrodes to which the drive signal is simultaneously supplied at the time of the magnetic field touch detection is larger than that at the time of the electric field touch detection.

Thus, the strong magnetic field can be generated at the time of the magnetic field touch detection and, for example, the size of the area (TL(n)) that generates the magnetic field at the time of the magnetic field touch detection and the size of the area (TL(n)) that generates the electric field at the time of the electric field touch detection can be made the same. As a result, a range where the touch detection is performed at the time of the magnetic field touch detection and that of the electric field touch detection can be prevented from changing. Furthermore, according to the embodiment, the change in the detection sensitivity at the times of the magnetic field touch detection and the electric field touch detection depending on the distance between the drive signal circuit 6 and the drive electrode can be suppressed.

A person having an ordinary skill in the art can make various modification examples and correction examples within a scope of the idea of the present invention, and it is interpreted that the modification examples and the correction examples also belong to the scope of the present invention.

For example, the examples obtained by performing addition or elimination of components or design change or the examples obtained by performing addition or reduction of process or condition change to the embodiment described above by a person having an ordinary skill in the art are also included in the scope of the present invention as long as they include the gist of the present invention.

For example, the signal wirings TPLL, TPLR, TSVL, and TSVR may be extended in the lateral direction, and the drive electrodes TL(0) to TL(p) may be extended in the longitudinal direction and are arranged in parallel to the lateral direction. But, the longitudinal direction and the lateral direction vary depending on the viewpoint to see. Even if the extension direction of the signal wiring(s) and the drive electrode change by shifting the viewpoint to see, this is included within the scope of the present invention. In addition, the "parallel" as used in the present specification means extending from one end to the other end without crossing each other. Therefore, even if part or all of one line (or electrode) is provided in a state of inclining with respect to the other line (or electrode), and unless these lines intersect from the one end to the other end, this state is also set as the "parallel" in the present specification.

What is claimed is:

1. An input detection device comprising:
   a first signal wiring;
   a plurality of drive electrodes comprising a first drive electrode;
   a plurality of first signal switches comprising:
   a first one of the first signal switches configured to couple the first signal wiring to the first drive electrode; and
   a second one of the first signal switches configured to couple the first signal wiring to the first drive electrode, wherein at least the first one and the second one of the plurality of first signal switches are in parallel with each other between the first signal wiring and the first drive electrode; and
   a drive signal circuit coupled to the first signal wiring to provide a magnetic drive signal to generate a magnetic field.

2. The input detection device according to claim 1, wherein the drive electrodes comprising a second drive electrode,
   wherein the first signal switches comprises
   a third one of the first signal switches configured to couple the first signal wiring to the second drive electrode, and
   a fourth one of the first signal switches configured to couple the first signal wiring to the second drive electrode.

3. The input detection device according to claim 2, wherein the first drive electrode is configured to be provided the magnetic drive signal from the first signal wiring via the first one of the first signal switches or the second one of the first signal switches, and
   wherein the second drive electrode is configured to be provided the magnetic drive signal from the first signal wiring via the third one of the first signal switches and the fourth one of the first signal switches.

4. The input detection device according to claim 3, wherein the drive signal circuit coupled to an end portion of the first signal wiring, and
   wherein a distance between the second drive electrode and the end portion of the first signal wiring is larger than a distance between the first drive electrode and the end of the first signal wiring.

5. The input detection device according to claim 3, wherein the first drive electrode is configured to be provided an electric drive signal to generate an electric field from the first signal wiring via the first one of the first signal switches and the second one of the first signal switches, and
   wherein the second drive electrode is configured to be provided the electric drive signal from the first signal wiring via the third one of the first signal switches and the fourth one of the first signal switches.

6. The input detection device according to claim 2, further comprising:
   a second signal wiring; and
   a plurality of second signal switches including;
   a first one of the second signal switches configured to couple the second signal wiring to the first drive electrode,
   a second one of the second signal switches configured to couple the second signal wiring to the first drive electrode, a third one of the second signal switches configured to couple the second signal wiring to the second drive electrode, and a fourth one of the second signal switches configured to couple the second signal wiring to the second drive electrode.

7. The input detection device according to claim 6,
wherein the first drive electrode is configured to
be provided the magnetic drive signal to generate the magnetic field from the first signal wiring via the first one of the first signal switches and the second one of the first signal switches, and
be provided the magnetic drive signal from the second signal wiring via the first one of the second signal switches and the second one of the second signal switches, and
wherein the second drive electrode is configured to
be provided the magnetic drive signal from the first signal wiring via the third one of the first signal switches and the fourth one of the first signal switches, and
be provided the magnetic drive signal from the second signal wiring via the third one of the second signal switches and the fourth one of the second signal switches.

8. The input detection device according to claim 7,
wherein the first drive electrode is configured to
be provided an electric drive signal to generate an electric field from the first signal wiring via the first one of the first signal switches and the second one of the first signal switches, and
be provided the electric drive signal from the second signal wiring via the first one of the second signal switches and the second one of the second signal switches, and
wherein the second drive electrode is configured to
be provided the electric drive signal from the first signal wiring via the third one of the first signal switches and the fourth one of the first signal switches, and
be provided the electric drive signal from the second signal wiring via the third one of the second signal switches and the fourth one of the second signal switches.

9. The input detection device according to claim 2,
wherein the drive signal circuit provides
the magnetic drive signal to the first drive electrode via the first one of the first signal switches, and
the magnetic drive signal to the second drive electrode via the third one of the first signal switches
wherein the first one of the first single switches comprises a transistor with a first channel width,
wherein the third one of the first signal switches comprises a transistor with a third channel width larger than the first channel width.

10. The input detection device according to claim 9,
wherein the drive signal circuit coupled to an end portion of the first signal wiring, and
wherein a distance between the second drive electrode and the end portion of the first signal wiring is larger than a distance between the first drive electrode and the end of the first signal wiring.

11. The input detection device according to claim 9,
wherein the drive signal circuit doesn't provide the magnetic drive signal to the first drive electrode via the second one of the first signal switches.

12. The input detection device according to claim 2,
wherein the drive signal circuit provides
an electric drive signal to generate an electric field to the first drive electrode via the second one of the first signal switches, and
the electric drive signal to the second drive electrode via the fourth one of the first signal switches
wherein the second one of the first single switches comprises a transistor with a second channel width,
wherein the fourth one of the first signal switches comprises a transistor with a fourth channel width smaller than the second channel width.

13. The input detection device according to claim 12,
wherein the drive signal circuit coupled to an end portion of the first signal wiring, and
wherein a distance between the second drive electrode and the end portion of the first signal wiring is larger than a distance between the first drive electrode and the end of the first signal wiring.

14. The input detection device according to claim 12,
wherein the drive signal circuit doesn't provide the magnetic drive signal to the first drive electrode via the second one of the first signal switches, and
wherein the drive signal circuit doesn't provide the magnetic drive signal to the second drive electrode via the fourth one of the first signal switches.

15. The input detection device according to claim 1,
wherein the drive signal circuit provides the magnetic drive signal via the first one of the first signal switches or the second one of the first signal switches, and
wherein the drive signal circuit provides an electric drive signal to generate an electric field via the first one of the first signal switches and the second one of the first signal switches.

16. The input detection device according to claim 1,
further comprising:
a second signal wiring; and
a plurality of second signal switches comprising;
a first one of the second signal switches configured to couple the second signal wiring to the first drive electrode, and
a second one of the second signal switches configured to couple the second signal wiring to the first drive electrode,
wherein the drive signal circuit is coupled to the second signal wiring,
wherein the drive signal circuit is configured to
provide a first voltage of the magnetic drive signal to the first wiring; and
provide a second voltage of the magnetic drive signal to the second wiring, and
wherein the second voltage is different from the first voltage.

17. The input detection device according to claim 1,
wherein the drive signal circuit provides
the magnetic drive signal to the first drive electrode via the first one of the first signal switches, and
an electric drive signal to generate an electric field to the first drive electrode via the second one of the first signal switches
wherein the first one of the first single switches comprises a transistor with a first channel width,
wherein the second one of the first signal switches comprises a transistor with a second channel width larger than the first channel width.

* * * * *